(12) United States Patent
Yamazaki et al.

(10) Patent No.: US 7,723,179 B2
(45) Date of Patent: May 25, 2010

(54) LIGHT EMITTING DEVICE AND METHOD FOR MANUFACTURING THE SAME

(75) Inventors: Shunpei Yamazaki, Tokyo (JP); Satoshi Murakami, Tochigi (JP); Mitsuaki Osame, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 574 days.

(21) Appl. No.: 11/282,725

(22) Filed: Nov. 21, 2005

(65) Prior Publication Data
US 2006/0084213 A1    Apr. 20, 2006

Related U.S. Application Data

(62) Division of application No. 10/428,952, filed on May 5, 2003, now Pat. No. 6,992,332.

(30) Foreign Application Priority Data
May 15, 2002    (JP)    ............... 2002-139934

(51) Int. Cl.
*H01L 21/8238* (2006.01)
(52) U.S. Cl. .............. 438/233; 438/155; 438/625; 257/E21.627
(58) Field of Classification Search ............. 438/153, 438/149, 154, 155, 157, 233, 624, 614, 622, 438/625, 623, 700, 701; 257/E21.627
See application file for complete search history.

(56) References Cited

U.S. PATENT DOCUMENTS 5,313,076 A    5/1994    Yamazaki et al.

(Continued)

FOREIGN PATENT DOCUMENTS

EP    1058484    12/2000

(Continued)

OTHER PUBLICATIONS

U.S. Appl. No. 10/412,234, filed Apr. 8, 2003, Masahiko Hayakawa et al. "Display Device and Method of Fabricating the Same".

(Continued)

*Primary Examiner*—Julio J Maldonado
(74) *Attorney, Agent, or Firm*—Nixon Peabody LLP; Jeffrey L. Costellia

(57) ABSTRACT

A light emitting element containing an organic compound has a disadvantage in that it tends to be deteriorated by various factors, so that the greatest problem thereof is to increase its reliability (make longer its life span). The present invention provides a method for manufacturing an active matrix type light emitting device and the configuration of such an active matrix type light emitting device having high reliability. In the method, a contact hole extending to a source region or a drain region is formed, and then an interlayer insulation film made of a photosensitive organic insulating material is formed on an interlayer insulation film. The interlayer insulation film has a curved surface on its upper end portion. Subsequently, an interlayer insulation film provided as a silicon nitride film having a film thickness of 20 to 50 nm is formed by a sputtering method using RF power supply.

54 Claims, 22 Drawing Sheets

2

U.S. PATENT DOCUMENTS

| | | | |
|---|---|---|---|
| 5,459,596 A | 10/1995 | Ueda et al. | |
| 5,583,369 A | 12/1996 | Yamazaki et al. | |
| 5,585,949 A | 12/1996 | Yamazaki et al. | |
| 5,696,386 A | 12/1997 | Yamazaki | |
| 5,706,064 A | 1/1998 | Fukunaga et al. | |
| 5,733,797 A | 3/1998 | Yamaha | |
| 5,781,254 A | 7/1998 | Kim et al. | |
| 5,818,550 A | 10/1998 | Kadota et al. | |
| 5,946,561 A | 8/1999 | Yamazaki et al. | |
| 5,956,105 A | 9/1999 | Yamazaki et al. | |
| 5,982,460 A | 11/1999 | Zhang et al. | |
| 5,990,542 A | 11/1999 | Yamazaki | |
| 6,037,712 A | 3/2000 | Codama et al. | |
| 6,057,904 A | 5/2000 | Kim et al. | |
| 6,069,443 A | 5/2000 | Jones et al. | |
| 6,115,090 A | 9/2000 | Yamazaki | |
| 6,136,624 A * | 10/2000 | Kemmochi et al. | 438/30 |
| 6,150,692 A | 11/2000 | Iwanaga et al. | |
| 6,215,154 B1 | 4/2001 | Ishida et al. | |
| 6,236,106 B1 | 5/2001 | Sato | |
| 6,246,179 B1 | 6/2001 | Yamada | |
| 6,252,297 B1 * | 6/2001 | Kemmochi et al. | 257/E21.578 |
| 6,271,066 B1 | 8/2001 | Yamazaki et al. | |
| 6,271,543 B1 | 8/2001 | Ohtani et al. | |
| 6,274,516 B1 | 8/2001 | Kamei et al. | |
| 6,281,552 B1 | 8/2001 | Kawasaki et al. | |
| 6,294,799 B1 | 9/2001 | Yamazaki et al. | |
| 6,306,694 B1 | 10/2001 | Yamazaki et al. | |
| 6,346,718 B1 | 2/2002 | Yamanaka et al. | |
| 6,372,558 B1 | 4/2002 | Yamanaka et al. | |
| 6,383,911 B2 * | 5/2002 | Mikagi | 438/623 |
| 6,429,053 B1 | 8/2002 | Yamazaki et al. | |
| 6,466,401 B1 | 10/2002 | Hong et al. | |
| 6,492,659 B1 | 12/2002 | Yamazaki et al. | |
| 6,515,300 B2 | 2/2003 | den Boer et al. | |
| 6,521,913 B1 | 2/2003 | Murade | |
| 6,528,824 B2 | 3/2003 | Yamagata et al. | |
| 6,538,301 B1 | 3/2003 | Yamada et al. | |
| 6,562,672 B2 | 5/2003 | Yamazaki et al. | |
| 6,569,717 B1 * | 5/2003 | Murade | 438/149 |
| 6,593,990 B1 | 7/2003 | Yamazaki | |
| 6,599,818 B2 | 7/2003 | Dairiki | |
| 6,605,826 B2 | 8/2003 | Yamazaki et al. | |
| 6,608,353 B2 | 8/2003 | Miyazaki et al. | |
| 6,614,076 B2 | 9/2003 | Kawasaki et al. | |
| 6,657,230 B1 | 12/2003 | Murade | |
| 6,664,145 B1 | 12/2003 | Yamazaki et al. | |
| 6,664,732 B2 | 12/2003 | Yamazaki et al. | |
| 6,689,492 B1 | 2/2004 | Yamazaki et al. | |
| 6,713,325 B2 * | 3/2004 | Wake et al. | 438/153 |
| 6,739,931 B2 | 5/2004 | Yamazaki et al. | |
| 6,768,259 B2 | 7/2004 | Hirano | |
| 6,774,578 B2 | 8/2004 | Tanada | |
| 6,777,710 B1 | 8/2004 | Koyama | |
| 6,778,232 B2 | 8/2004 | Nakata et al. | |
| 6,791,129 B2 | 9/2004 | Inukai | |
| 6,791,521 B2 | 9/2004 | Isami et al. | |
| 6,822,629 B2 | 11/2004 | Yamazaki et al. | |
| 6,828,950 B2 | 12/2004 | Koyama | |
| 6,881,501 B2 | 4/2005 | Yudasaka | |
| 6,911,688 B2 | 6/2005 | Yamazaki et al. | |
| 6,960,786 B2 | 11/2005 | Yamazaki et al. | |
| 7,026,194 B2 * | 4/2006 | Suzawa et al. | 438/153 |
| 7,038,239 B2 | 5/2006 | Murakami et al. | |
| 7,147,530 B2 | 12/2006 | Yamazaki et al. | |
| 2001/0005606 A1 | 6/2001 | Tanaka et al. | |
| 2001/0009283 A1 * | 7/2001 | Arao et al. | 438/200 |
| 2001/0030322 A1 | 10/2001 | Yamazaki et al. | |
| 2001/0036462 A1 | 11/2001 | Fong et al. | |
| 2001/0051416 A1 | 12/2001 | Yamazaki et al. | |
| 2001/0053559 A1 | 12/2001 | Nagao et al. | |
| 2001/0055841 A1 | 12/2001 | Yamazaki et al. | |
| 2002/0036462 A1 | 3/2002 | Hirano | |
| 2002/0145116 A1 | 10/2002 | Choo | |
| 2002/0155706 A1 | 10/2002 | Mitsuki et al. | |
| 2003/0057419 A1 | 3/2003 | Murakami et al. | |
| 2003/0090447 A1 | 5/2003 | Kimura | |
| 2003/0129790 A1 | 7/2003 | Yamazaki et al. | |
| 2003/0189207 A1 | 10/2003 | Murakami et al. | |
| 2003/0189210 A1 | 10/2003 | Yamazaki et al. | |
| 2003/0193054 A1 | 10/2003 | Hayakawa et al. | |
| 2003/0197178 A1 | 10/2003 | Yamazaki et al. | |
| 2003/0206332 A1 | 11/2003 | Yamazaki et al. | |
| 2003/0210358 A1 | 11/2003 | Zhang et al. | |
| 2003/0230764 A1 | 12/2003 | Yamazaki et al. | |
| 2004/0072380 A1 | 4/2004 | Yamazaki et al. | |
| 2004/0075094 A1 | 4/2004 | Yamazaki et al. | |
| 2004/0080263 A1 | 4/2004 | Yamazaki et al. | |
| 2005/0017933 A1 | 1/2005 | Koyama | |
| 2005/0218452 A1 | 10/2005 | Yamazaki et al. | |
| 2007/0063646 A1 | 3/2007 | Yamazaki et al. | |

FOREIGN PATENT DOCUMENTS

| | | |
|---|---|---|
| EP | 1 128 430 A2 | 8/2001 |
| JP | 01-156725 | 6/1989 |
| JP | 02-039541 | 2/1990 |
| JP | 02-234134 | 9/1990 |
| JP | 05-027996 | 4/1993 |
| JP | 07-273191 | 10/1995 |
| JP | 08-203876 | 8/1996 |
| JP | 10-039334 | 2/1998 |
| JP | 10-056182 | 2/1998 |
| JP | 10-068972 | 3/1998 |
| JP | 10-189252 | 7/1998 |
| JP | 10-307305 | 11/1998 |
| JP | 2000-352941 | 12/2000 |
| JP | 2001-052873 | 2/2001 |
| JP | 2001-066632 | 3/2001 |
| JP | 2001-189462 | 7/2001 |
| JP | 2001-313397 | 11/2001 |
| JP | 2001-332388 | 11/2001 |
| JP | 2001-351787 | 12/2001 |
| JP | 2001-356711 | 12/2001 |
| JP | 2002-083689 | 3/2002 |
| JP | 2002-123219 | 4/2002 |
| JP | 2003-17273 | 1/2003 |
| KR | 2001-0112623 A | 12/2001 |

OTHER PUBLICATIONS

U.S. Appl. No. 10/426,950, filed May 1, 2003, Shunpei Yamazaki et al., "Display Device".

U.S. Appl. No. 10/419,764, filed Apr. 22, 2003, Shunpei Yamazaki et al., "Semiconductor Device and Display Element Using Semiconductor Device".

"Office Action (Application No. 2003-0030122;KR06412) Dated Oct. 28, 2009 ,".

"Office Action (Application No. 2003-0030122;KR06412) Dated Oct. 28, 2009 ,".

* cited by examiner

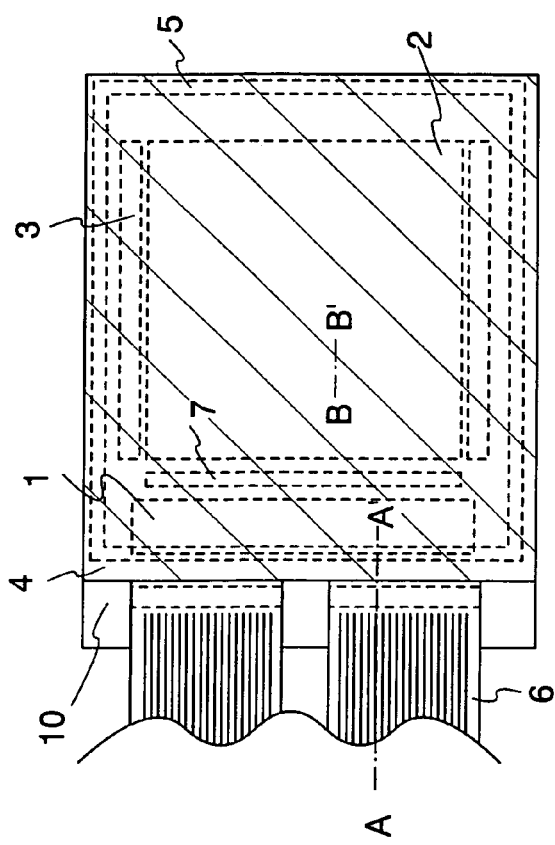
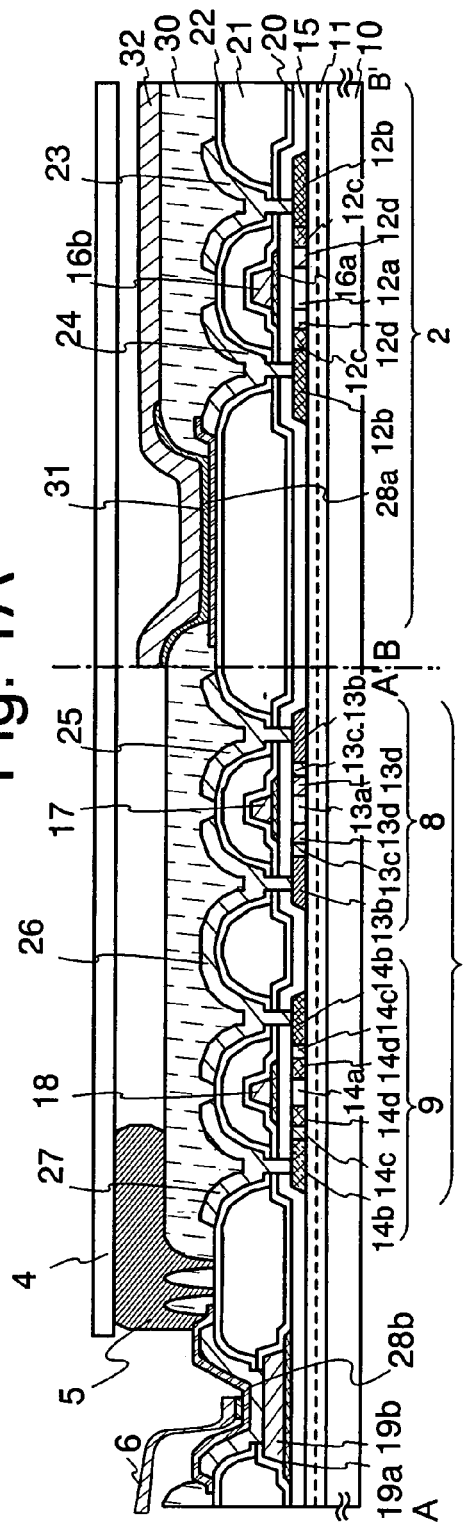
Fig. 1A
Fig. 1B

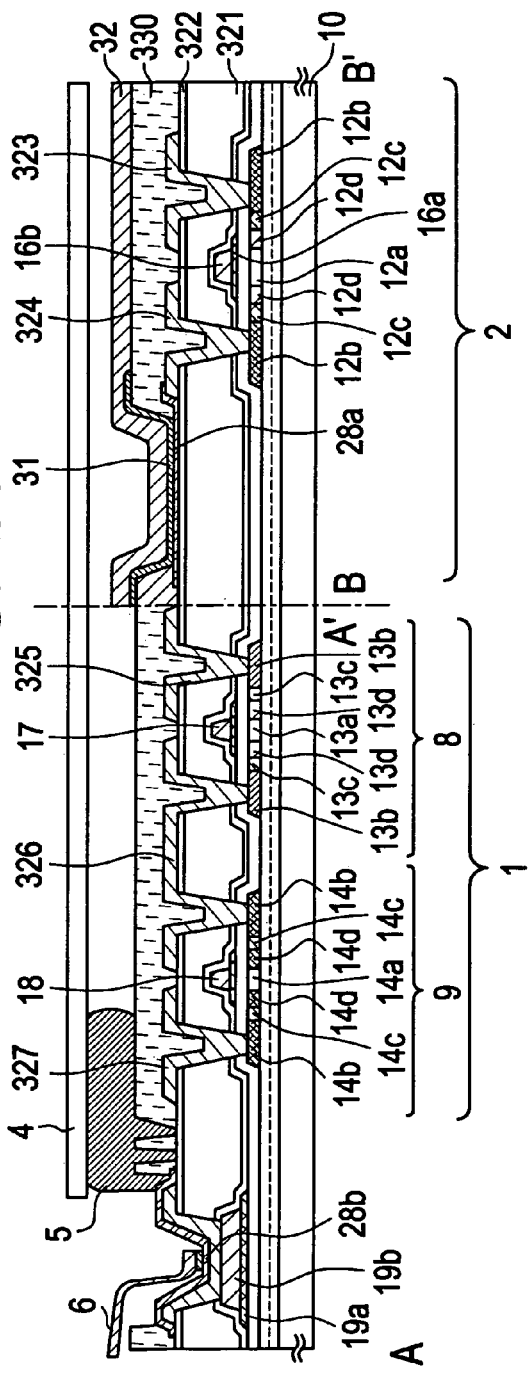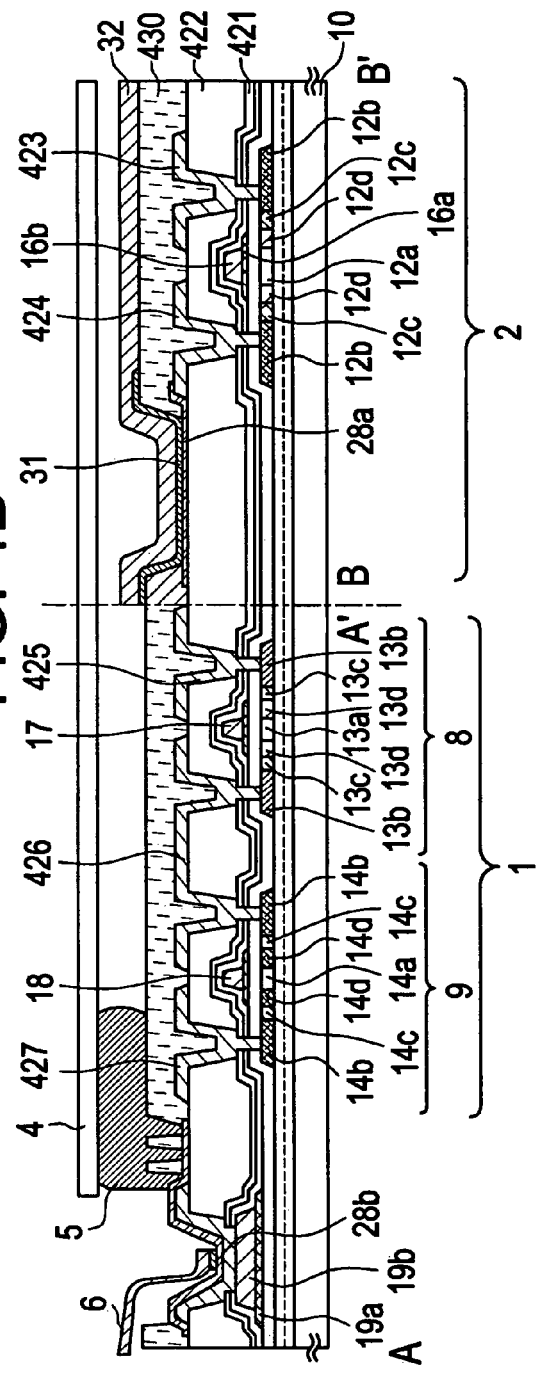

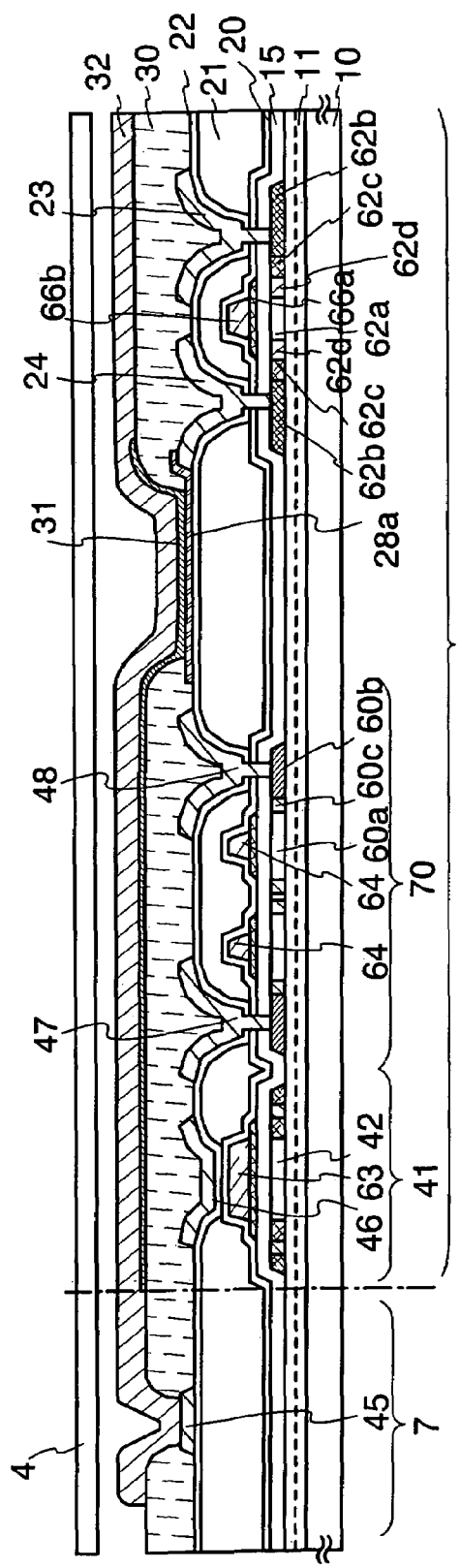
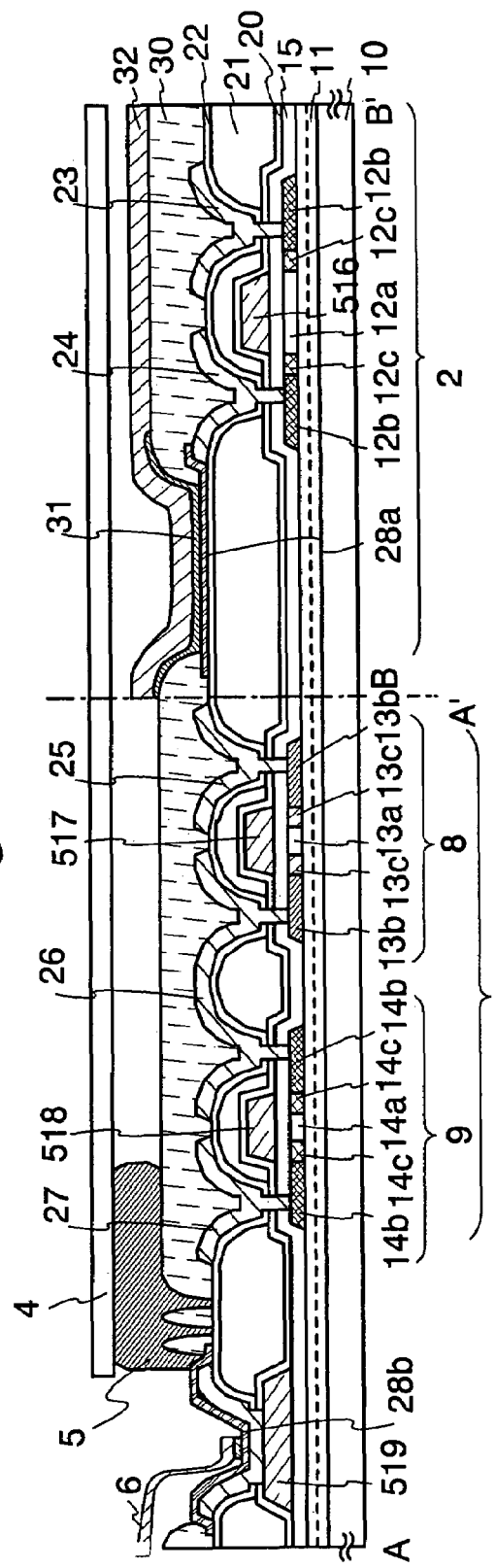
Fig. 5A
Fig. 5B

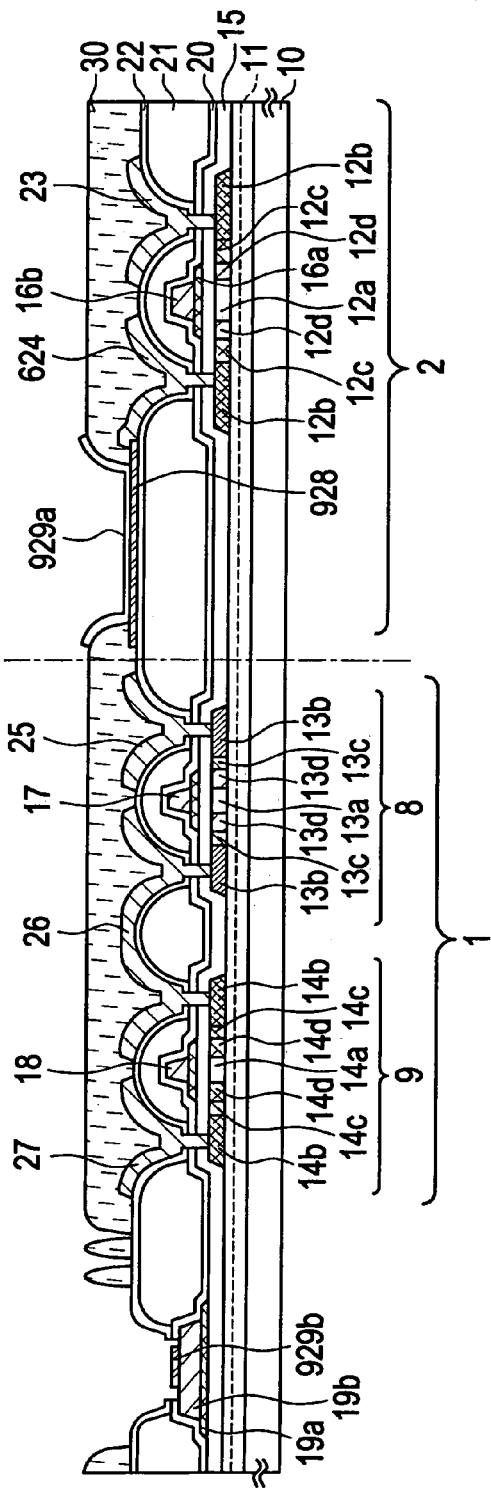
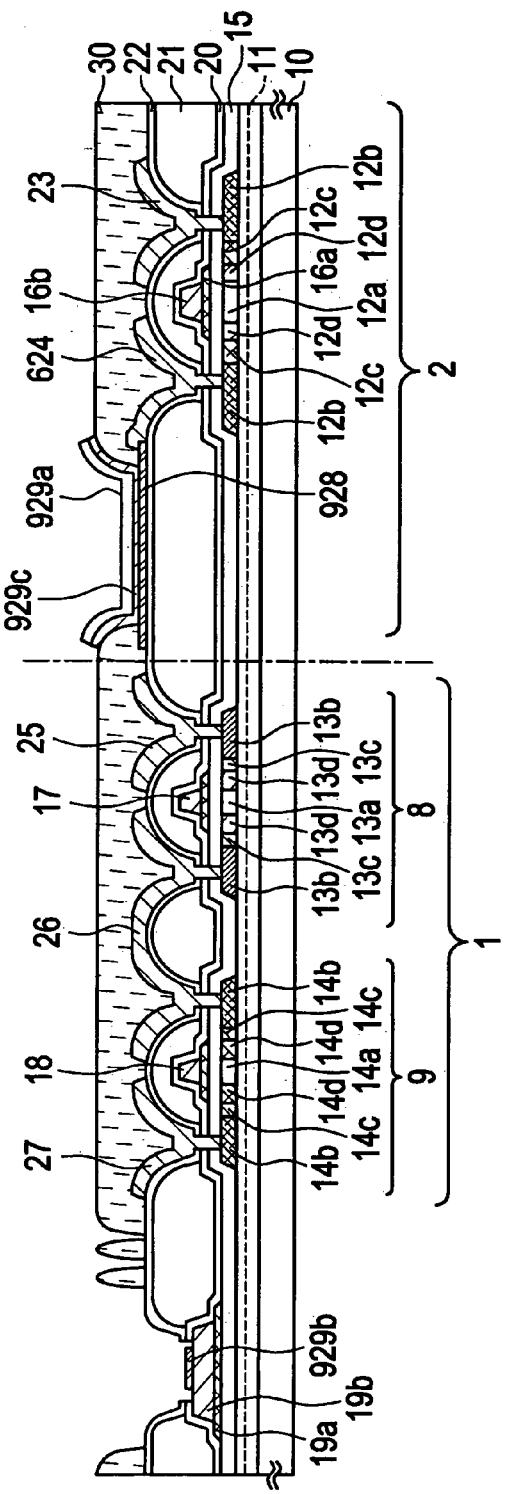

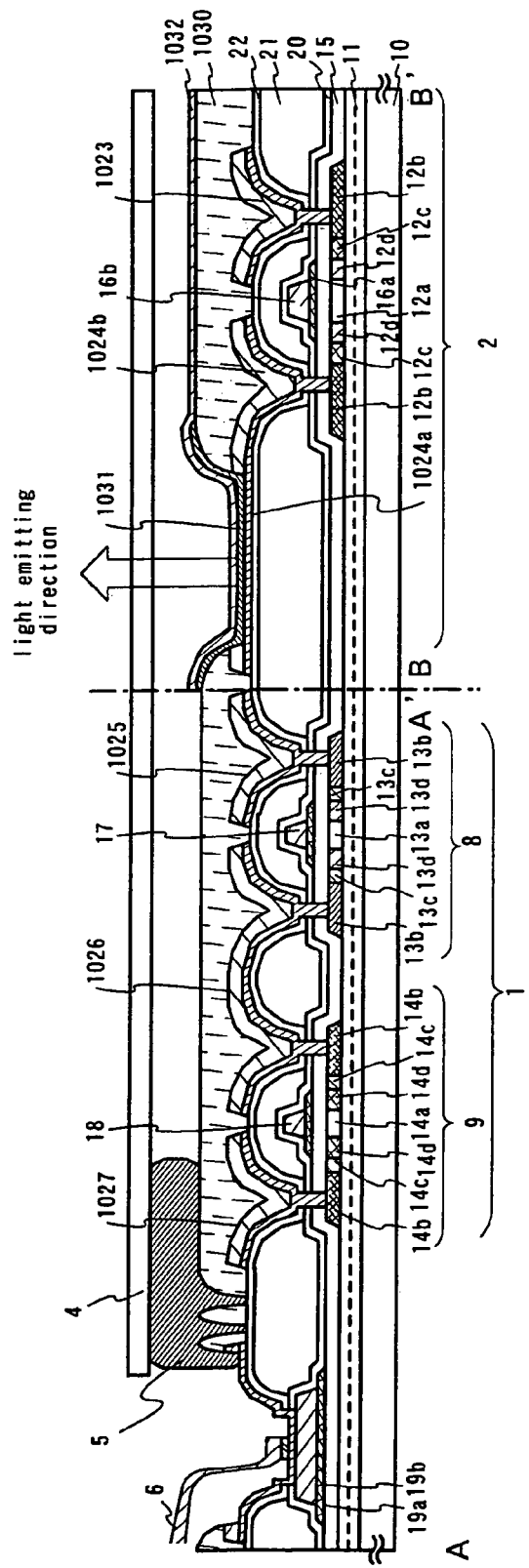
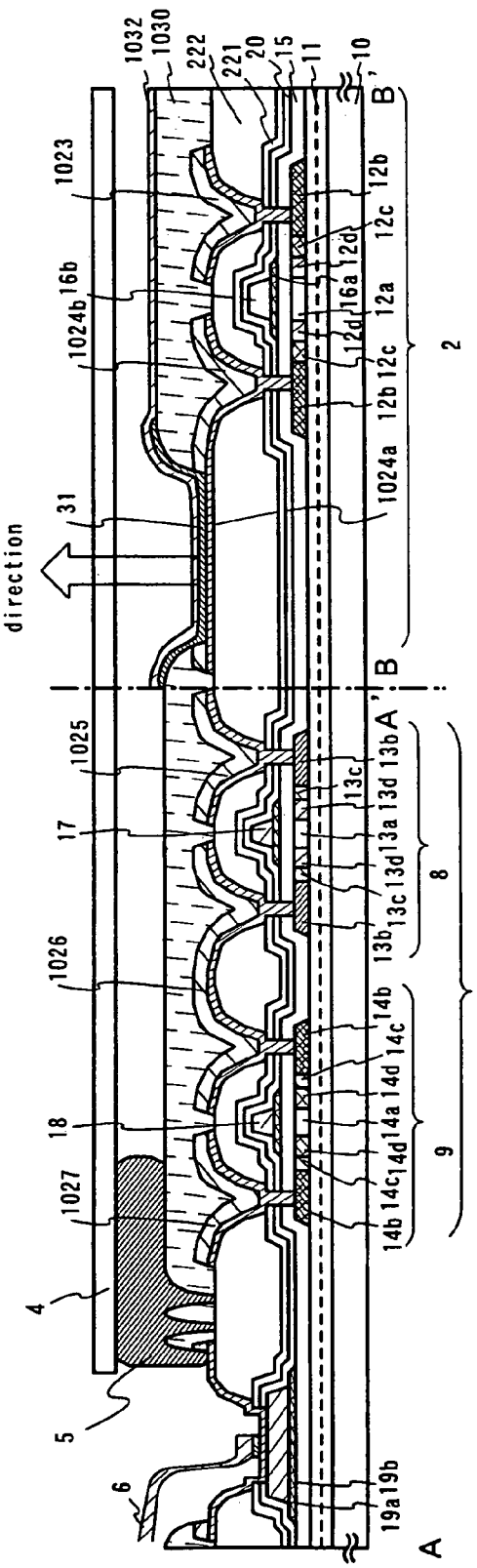

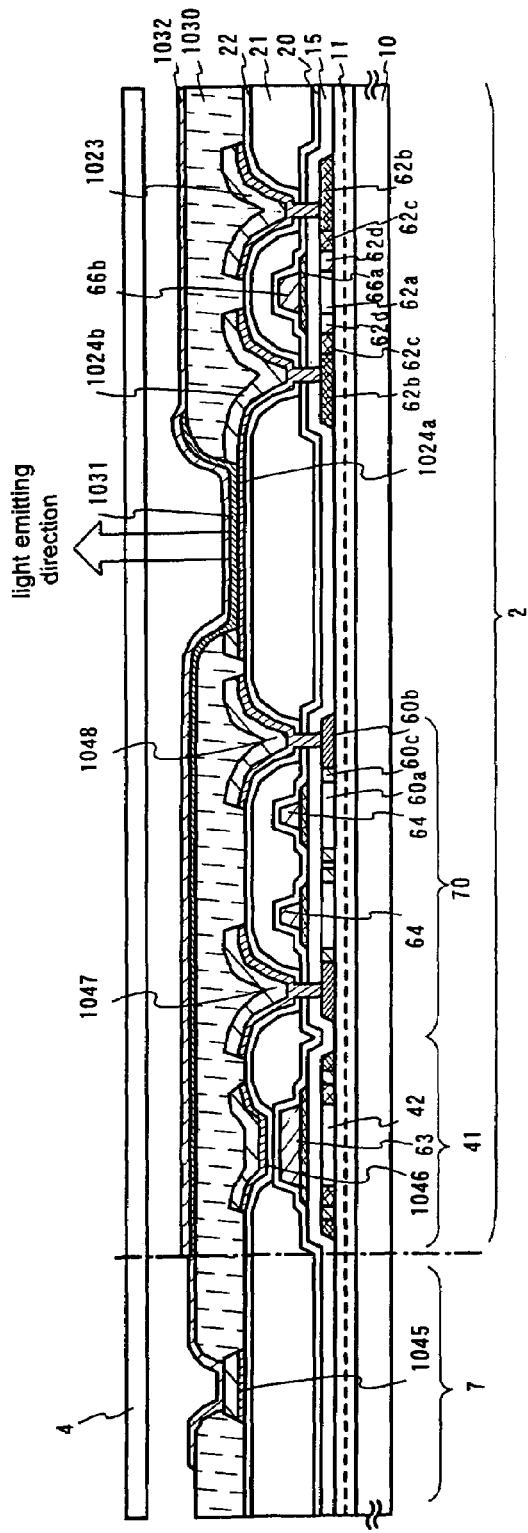
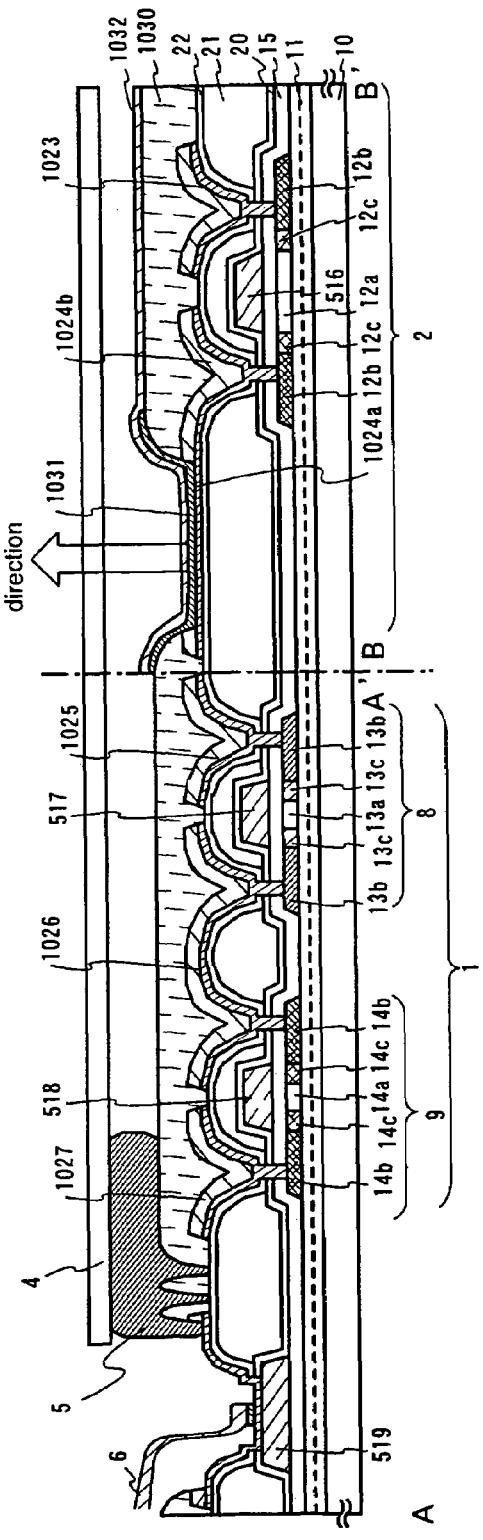
Fig. 11A
Fig. 11B light emitting region

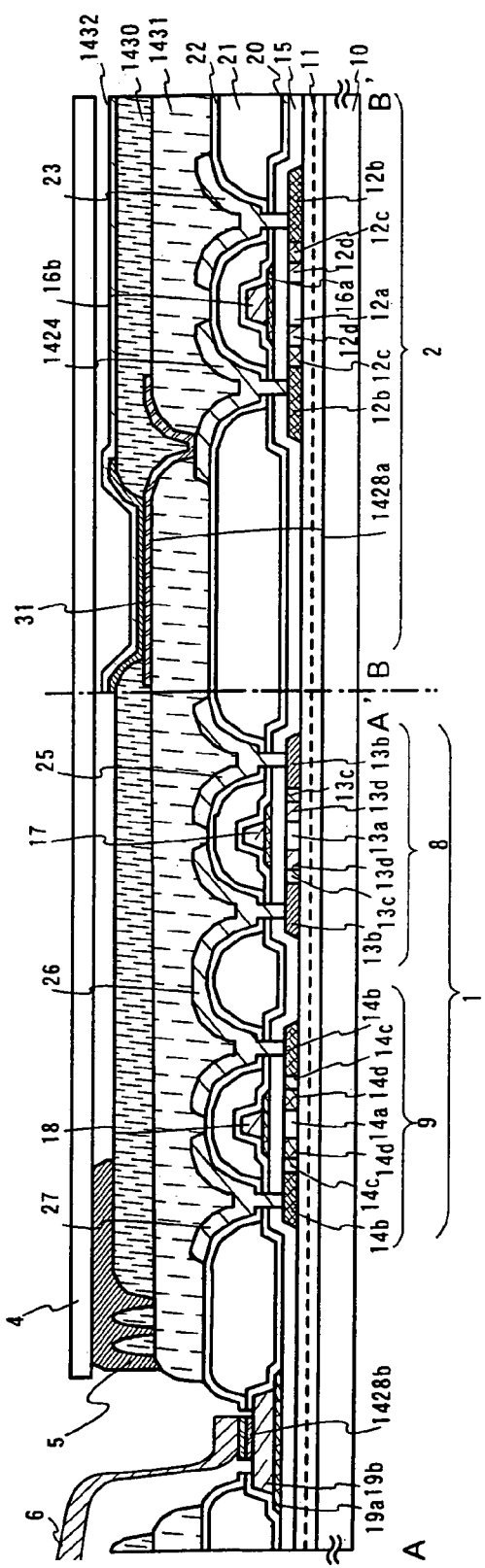
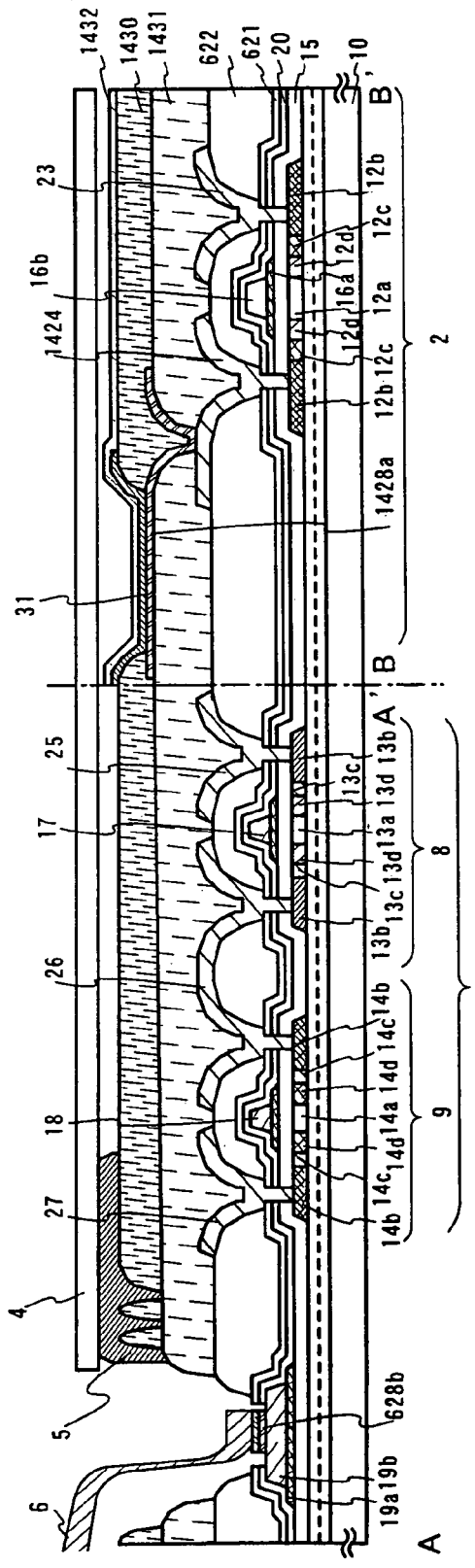
Fig. 15A
Fig. 15B

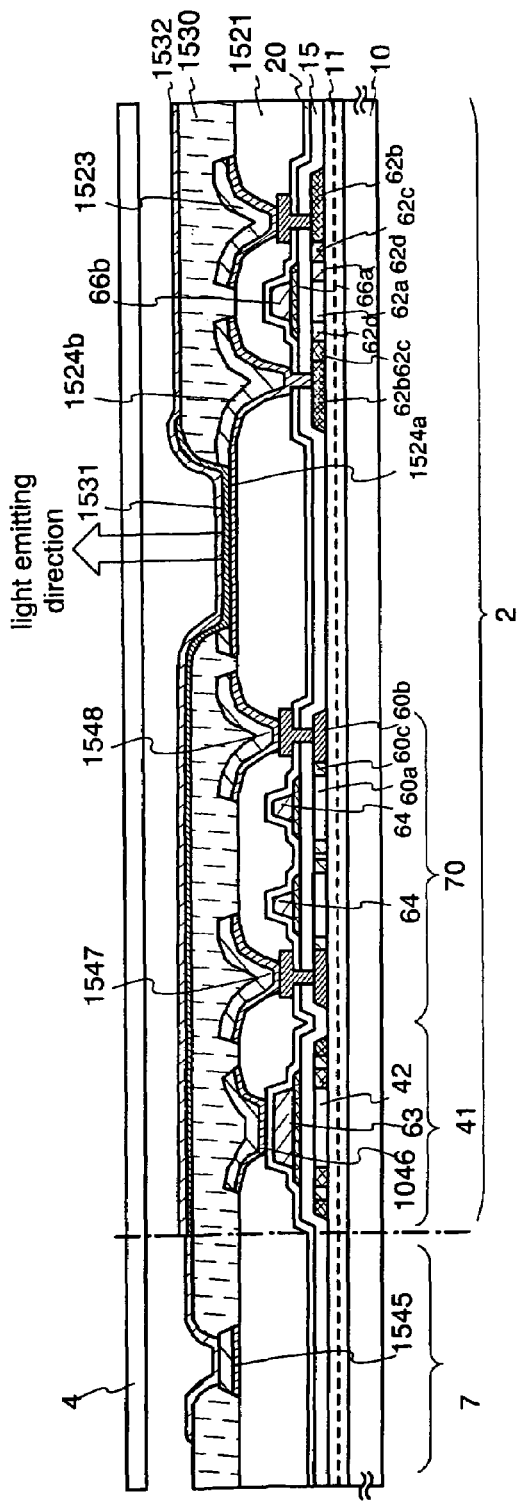
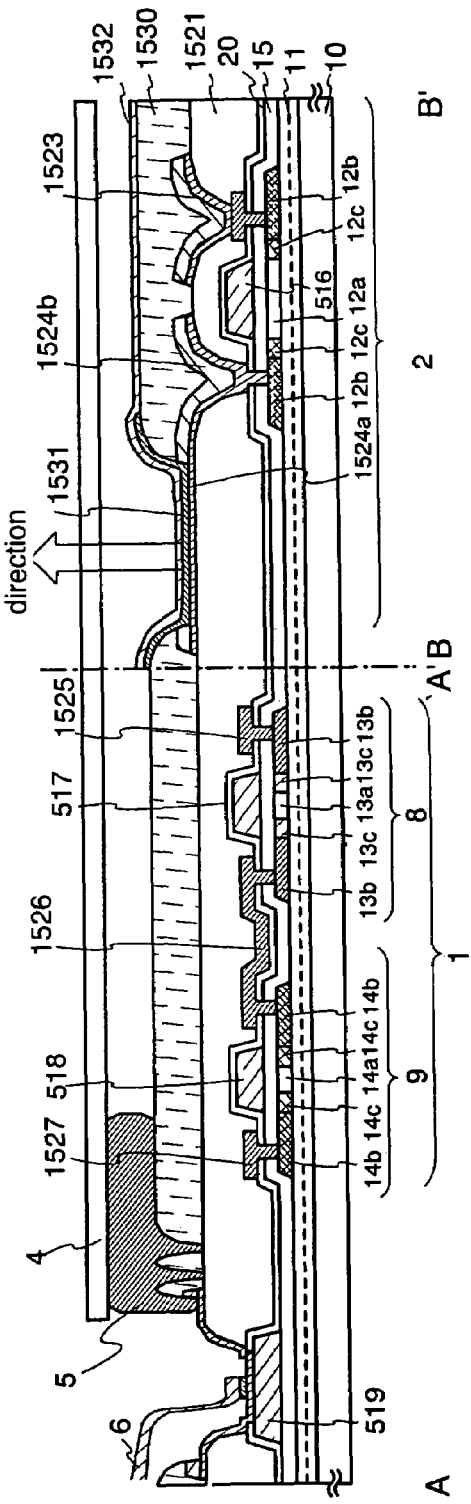
Fig. 17A
Fig. 17B

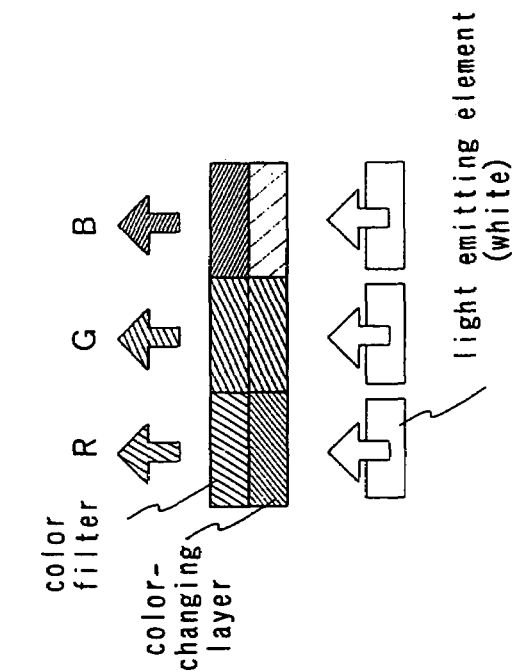
Fig. 20C
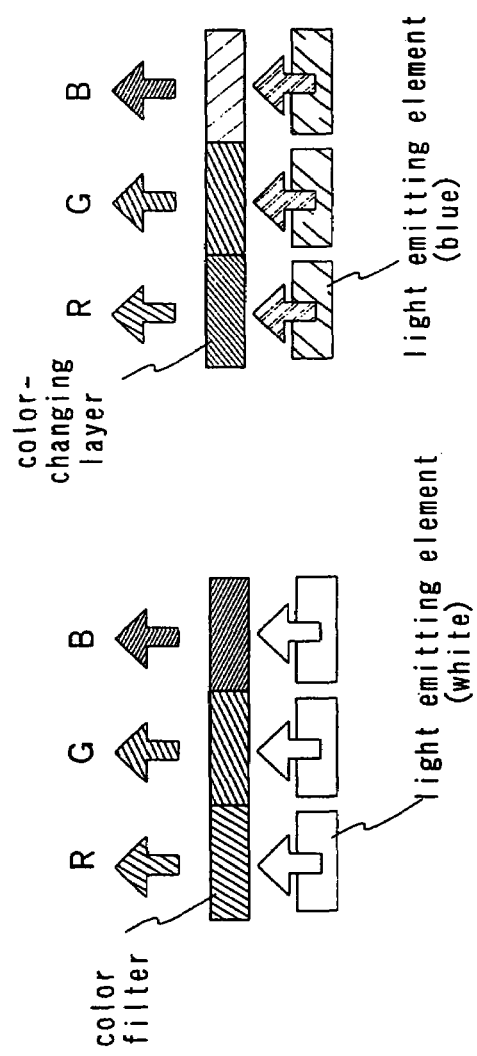
Fig. 20B
Fig. 20A

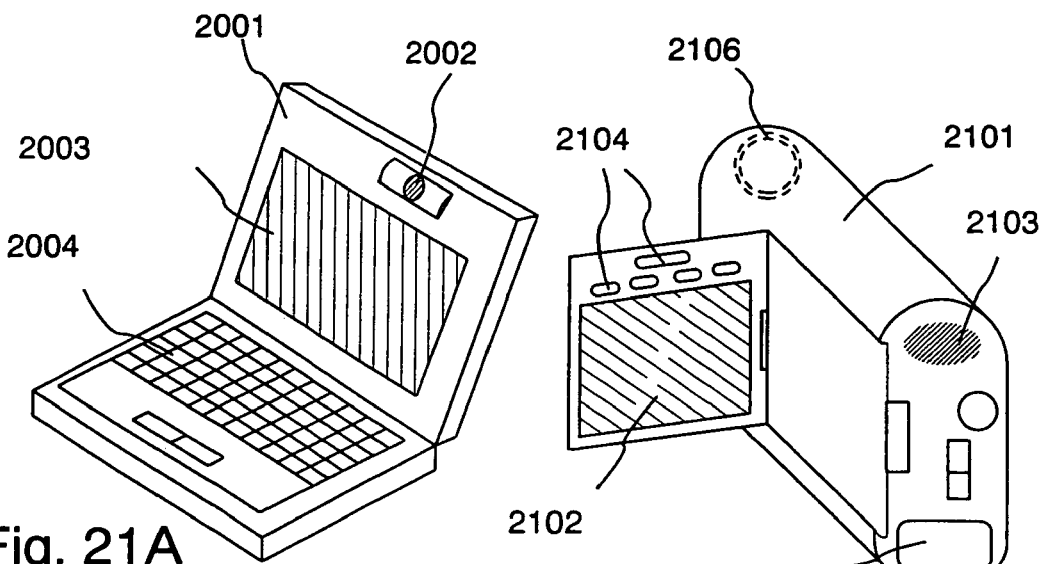
Fig. 21A
Fig. 21B
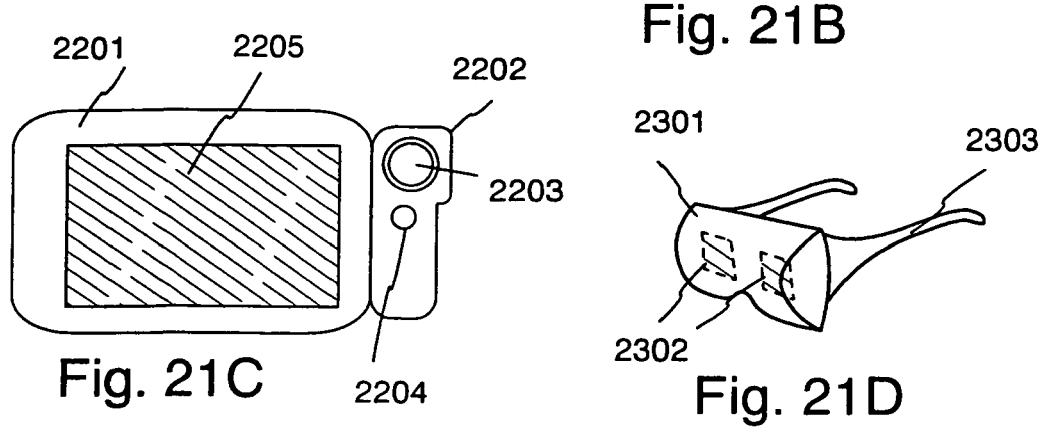
Fig. 21C
Fig. 21D
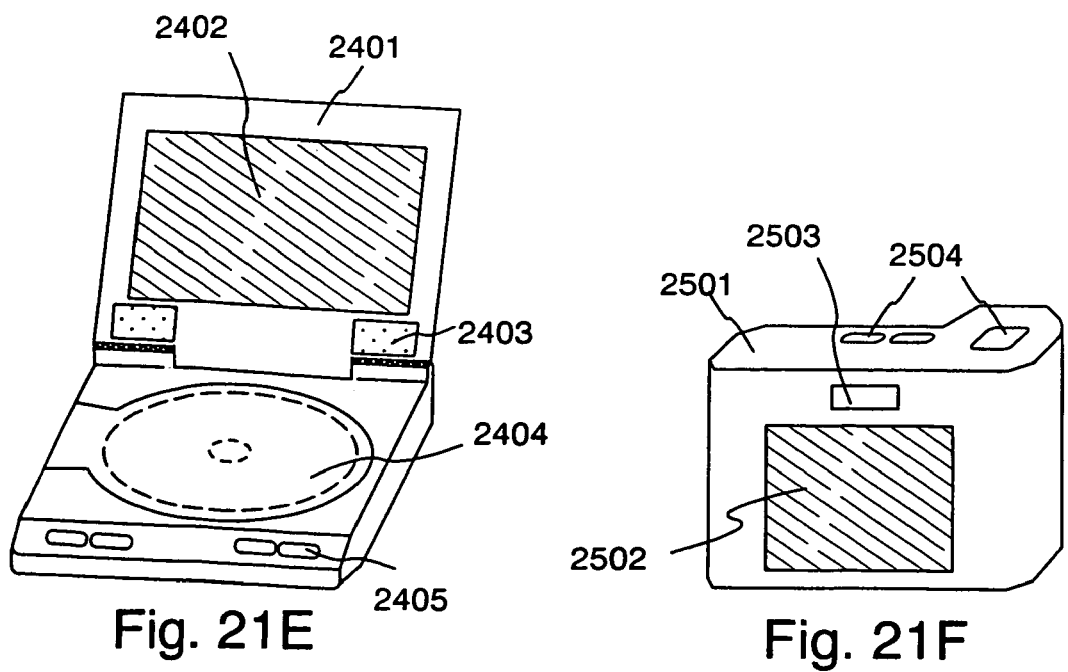
Fig. 21E
Fig. 21F

LIGHT EMITTING DEVICE AND METHOD FOR MANUFACTURING THE SAME

FIELD OF THE INVENTION

The present invention relates to a light emitting device using a light emitting element having a layer that contains an organic compound between a pair of electrodes (hereinafter, referred to as a layer containing an organic compound), on which an electric field is applied to obtain fluorescence or phosphorescence, and to a method for manufacturing such a novel light emitting device. Here, the term "light emitting device" used in the present specification represents one of image display devices, light emitting devices, and optical sources (including lighting units). In addition, the light emitting device may be any kind of the light emitting devices, such as a module on which a flexible printed circuit (FPC), a tape automate bonding (TAB), or a tape carrier package (TCP) is attached; a module where a print-wiring plate is mounted on the tip of a TAB tape or TCP; and a module on which an integrated circuit (IC) is directly mounted on alight emitting element by a Chip-On-Glass (COG) system.

DESCRIPTION OF THE RELATED ART

In recent years, the attention has been focused on technology for constructing a thin film transistor (TFT) using a semiconductor thin film (with a thickness in the range of about several nanometers to several hundred nanometers) formed on a substrate having an insulating surface. The thin film transistors have been widely applied in electronic devices such as ICs and electric optical devices. In particular, the development of such a transistor has been hurried for providing a switching element of an image displaying device.

A light emitting element using an organic compound as a luminous body, characterized by its thin thickness, light weight, fast response, low-voltage DC drive, and so on, has been expected to its application in a next-generation flat panel display. Furthermore, a display device in which light emitting elements are arranged in a matrix configuration has been considered more advantageous than the conventional liquid crystal display device because of being superior in visibility with a wide angle of visual field.

The light emitting element having an organic compound comprises a layer that contains the organic compound from which electro luminescence can be generated by the application of an electric field (hereinafter, it is referred to as an EL layer), and an anode and a cathode. A light emitting mechanism of the light emitting element may be as follows. That is, when a voltage is applied on the organic compound layer being sandwiched between a pair of the electrodes, an electron injected from the cathode and an electron hole injected from the anode are brought into recombination with each other at the luminescence center of the organic compound layer to form a molecular excitation. Subsequently, the light emission is occurred by discharging energy when the molecular excitation returns to a ground state. There are two types of the excitation state known in the art, an excited singlet state and an excited triplet state. The light emission may be allowed in either state.

The light emitting device constructed of a plurality of light emitting elements being arranged in a matrix configuration may be operated by one of well-known driving systems such as a passive matrix drive (a simple matrix type) and an active matrix drive (an active matrix type). However, when the pixel density increases, it may be preferable to use the active matrix type system in which a switch is provided for every pixel (or every dot) because it can be driven at a low voltage.

The active matrix type light emitting device may be designed in two different ways depending on the direction of light radiation. One of them is that light emitted from an EL element passes through an opposite substrate and radiates into the eyes of the observer (i.e., a lower-side radiation type). In this case, the observer is allowed to recognize an image from the opposite substrate. The other is that light emitted from the EL element passes through the substrate of this element and radiates into the eyes of the observer (i.e., an upper-side radiation type). In this case, the observer is allowed to recognize an image from the direction of the EL element.

Furthermore, monomeric and polymeric materials have been studied for an organic compound to be provided as an organic compound layer (i.e., a light emitting layer in the strict sense), which may be the center of the light emitting element. Among them, the attention has been focused on the polymeric material because of its high thermostability and convenience in handling compared with the monomeric material.

For forming a film from an organic compound, an evaporation method, a spin-coating method, and an ink-jet method have been known in the art. Among them, for realizing a full-color image formation using a polymer material, the spin-coating method and the ink-jet coating have been particularly known in the art.

The light emitting element having an organic compound has a disadvantage in that it tends to be deteriorated by various factors, so that the greatest problem thereof is to increase its reliability (make longer its life span).

SUMMARY OF THE INVENTION

For solving the above problems, an object of the present invention is to provide a method for manufacturing an active-matrix type light emitting device and the configuration of such an active-matrix type light emitting device having high reliability.

In a first aspect of the present invention disclosed in the specification, there is provided a light emitting device having a pixel part including a plurality of light emitting elements between first and second substrates which have their respective insulating surfaces and a driving circuit including a plurality of thin film transistor, where the light emitting element has a first electrode, a layer containing an organic compound in contact with the first electrode, and a second electrode in contact with the layer containing the organic compound, wherein the thin film transistor is coated with an interlayer insulation film comprised of a laminate of an organic insulation film an inorganic insulation film that covers the organic insulation film;

a step portion is formed by a side surface of the inorganic insulation film and a side surface of the organic insulation film at an opening of the interlayer insulation film;

the inorganic insulation film has a curved surface having a curvature radius along an upper end portion of the organic insulation film; and an end portion of the first electrode is coated with an insulating material having a curved surface with a curvature radius on an upper end portion thereof.

According to the configuration of the light emitting device of the first aspect of the present invention, the surface of the organic insulation film becomes flat, so that the surface of the first electrode also becomes flat, preventing the EL element from occurring short. As the inorganic insulation film is formed, it becomes possible to protect the TFT by blocking the dispersion of impurities form the EL element and prevent the escape of gas from the organic insulation film. Furthermore, as the inorganic insulation film is provided, the organic insulation film is prevented from etching at the time of etching the first electrode. Furthermore, as the inorganic insulation film has a curved surface with a curvature radius, the coverage of the source electrode or the drain electrode becomes excellent. Moreover, the etching processing is performed several times to form steps on the side surface of the inorganic insulation film and the side surface of the organic insulation film at the opening of the interlayer insulation film. Thus, the TFT can be prevented from being damaged at the time of forming a contact hole. As the curve surface with a curvature radius is provided on the insulating material that covers the first electrode, the coverage of the EL layer becomes excellent to inhibit the generation of shrinkage or the like.

Furthermore, an organic insulation film may be formed on the inorganic insulation film that covers the thin film transistor. Therefore, a second aspect of the present invention is to provide a light emitting device having a pixel part including a plurality of light emitting elements between first and second substrates which have their respective insulating surfaces and a driving circuit including a plurality of thin film transistor, where the light emitting element has a first electrode, a layer containing an organic compound in contact with the first electrode, and a second electrode in contact with the layer containing the organic compound, wherein the thin film transistor is coated with an interlayer insulation film comprised of a laminate of an inorganic insulation film and an organic insulation film;

a step portion is formed by a side surface of the inorganic insulation film and a side surface of the organic insulation film at an opening of the interlayer insulation film;

an upper end of the organic insulation film has a curved surface having a curvature radius; and an end portion of the first electrode is coated with an insulating material having a curved surface with a curvature radius on an upper end portion thereof.

According to the configuration of the light emitting device of the second aspect of the resent invention, the surface of the organic insulation film becomes flat, so that the surface of the first electrode also becomes flat, preventing the EL element from occurring short. In addition, the inorganic insulation film is formed on a place near the active layer of the TFT to effectively protect the TFT by blocking the dispersion of impurities from the EL element. In this case, furthermore, the inorganic insulation film for dispersing hydrogen atoms and the inorganic insulation film for blocking the dispersion of impurities from the EL element are laminated while being in contact with each other.

In each of the above aspects of the present invention, the pixel part may have a thin film transistor electrically connected to the first electrode as shown in FIGS. 1 to 5. Wiring in contact with the source region or the drain region of the thin film transistor may be brought into contact to a part of the first electrode and may be provided on the first electrode. In this case, the first electrode is formed after the formation of wiring. Alternatively, as shown in FIGS. 6 to 8, the pixel part may be comprised a thin film transistor electrically connected to the first electrode, and the first electrode may be in contact with a part of wiring in contact with an source region or a drain region of the thin film transistor and is provided on the wiring. In this case, the first electrode is formed before the formation of wiring.

A third aspect of the present invention is a light emitting device having a pixel part including a plurality of light emitting elements between first and second substrates which have their respective insulating surfaces and a driving circuit including a plurality of thin film transistor, where the light emitting element has a first electrode, a layer containing an organic compound in contact with the first electrode, and a second electrode in contact with the layer containing the organic compound, wherein the thin film transistor is coated with an interlayer insulation film comprised of a laminate of an organic insulation film an inorganic insulation film that covers the organic insulation film;

a step portion is formed by a side surface of the inorganic insulation film and a side surface of the organic insulation film at an opening of the interlayer insulation film;

the inorganic insulation film has a curved surface having a curvature radius along an upper end portion of the organic insulation film;

an end portion of the first electrode is coated with an insulating material having a curved surface with a curvature radius on an upper end portion thereof; and an end portion of the first electrode has a slant face extending to a center of the first electrode, where the slant face reflects light emitted from the layer containing the organic compound.

In addition, another aspect of the present invention may be configured as an example shown in FIG. 16 and FIG. 17, therefore a fourth aspect of the present invention is a light emitting device having a pixel part including a plurality of light emitting elements between first and second substrates which have their respective insulating surfaces and a driving circuit including a plurality of thin film transistor, where the light emitting element has a first electrode, a layer containing an organic compound in contact with the first electrode, and a second electrode in contact with the layer containing the organic compound, wherein the thin film transistor is coated with an interlayer insulation film comprised of a laminate of an inorganic insulation film and an organic insulation film;

a step portion is formed by a side surface of the inorganic insulation film and a side surface of the organic insulation film at an opening of the interlayer insulation film;

an upper end of the organic insulation film has a curved surface having a curvature radius;

an end portion of the first electrode is coated with an insulating material having a curved surface with a curvature radius on an upper end portion thereof; and an end portion of the first electrode has a slant face extending to a center of the first electrode, where the slant face reflects light emitted from the layer containing the organic compound.

In the above third and fours aspects of the present invention, the first electrode may have a slant face extending to a center of the first electrode and a slanting angle thereof may be over than 30° and less than 70°.

In the above third and fours aspects of the present invention, furthermore, the insulating material that covers the end portion of the first electrode may have a curved surface with a curvature radius on an upper end portion thereof, and the curvature radius may be 0.2 μm to 3 μm. As the curved surface having a curvature radius is formed on the upper end portion of the insulating material that covers the end portion of the first electrode, the surface of the first electrode is able to prevent the foreign substance (dust or the like) from being remained at the foot of the first electrode at the time of washing the surface of the first electrode.

In each of the above aspects of the invention, the layer containing the organic compound may be a material that emits red light, a material that emits green light, or a material that emits blue light. Alternatively, the layer containing the organic material may be a material that emits white light and may be used in combination with a color filter provided on the first substrate or the second substrate. Alternatively, in the above aspects of the invention, the layer containing the organic compound may be a material that emits monocolor light and may be used in combination with a color-changing layer or a coloring layer formed on the first substrate or the second substrate.

For manufacturing the novel light emitting device, furthermore, an aspect of the present invention is a method for manufacturing a light emitting device having a light emitting element, where the light emitting element includes a thin film transistor on a substrate having an insulating surface, a first electrode electrically connected to the thin film transistor, a layer containing an organic compound in contact with the first electrode, and a second electrode in contact with the layer containing the organic compound, comprising the steps of:

forming a contact hole extending to a source region or a drain region of the thin film transistor by etching an inorganic insulation film that covers the source region and the drain region of the thin film transistor then forming an organic insulation film and forming again a contact hole extending to the source region on the drain region by etching the organic insulation film;

forming a connecting electrode for making a connection with the source region or the drain region of the thin film transistor;

forming a first electrode in contact with the connecting electrode;

forming an insulating material that covers an end portion of the first electrode;

forming a layer containing an organic compound in contact with a side surface of the insulating material and the first electrode; and forming a second electrode on the layer containing the organic compound.

For manufacturing the light emitting device of each of third and fourth aspects of the present invention, another aspect of the present invention is a method for manufacturing a light emitting device having a light emitting element, where the light emitting element includes a thin film transistor on a substrate having an insulating surface, a first electrode electrically connected to the thin film transistor, a layer containing an organic compound in contact with the first electrode, and a second electrode in contact with the layer containing the organic compound, comprising the steps of:

hydrogenating an inorganic insulation film after forming the inorganic insulation film comprised of a laminate of a silicon nitride film and an silicon oxynitride film covering the thin film transistor;

forming a contact hole extending to the electrode and a contact hole extending to a source region or a drain region by etching the inorganic insulation film;

forming an electrode connecting to the source region or the drain region;

forming an interlayer insulation film that covers the electrodes;

forming a contact hole extending to the electrode and a contact hole extending to the source region or the drain region by etching the interlayer insulation film;

forming a first electrode comprised of a laminate of metallic layers connecting to the source region or the drain region forming an interlayer insulation film that covers the electrode;

forming an insulating material that covers an end portion of the first electrode;

thinning a center of the first electrode by etching using the insulating material as a mask such that a slant surface is exposed along an edge of the first electrode;

forming a layer containing an organic compound; and forming a second electrode on the layer containing the organic compound, where the second electrode is comprised of a metallic thin film through which light transmits.

Furthermore, after the formation of the silicon oxynitride film, the hydrogenation may be performed. Therefore, for obtaining the light emitting device of the third and the fourth aspects of the present invention, a further aspect of the present invention is a method for manufacturing a light emitting device having a light emitting element, where the light emitting element includes a thin film transistor on a substrate having an insulating surface, a first electrode electrically connected to the thin film transistor, a layer containing an organic compound in contact with the first electrode, and a second electrode in contact with the layer containing the organic compound, comprising the steps of:

hydrogenating after forming an silicon oxynitride film that covers the thin film transistor;

forming a silicon nitride film on the silicon oxynitride film by a sputtering method; forming a contact hole extending to a source region or a drain region by etching the silicon oxynitride film and the silicon nitride film;

forming an electrode connecting to the source region or the drain region; forming an interlayer insulation film that covers the electrode;

forming a contact hole extending to the electrode and a contact hole extending to the source region or the drain region by etching the interlayer insulation film;

forming a first electrode comprised of a laminate of metallic layers connecting to the source region or the drain region;

forming an insulating material that covers an end portion of the first electrode;

thinning a center of the first electrode by etching using the insulating material as a mask such that a slant surface is exposed along an edge of the first electrode;

forming a layer containing an organic compound; and forming a second electrode on the layer containing the organic compound, where the second electrode is comprised of a metallic thin film through which light transmits.

For manufacturing the light emitting device of each of third and fourth aspects of the present invention, a still further aspect of the present invention is a method for manufacturing a light emitting device having a light emitting element, where the light emitting element includes a thin film transistor on a substrate having an insulating surface, a first electrode electrically connected to the thin film transistor, a layer containing an organic compound in contact with the first electrode, and a second electrode in contact with the layer containing the organic compound, comprising the steps of:

hydrogenating after forming an silicon oxynitride film that covers the thin film transistor;

forming a contact hole extending to a source region or a drain region by etching the silicon oxynitride film;

forming an electrode connecting to the source region or the drain region;

forming a silicon nitride film on the electrode and the silicon oxynitride film by a sputtering method;

forming an interlayer insulation film on the silicon nitride oxide film;

forming a contact hole extending to the electrode and a contact hole extending to the source region or the drain region by etching the interlayer insulation film and the silicon nitride film;

forming an first electrode comprised of a laminate of metallic layers connecting to the source region or the drain region;

forming an insulating material that covers an end portion of the first electrode;

thinning a center of the first electrode by etching using the insulating material as a mask such that a slant surface is exposed along an edge of the first electrode;

forming a layer containing an organic compound; and forming a second electrode on the layer containing the organic compound, where the second electrode is comprised of a metallic thin film through which light transmits.

In each of the above aspects of the manufacturing method of the invention, the first electrode may be an anode or a cathode of the light emitting element.

In addition, in each of the above aspects of the manufacturing method of the invention, the organic resin material may have a curved surface with a curvature radius on an upper end portion thereof, and the curvature radius may be 0.2 μm to 3 μm.

Furthermore, in each of the above aspects of the manufacturing method of the invention, insulating material that covers the end portion of the first electrode may have a curved surface with a curvature radius on an upper end portion thereof, and the curvature radius may be 0.2 μm to 3 μm.

Furthermore, the light emitting element (the EL element) comprises a layer (hereinafter, referred to as an EL layer) containing an organic compound from which electro luminescence can be generated by the application of an electric field, an anode, and a cathode. There are two types of the excitation state of luminescence from the organic compound. The one is luminescence (fluorescence) at the time of returning from an excited singlet state to a base state and the other is luminescence (phosphorescence) at the time of returning from an excited triplet state to a base state. Both of them can be applied on the light emitting device manufactured by the present invention. In addition, the layer (EL layer) containing the organic compound layer may also contain an inorganic material such as silicon.

For the light emitting device of the present invention, the driving method for picture representation is not limited to a specific one. For instance, a dot sequential driving system, a line sequential driving system, a phase sequential driving system, or the like may be applied. Typically, the line sequential driving system is applied. If required, a time-division gradation driving method or an area gradation driving method may be also used in an appropriate manner. Furthermore; a picture signal to be entered in a source line of the light emitting device may be an analog signal or a digital signal. In addition, the driving circuit and so on may be appropriately designed so as to be fit to the picture signal.

BRIEF DESCRIPTION OF THE DRAWINGS

FIG. 1A is a top view for illustrating a light emitting device as one of embodiments of the present invention, and FIG. 1B shows a cross sectional view of a driving circuit and a pixel part (Example 1);

FIGS. 4A and 4B are cross sectional views for illustrating Example 2;

FIGS. 5A and 5B are cross sectional views for illustrating Example 1;

FIGS. 8A and 8B are cross sectional views for illustrating Example 3;

FIGS. 9A and 9B are cross sectional views for illustrating Example 4;

FIGS. 11A and 11B are cross sectional views for illustrating Example 5;

FIGS. 15A and 15B are cross sectional views for illustrating Example 7;

FIGS. 17A and 17B are cross sectional views for illustrating Example 8;

FIGS. 20A to 20C are diagrams illustrating the Example 9.

FIGS. 21A to 21F are diagrams showing examples of electronic equipments (Example 10)

DESCRIPTION OF THE PREFERRED EMBODIMENTS

Hereinafter, we will describe preferred embodiments of the present invention with reference to the attached drawings.

Figure 2:
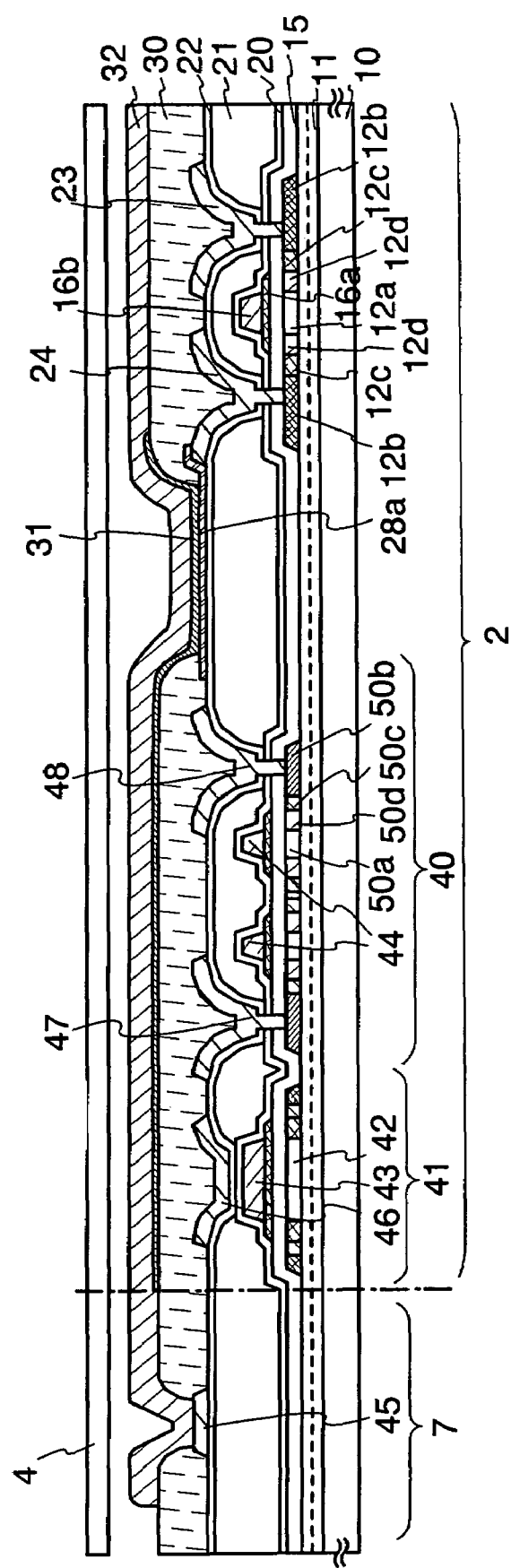
FIG. 2 is a cross sectional view of a pixel part and a connecting part of a light emitting device as one of embodiments of the present invention (Example 1)

Referring now to FIGS. 1A, 1B and 2, at first, the configuration of an active-matrix type light emitting device as one of preferred embodiments of the present invention will be described. FIG. 1A is a top view of the light emitting device and FIG. 1B is a cross-sectional view of two parts of the apparatus along the dotted line A-A' and the dotted line B-B' in FIG. 1A.

In FIGS. 1A, 1B, the reference numeral 1 denotes a source signal line driving circuit, 2 denotes a pixel part, and 3 denotes a gate signal line driving circuit. Also the reference numeral 4 denotes a sealed substrate and 5 denotes a sealing adhesive. An inner area surrounded and defined by the sealing adhesive 5 is an empty space. Furthermore, the reference numeral 7 denotes a connecting region for making connection between an upper electrode common to light emitting elements and wiring on the substrate.

Furthermore, the light emitting device of the present embodiment is designed such that video signals and clock signals are received from a flexible printed circuit (FPC) 6 provided as an external input terminal. Here, although not shown in the figure, a printed wiring board (PWB) may be attached on the FPC. The term "light emitting device" used in the specification represents not only a light emitting device itself but also one on which FPC or FPC with PWB is attached.

Referring now to FIG. 1B, the cross-sectional structure of the light emitting device will be described. On a substrate 10, the driving circuits and the pixel part are formed. In the figure, the source signal line driving circuit 1 as the driving circuits and the pixel part are illustrated.

Furthermore, in the source signal line driving circuit 1, a CMOS circuit is formed and provided as a combination of an n-channel TFT 8 and a p-channel TFT 9. The n-channel TFT 8 comprises: a channel forming region 13a on which an upper layer of a gate electrode 17 is piled up through a gate insulation film 15; a low-level impurity region 13d on which a lower layer of the gate electrode 17 is piled up through the gate insulation film 15; a low-level impurity region 13c on which the lower layer of the gate electrode 17 is not piled up, and a high-level impurity region 13b provided as a source region or a drain region. In addition, the p-channel TFT 9 comprises: a channel forming region 14a on which an upper layer of a gate electrode 18 is piled up through a gate insulation film 15; a lower-level impurity region 14d on which a lower layer of the gate electrode 18 is piled up through the gate insulation film 15; a low-level impurity region 14c on which the lower layer of the gate electrode 18 is not piled up; and a high-level impurity region 14b provided as a source region or a drain region. Furthermore, the reference numerals 25, 26, and 27 denote source electrodes or drain electrodes. The TFT that forms the driving circuit may be prepared using the well-known CMOS circuit, PMOS circuit, or NMOS circuit. In the present embodiment, there is provided a driver-integrated type where the driving circuit is formed on the substrate. According to the present invention, however, it is not limited to such a design. Alternatively, it may be formed on the outside, not on the substrate.

Furthermore, the pixel part 2 comprises a switching TFT 40 and a plurality of pixels including a first electrode (anode) 28a and a current-controlling TFT, where the first electrode 28a is provided as a lower electrode electrically connected to a drain region or a source region 12b(a high-level impurity region) of the current-controlling TFT. A plurality of TFTs is formed in one pixel. The current-controlling TFT comprises: a channel forming region 12a on which an upper layer 16b of a gate electrode 16a and 16b is piled up through the gate insulation film 15; a low-level impurity region 12d on which a lower layer 16a of the gate electrode is piled up through the gate insulation film 15; and a low-level impurity region 12c on which the lower layer 16a of the gate electrode is not piled up. Here, the reference numeral 23 denotes a source electrode or a drain electrode, and 24 denotes a connecting electrode for making a connection between the first electrode 28a and the high-level impurity region 12b.

In FIG. 1B, there is only illustrated the current-controlling TFT. In FIG. 2, however, there is shown a cross sectional view that also illustrates a switching TFT 40 and a capacity 41 arranged on the pixel part 2. In FIG. 2, the switching TFT 40, is exemplified as one using an n-channel TFT having a plurality of channel forming regions 50a on which a gate electrode 44 is piled up through the gate insulation film 15. Here, the reference numerals 47 and 48 denote source wiring or drain wiring, 50b denotes a source region or a drain region, 50c denotes a low-level impurity region on which the gate electrode 44 is not piled up, and 50d denotes a low-level impurity region on which the gate electrode 44 is piled up. In the capacity 41, interlayer insulation films 22, 20 are provided as dielectric materials and a holding capacity is formed using an electrode 46 and an electrode 43. In addition, the gate insulation film 15 is provided as a dielectric material and a holding capacity is also formed using the electrode 43 and a semiconductor film 42. In FIG. 2, the same structural components as those of FIGS. 1A and 1B are represented by the same reference numerals.

Furthermore, each of the interlayer insulation films 20, 21, 22 may be, for example, a photosensitive or non-photosensitive organic material (such as polyimide, acrylate, polyamide, polyimide amide, resist, or benzocyclobutene); an inorganic material (such as silicon oxide, silicon nitride, or silicon oxynitride) coated with a sputtering method, a CVD method, or a coating method; or a laminate thereof. In FIGS. 1A, 1B and 2, the inorganic insulation film 20 is made of a silicon nitride film and is formed over the gate electrode and the gate insulation film 15. The inorganic insulation film 20 is formed so that hydrogen is introduced into the film, and is provided for hydrogenation in which a dangling bond of a semiconductor layer is provided as a termination by heat treatment. It is possible to hydrogenate a semiconductor located below regardless of the existence of the gate insulation film 15 constructed of a silicon oxide film. In addition, the interlayer insulation film 21 is formed by a coating of a photosensitive organic material, followed by subjecting to a selective etching with a wet etching or dry etching method such that the upper portion becomes a curved surface having a curvature radius. When an organic material is used as the interlayer insulation film 21, water, gas, or impurities may be dispersed from the interlayer insulation film 21 to deteriorate a light emitting element to be formed later. For preventing such a disadvantage, it is preferable to coat the interlayer insulation film 21 with the interlayer insulation film 22 such as a silicon nitride film, an silicon oxynitride film, an oxidized aluminum nitride film, or a laminate thereof. Furthermore, the interlayer insulation film 22 is capable of preventing the dispersion of impurities from the substrate 10 to a light emitting element or from the light emitting element to TFT. Furthermore, in the case of using an organic material having a hygroscopic property as the interlayer insulation film 21, this film is swollen when it is exposed to a solution such as a releasing solution used in other patterning in the subsequent step. There is a need to bake again or to cover with the interlayer insulation film 22 to prevent the interlayer insulation film 21 from being swollen.

Figure 3:
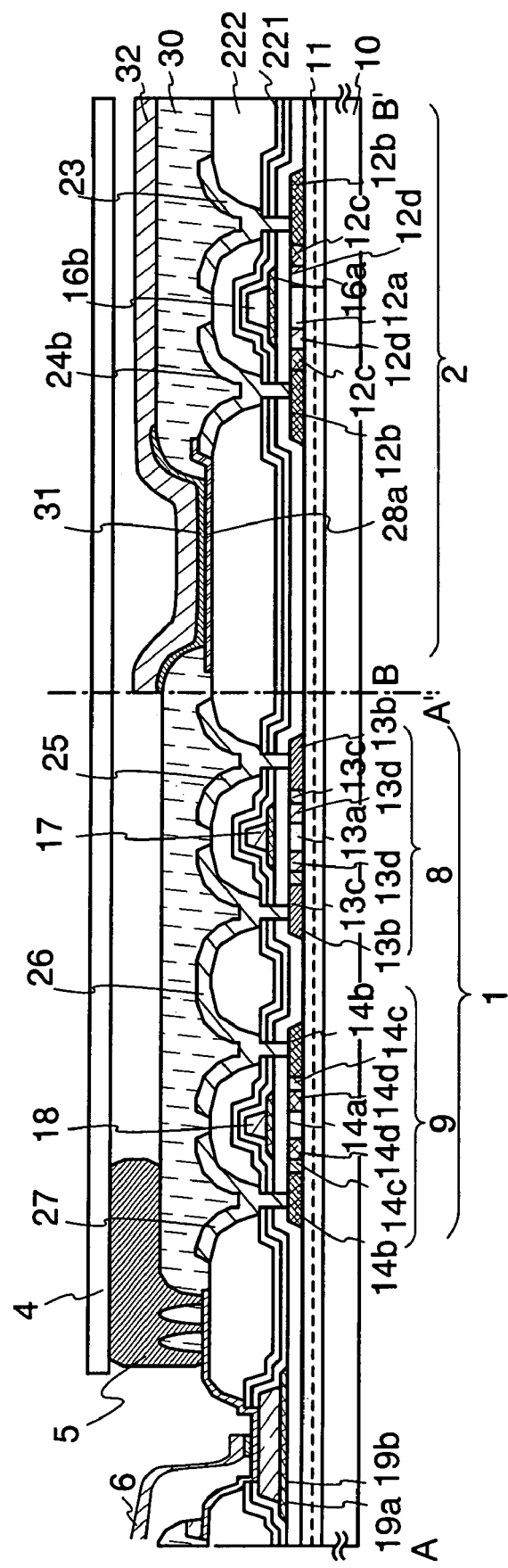
FIG. 3 is a cross sectional view for illustrating Example 1.

Furthermore, the present invention is not limited to the sequence of lamination of interlayer insulation films shown in FIGS. 1A, 1B and 2, or the sequence of steps for film formation and hydrogenation thereof. Alternatively, for example as shown in FIG. 3, an interlayer insulation film 221 for preventing the dispersion of impurities is formed on the interlayer insulation film for hydrogenation and is then hydrogenated, followed by the formation of a film with an organic resin material by a coating method. In this case, furthermore, the interlayer insulation film 222 having a curved surface having a curvature radius on its upper end portion may be formed by subjecting the film to wet etching or dry etching. In the case of subjecting an organic resin film to dry etching, charges may be generated and thus there is the possibility of causing variations in TFT characteristics. Therefore, it is preferable to etch the film with wet etching. In the case of etching the interlayer insulation film made of a laminate of the inorganic insulation film and an organic resin film, the wet etching may be only performed on the organic resin film, or the wet etching may be performed after dry etching of the inorganic insulation film and forming an organic resin film.

In the case of using a photosensitive organic resin material as the interlayer insulation film 21, the upper end portion thereof tends to become a curved surface having a curvature radius. On the other hand, in the case of using a non-photosensitive organic resin material or an inorganic material as the interlayer insulation film 222, the configuration of the resulting film can be represented as shown in the cross sectional view of FIGS. 4A and 4B.

Furthermore, in the case of making a lower-side radiation type display, it is preferable to use a transparent material as each of the interlayer insulation films 20 to 21.

Furthermore, insulating materials (also referred to as banks, partitions, barriers, embankments, or the like) 30 are formed on the both ends of the first electrode (anode) 28a, and a layer containing an organic compound (referred to as an EL layer) 31 is formed on the first electrode (anode) 28a. Before or after the formation of the EL layer 31, it is preferable to perform deaeration by the application of heat in a vacuum. The layer containing the organic compound 31 is very thin, so that it is preferable to make the surface of the first electrode flat. For instance, before or after the patterning of the first electrode 28a, the film may be flattened by a chemical or mechanical grinding treatment (typically CMP technology or the like). In the case of performing the CMP, the electrode 24 or the insulating material 30 is provided as a thin film, and the end portion of the electrode 24 is tapered are desirable to improve the flatness of the first electrode. Because area the CMP not being performed decrease. For improving the cleanness of the surface of the first electrode, washing (brush washing and so on) for removing a foreign substance (dust or the like) may be performed. For the washing, the end portion of the electrode 24 may be tapered to prevent the foreign substance (dust or the like) from being remained at the end portion of the first electrode.

The insulating material 30 may be a photosensitive or non-photosensitive organic material (such as polyimide, acrylate, polyamide, polyimide amide, resist, or benzocyclobutene), an inorganic material (such as silicon oxide, silicon nitride, or silicon oxynitride) with a CVD method, a sputtering method, or coating method, or a laminate thereof. In the case of using the photosensitive organic material as the insulating material 30, useful photosensitive organic materials may be roughly grouped into two types. That is, the one is a negative type which becomes insoluble to an etchant by photosensitive light irradiation and the other is a positive type which becomes soluble to the etchant by light irradiation. According to the present invention, both types can be appropriately used.

In the case of using a photosensitive organic material as the insulating material 30, as shown in FIGS. 1A, 1B and 2, it tends to become one having a curved surface with a curvature on its upper end portion. In the case of using a non-photosensitive organic material or inorganic material, the insulating material 330, 430 becomes one having a cross section shown in FIGS. 4A and 4B Furthermore, in the case of using an organic material as the insulating material 30 or each of interlayer insulation films 20 to 22, it is important to deaerate the material by heat treatment in a vacuum to remove gas or water from the film. Therefore, it is preferable to form a layer 31 containing an organic compound after the deaeration.

On the layer 31 containing the organic compound, a second electrode (cathode) 32 to be provided as an upper electrode is formed. Consequently, a light emitting element comprised of the first electrode (anode) 28a, the layer 31 containing an organic compound, and the second electrode (cathode) 32 is formed. When the light emitting element is provided for white light emission, a coloring layer and a color filter (not shown in the figure for simplification) are mounted on the substrate 10.

The second electrode 32 can be functioned as wiring common to all pixels and is electrically connected with FPC 6 through the wiring. In FIG. 2, furthermore, there is shown a connecting region 7 for making an electrical connection between the second electrode 32 and the wiring 45. The wiring 45 is extended to make an electrical connection with FPC 6.

In addition, on the terminal portion shown in FIG. 1B, a terminal electrode formed as a laminate of electrodes 19a, 19b formed by the same step as that of the gate electrode, an electrode formed by the same step as that of the source electrode or the drain electrode, and the electrode 28b formed on the same step as that of the first electrode 28a is stuck on the FPC 6 with an adhesive such as an electric conductive adhesive. Here, the configuration of the terminal portion is not limited to the structure shown in FIG. 1B. It may be appropriately modified and formed.

In addition, for sealing the light emitting element formed on the substrate 10, a sealed substrate 4 is laminated thereon using a sealing adhesive 5. Furthermore, for obtaining an interval between the sealed substrate 4 and the limit-emitting element, a spacer made of a resin film may be obtained. Then, inert gas such as nitrogen is filled in an inner space of the sealing adhesive 5. In addition, the seal adhesive 5 may be preferably made of an epoxy resin. Also, the sealing adhesive 5 may be preferably made of a material through which water and oxygen permeate as little as possible. Furthermore, the sealing adhesive 5 may contain a substance which exerts an effect of absorbing oxygen and water into the inside of the space.

In the present embodiment, the sealed substrate 4 may be formed of a material such as a glass substrate, a quartz substrate, or a plastic substrate made of fiberglass-reinforced plastics (FRP), polyvinyl fluoride (PVF), miler polyester, acryl, or the like. In addition, after sticking the sealed substrates using the sealing adhesive 5, it is possible to make a sealing with the sealing adhesive 5 so as to cover the side surface (the exposed surface).

As described above, by sealing the light emitting element into the closed space, the light emitting element can be completely blocked from the outside, so that it becomes possible to prevent infiltration of a substance such as water or oxygen that accelerates the deterioration of the organic compound layer. Therefore, the light emitting device having high reliability can be obtained.

Furthermore, the present invention is not limited to the switching TFT structure of the pixel part shown in FIG. 2. As shown in FIG. 5A, for example, the LDD region 60c which is not piled up on the gate electrode may be only formed between the channel forming region 60a and the drain region (or the source region) 60b through the gate insulation film. Here, the shape of the gate electrode is not limited. Alternatively, as shown in FIG. 5B, it may be formed as a single-layer gate electrode.

Additionally, the top-gate type TFT is described as an example in the above description. However, the present invention can be applied irrespective of the TFT structure. For instance, the present invention may be applied on a bottom gate type (invert staggered type) TFT or forward staggered type TFT.

Figure 6A:
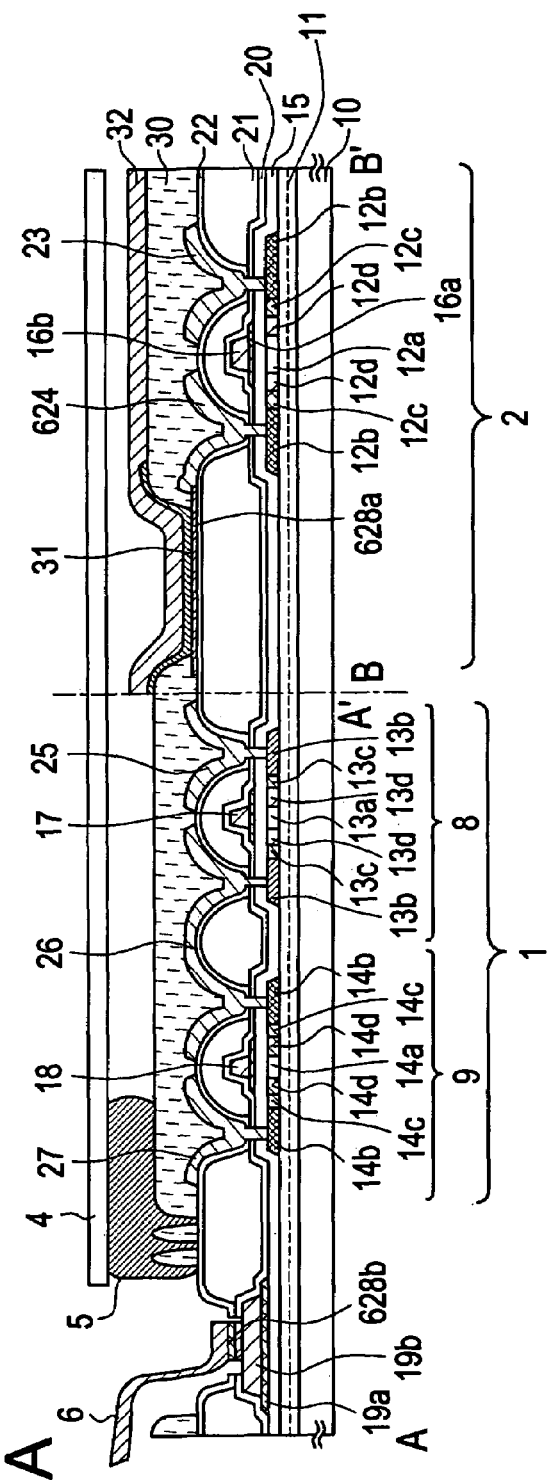
FIGS. 6A and 6B are cross sectional views for illustrating Example 3.

In FIG. 1B, furthermore, there is shown a structure in which the first electrode 28a is formed after the formation of a connecting electrode 24 to be connected to the source region or the drain region. According to the present invention, however, it is not specifically limited to such a structure. Alternatively, for example, the connecting electrode 624 to be connected to the source region or the drain region may be formed after forming the first electrode 628a as shown in FIG. 6A.

In addition, as shown in FIG. 9A, an electrode may be prepared by providing an insulating material 30 as a mask and etching the mask. That is, an electrode may be formed such that it is comprised of a first electrode 1024a, and an electrode 1024b having a slant face that reflects light from a layer 1031 containing an organic compound. In FIG. 9A, furthermore, for emitting light in the direction along the arrow shown in the figure, a second electrode 1032 is provided as a thin metal film, a transparent conductive film, or a laminate thereof.

Furthermore, as shown in FIG. 15A, a first electrode 1428a may be formed on an interlayer insulation film 1431 after forming the interlayer insulation film 1431 that covers an electrode 1424 in contact with the source region or the drain region.

Figure 16:
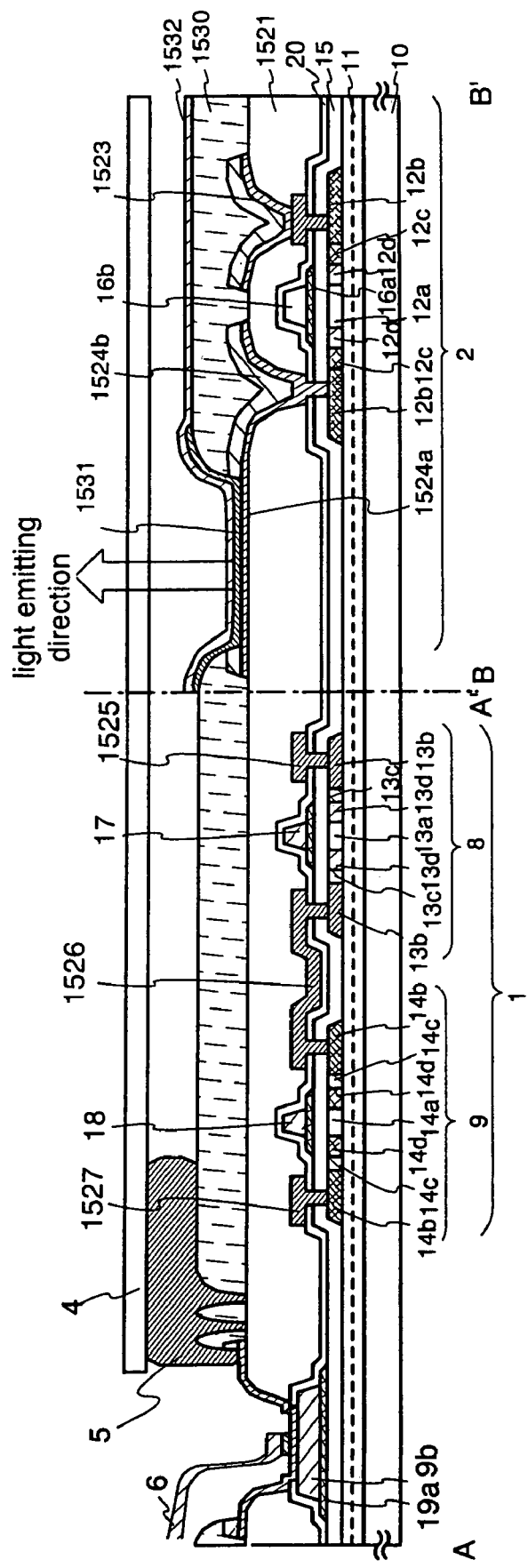
FIG. 16 is a cross sectional view for illustrating Example 8.

Furthermore, as shown in FIG. 16, wiring 1525 to 1527 may be formed on the interlayer insulation film 20 and then wiring of the drive circuit may be extended or brought into contact with other components. In addition, an electrode may be comprised of a first electrode 1524a and an electrode 1524b, which is fabricated to have a slant surface in an end portion, that reflects light from a layer 1531 containing an organic compound an interlayer insulation film 1521 coated over the wiring. In FIG. 16A, there is shown a structure (upper-side radiation type) which takes out the emitted light in the direction along the arrow shown in the figure.

Here, the invention constructed as described above will be described in more detail with reference to the following examples.

EXAMPLE 1

Here, a method of simultaneously manufacturing a pixel portion, and TFTs (n-channel TFTs and a p-channel TFT) of a driving circuit provided in the periphery of the pixel portion on the same substrate to manufacture the light emitting device having EL element is described in detail using FIGS. 1B and 2.

For a lower layer of a base insulating film 11, a silicon oxynitride film formed from $SiH_4$, $NH_3$, and $N_2O$ as material gases (composition ratio: Si=32%, O=27%, N=24%, H=17%) is formed on the heat resistance glass substrate (the first substrate 10) having a thickness of 0.7 mm with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, for an upper layer of the base insulating film 11, a silicon hydride oxynitride film formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous configuration (in this case, amorphous silicon film) is formed to have a thickness of 54 nm (preferably 25 to 80 nm) with $SiH_4$ as a film deposition gas and at a film deposition temperature of 300° C. by using plasma CVD.

In this example, the base insulating film 11 is shown in a form of a two-layer configuration, but a single layer of the insulating film or a configuration in which two or more layers thereof are laminated may be adopted. Further, there is no limitation on the material of the semiconductor film. However, the semiconductor film may be preferably formed of silicon or silicon germanium ($Si_{1-x}Ge_x$ (X=0.0001 to 0.02)) alloy by using a known means (sputtering, LPCVD, plasma CVD, or the like). Further, a plasma CVD apparatus may be a single wafer type or a batch type. In addition, the base insulating film and the semiconductor film may be continuously formed in the same film formation chamber without exposure to an atmosphere.

Subsequently, after the surface of the semiconductor film having an amorphous configuration is cleaned, an extremely thin oxide film with a thickness of about 2 nm is formed from ozone water on the surface. Then, in order to control a threshold voltage of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2\times10^{12}$ atoms/$cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline configuration. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline configuration. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline configuration is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 470 $mJ/cm^2$. Note that an oxide film is formed on the surface by the first laser light irradiation since the irradiation is conducted in an atmosphere or in an oxygen atmosphere. Though an example of using the pulse laser is shown here, the continuous oscillation laser may also be used. When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:$YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm² (preferably 01. to 10 MW/cm²) is required. The semiconductor film is moved at approximately 10 to 2000 cm/s rate relatively corresponding to the laser beams so as to irradiate the semiconductor film.

Though the technique of irradiating laser light is conducted after heat treatment using nickel as a metal element for promoting the crystallization is performed here, crystallization of an amorphous silicon film may be performed by using continuous oscillation laser (the second harmonics of $YVO_4$ laser) without doping nickel.

The oxide film formed by this laser light irradiation and an oxide film formed by treating the surface with ozone water for 120 seconds together make a barrier layer that has a thickness of 1 to 5 nm in total. Though the barrier layer is formed by using ozone water here, another method such as ultraviolet light irradiation performing in an oxygen atmosphere or oxide plasma treatment to oxidize the surface of the semiconductor film having the crystalline configuration may be used. In addition, as another method for forming the barrier layer, an oxide film having a thickness of about 1 nm to 10 nm may be deposited by a plasma CVD method, a sputtering method, an evaporation method, or the like. In this specification, the term barrier layer refers to a layer which has a film quality or film thickness that allows a metal element to pass in the gettering step and which functions as an etching stopper in the step of removing the layer that functions as a gettering site.

On the barrier layer, an amorphous silicon film containing argon elements are formed to a thickness of 50 to 400 nm, in this example, 150 nm by sputtering to serve as a gettering site. Film formation conditions by sputtering in this example include setting the film formation pressure to 0.3 Pa, the gas (Ar) flow rate to 50 sccm, the film formation power to 3 kW, and the substrate temperature to 150° C. The amorphous silicon film that is formed under the above conditions contains argon elements in an atomic concentration of $3\times10^{20}$ to $6\times10^{20}$ atoms/cm³, and contains oxygen in an atomic concentration of $1\times10^{19}$ to $3\times10^{19}$ atoms/cm³. Thereafter, an electric furnace is used in heat treatment at 550° C. for 4 hours for gettering to, reduce the nickel concentration in the semiconductor film having a crystalline configuration. In addition, a lamp annealing apparatus may be used for the gettering instead of the electric furnace.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline configuration (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 15, is formed. In this example, a silicon oxynitride film (composition ratio: Si=32%, O=59%, N=7%, H=2%) is formed with a thickness of 115 nm by plasma CVD.

Next, on the gate insulating film 15, a first conductive film with a thickness of 20 to 100 nm and a second conductive film with a thickness of 100 to 400 nm are formed in lamination. In this example, a 50 nm thick tantalum nitride film and a 370 nm thick tungsten film are sequentially laminated on the gate insulating film 15, and pattering is performed thereon to form each gate electrode and each line in the sequence hereafter described.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer configuration. For example, a three-layer configuration may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer configuration, tungsten nitride may be used in place of tungsten of the first conductive film, an alloy film of aluminum and titanium (Al—Ti) may be used in place of the alloy-film of aluminum and silicon (Al—Si) of the second conductive film, and a titanium film may be used in place of the titanium nitride film of the third conductive film. In addition, a single layer configuration may also be adopted.

An ICP (inductively coupled plasma) etching method may be preferably used for the etching process of the above-mentioned first and second conductive films (the first and second etching processes). The ICP etching method is used, and the etching conditions (an electric energy applied to a coil-shape electrode, an electric energy applied to an electrode on a substrate side, a temperature of the electrode on the substrate side, and the like) are appropriately adjusted, whereby a conductive film can be etched to have a desired taper shape. For etching gases, a suitable one can be chosen from chlorine-based gas, typically, $Cl_2$, $BCl_3$, $SiCl_4$, or $CCl_4$, fluorine-based gas, typically, $CF_4$, $SF_6$, or $NF_3$, and $O_2$.

In this example, after the resist mask is formed, RF (13.56 MHz) power of 700 W is applied to the coil-shape electrode with a pressure of 1 Pa as a first etching condition, and $CF_4$, $SF_6$, and $NF_3$, and $O_2$ can be appropriately used as etching gases. Each flow rate of gasses is set to 25/25/10 (sccm), and RF (13.56 MHz) power of 150 W is applied also to the substrate (sample stage) to substantially apply a negative self-bias voltage. Note that, size of the electrode area on the substrate side is 12.5 cm×12.5 cm, and coil-shape electrode (a quartz disc comprising a coil is used here) has 25 cm in diameter. With the first etching conditions, a W film is etched to form an end portion of the first conductive layer into a tapered shape. The angle of this taper portion is from 15° to 45°. Thereafter, the resist mask is removed and the second etching condition is adopted. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56. MHz) power of 20 W is also applied to the substrate side (sample stage) to substantially apply a negative self-bias voltage.

Under the second etching conditions in which $CF_4$ and $Cl_2$ are mixed, both the W film and the TaN film are etched at the same level. Here, the first etching condition and the second etching condition are referred to as the first etching treatment.

Further, in the case where the three-layer configuration is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used as etching gases, the flow rate of the gases is set to 25/25/10 sccm, and RF (13.56 MHz) power of 500 W is applied to a coil-shape electrode with a pressure of 1 Pa to generate plasma. With the above conditions, it is sufficient that etching is performed for about 30 seconds.

After that, without removing the resist mask, a first doping treatment is conducted to dope the entire surface using gate electrodes as masks. The first doping treatment employs ion doping or ion implantation. As an impurity element imparting n-type conductivity, phosphorus (P) or arsenic (As) is typically used. First impurity regions (n+ region) 13b and 50b are formed in a self aligning manner. An n-type doping impurity element in the density range of $1\times10^{20}$ to $1\times10^{21}$ atoms/cm$^3$ are added to the first impurity regions.

Subsequently, a second etching treatment is performed without removing the resist mask. Here, $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 60 seconds. RF (13.56 MHz) power of 20 W is also applied to the substrate side (sample stage) to substantially apply a negative self-bias voltage. Thereafter, etching treatment is performed without removing the resist mask under a fourth conditions in which $CF_4$, $Cl_2$, and $O_2$ are used as etching gases, the flow rate of the gases is set to 20/20/20 sccm, and RF (13.56 MHz) power of 0.500 W is applied to a coil-shape electrode with a pressure of 1 Pa to generate plasma, thereby performing etching for about 20 seconds. RF (13.56 MHz) power of 20 W is also applied to the substrate side (sample stage) to substantially apply a negative self-bias voltage. Here, the third etching conditions and the fourth etching conditions are referred to as a second etching treatment. Anisotropic etching is conducted on a W film and a Tan film with the second etching treatment. By adding oxygen into the etching gas, a different of the etching speed between the W film and Tan film is made. Although there is no illustration, a gate insulating film not being covered by the first conductive layer is etched more and becomes thinner. At this stage, the gate electrode and electrodes 16 and 17 to 18 composed of the first conductive layer 16a as a lower layer and the second conductive layer 16b as an upper layer are formed.

After that, without removing the resist mask, a second doping treatment is conducted to dope the entire surface using gate electrodes as masks. Impurity regions (n⁻ region) overlapping with a part of the gate electrodes 12c, 13c, 14c and 50c, and impurity regions not overlapping with the gate electrodes 12d, 13d, 14d and 50d are formed. The second doping treatment employs ion doping or ion implantation. In this example, the ion doping method is performed under a condition in a gas flow rate of phosphine ($PH_3$) diluted to 5% with hydrogen of 30 sccm, and the dose of $1.5\times10^{13}$ atoms/cm$^2$ and the accelerating voltage of 90 kV. The resist mask and the second conductive film function as mask for the n-type doping impurity element, and the second impurity region 12d, 13d, 14d and 50d is formed. An n-type doping impurity element in the density range of $1\times10^{16}$ to $1\times10^{17}$ atoms/cm$^3$ are added to the impurity regions 13d and 14d. In this example, the region of same concentration range as the second impurity regions 13d and 14d is referred to as n⁻ region.

After the resist mask is removed, a new resist mask is formed to perform a third doping treatment. By the third doping treatment, third impurity regions, fourth impurity regions and fifth impurity regions are formed that is a semiconductor layer forming the semiconductor layer forming the p-channel type TFT in which p-type doping impurity element (boron and the like) is added.

A p-type doping impurity element in the density range of $1\times10^{20}$ to $1\times10^{21}$ atoms/cm$^3$ are added to the third impurity regions 12b, 14b. Note that, in the third impurity regions, phosphorous (P) has been added in the preceding step (n⁻⁻ region), but the p-type doping impurity element is added at a density that is over 10 times as high as that of phosphorous. Thus, the third impurity regions have a p-type conductivity. In this example, the region of same density range as the third impurity region is referred to as p⁺ region.

The fourth impurity regions 12c and 14c are formed at regions not overlapping with the taper portion of the second conductive layer, and added with the p-type impurity element in the density range of $1\times10^{18}$ to $1\times10^{20}$ atoms/cm$^3$. Here, a region (n⁻ region) added with phosphorous (P) in the preceding step and having same density range with the fourth impurity region is referred to as p⁻ region. Further, a region (n⁻⁻ region) added with phosphorous (P) in the preceding step and the fifth impurity regions 12d, 14d overlapping with the taper portion of the second conductive layer is referred to as p⁻⁻ region.

Though the above-described steps, the impurity regions having n-type or p-type doping impurity element are formed in the respective semiconductor layers.

And, removing the resist mask, performing the cleaning, then, a step of activating the impurity element added to the respective semiconductor layers is conducted. In this activation step, a laser annealing method, a rapid thermal annealing (RTA) method using a lamp light source, a method of irradiating light emitted from a YAG laser or excimer laser from the back surface, heat treatment using a furnace, or a combination thereof is employed.

Next, an interlayer insulating film 20 that covers substantially the entire surface is formed. In this example, a 50 nm thick silicon oxynitride film is formed by plasma CVD. Of course, the interlayer insulating film 20 is not limited to the silicon oxynitride film, and other insulating films containing silicon may be used in a single layer or a lamination configuration. Here, the film formation is performed with a condition of containing hydrogen in the interlayer insulating film. Next, heat treatment (300 to 550° C. for 1 to 12 hours) is performed, thereby conducting a step of hydrogenating the semiconductor layers. This step is a step of terminating dangling bonds of the semiconductor layers by hydrogen contained in the interlayer insulating film 20. The semiconductor layers can be hydrogenated irrespective of the existence of an insulating film (not shown) formed of a silicon oxide film. As another means for hydrogenation, plasma hydrogenation (using hydrogen excited by plasma) may be conducted.

Next, an interlayer Insulating film is formed from an organic insulating material on the interlayer insulating film 20. In this example, a positive type photosensitive acrylic resin film with a thickness of 1.6 μm is formed by a coating method to become an interlayer insulating film 21 having a curved surface on the upper end portion of a contact hole. Further, an interlayer insulating film 22 made of a silicon nitride film with a thickness of 20 to 50 nm is laminated thereon by using sputtering that uses a RF power source. In particular, the silicon nitride film formed by the sputtering using silicon target and the RF power source in a nitrogen atmosphere is desirable because of its density, capability of blocking moisture and oxygen as a matter of course, and as well as capability of sufficiently blocking metal elements which easily diffuse such as Li and the like with a film thickness level of 20 nm. The interlayer insulating film 22 is of multilayer, can be a laminate configuration, for example, of an oxynitride aluminum film with a thickness of 20 nm to 50 nm and a silicon nitride film with a thickness of 20 to 50 nm. Note that, although an example of a silicon nitride film being laminated on an acrylic resin film is shown here, it is not limited thereto particularly. The total thickness of the organic insulating film and the inorganic insulating film may be set to 0.5 to 2.0 µm.

Subsequently, a contact hole extending to each of the impurity regions is formed by removing the gate insulating film 15 and interlayer insulating films 20 and 22. In addition, the sequence of forming the interlayer insulating films 20, 21, 22, the contact hole, and the hydrogenation are not formed particularly limited.

Thereafter, electrodes 23 to 27, 46 to 48 are formed by using Al, Ti, Mo, W and the like. Specifically, a source wiring, a power source supply line, an extraction electrode, a capacity wiring and a connection electrode are formed. As the material of the electrodes and the wirings, a lamination film having Al including silicon film (350 nm thickness), Ti film (100 nm thickness), and Ti film (50 nm thickness) is used. And patterning is performed. Thus, the source electrode, the source wiring, the connection electrode, the extraction electrode, and the power source supply line are formed appropriately. Further, the extraction electrode for contacting with the gate wiring overlapped with the interlayer insulating film is provided in the edge portion of the gate wiring. The input-output terminal portion in which the plural electrodes for connecting with an external circuit and an external power source is provided are formed in other edge portions of each wiring.

And, a first electrode 28a is formed to connect and overlap with the connection electrode 24 which connects with a drain region 12b of the TFT made of a p-channel TFT for current controlling. In this example, the first electrode 28a functions as an anode of the EL element, and since the EL element emits light through the first electrode 28a, it may be a transparent conductive film (ITO (indium tin oxide alloy), indium oxide-zinc oxide alloy ($In_2O_3$—ZnO), zinc oxide(ZnO) and the like), which are being with a big work function. For example, when the ITO is used as the first electrode, hydrogen gas or moisture vapor is taken into the atmosphere by sputtering to obtain an ITO film in the atmosphere state, and heat treatment at a temperature from 200° C. to 225° C. is performed thereon thereafter.

In addition, for flattening the surface of the first electrode 28a, any flattening processing such as CMP may be performed after the formation of the first electrode 28a or after the formation of an insulting material 30. In the case of performing the CMP processing after the formation of the insulating material 30, it is preferable to form an interlayer insulation film 22 to increase the adhesiveness between the insulating material 30 and the interlayer insulation film 21.

As described above, a source driving circuit 1 having an n-channel TFT 8, a p-channel TFT 9, and a CMOS circuit that complementally combines the n-channel TFT 8 and p-channel TFT 9, and a pixel portion 2 provided the plural n-channel TFTs 40 or the plural p-channel TFTs in one pixel are formed.

Then, the insulating material 30 called bank is formed on the both ends of the first electrode 28a to cover the ends thereof. The bank 30 may be formed by an organic resin film or an insulating film including silicon. Here, as the insulating material 30, a positive type photosensitive acrylic resin film is used to form a bank with a shape shown in FIG. 1B.

Next, an EL layer 31 and a second electrode 32 (cathode of the EL element) are formed on the first electrode 28a whose ends are covered with the banks 30.

The EL layer 31 (a layer for light emission and for moving of carriers to cause light emission) is formed by freely combining a light emitting layer, electric charge transporting layers and electric charge injection layers. For example, a monomeric organic EL material or a polymeric organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layer and electric charge injection layers. Known organic EL materials and inorganic materials can be employed.

It is said that the preferred material of a cathode 32 is a metal having a small work function (typically, a metal element belonging to Group 1 or 2 in the periodic table) or alloy of such metal. The light emission efficiency is improved as the work function becomes smaller. Therefore, an alloy material containing Li (lithium) that is one of alkali metals is particularly desirable as the cathode material. The cathode also functions as a wiring common to all pixels and is connected to terminal electrodes 19a, 19b, 28b with an input terminal portion through a connection wiring.

Next, the EL having at least a cathode, an organic compound layer, and an anode is preferably sealed by an organic resin, a protective film (not shown), a sealing substrate, or a sealing can to cut the EL element completely off from the outside and prevent permeation of external substances, such as moisture and oxygen, that accelerate degradation due to oxidization of the EL layer. However, it is not necessary to provide the protective film or the like in the input-output terminal portions to which an FPC needs to be connected later. Alternatively, if necessary, a desiccant may be set for removing moisture in the sealed interspace.

An FPC 6 (flexible printed circuit) is attached to the electrode 28b of the input-output terminal portions using an anisotropic conductive material. Note that the electrode 28b is formed at the same time with the first-electrode 28a. The anisotropic conductive material is composed of a resin and conductive particles several tens to several hundreds µm in diameter whose surfaces are plated by Au or the like. The conductive particles electrically connect the electrodes of the input-output terminal portions with wirings formed in the FPC.

If necessary, an optical film such as a circularly polarizing plate composed of a color changing layer, a color filter, a polarizing plate and a phase difference plate may be provided and an IC chip may be mounted.

According to the preceding steps, a module type light emitting device connected with FPC is completed (FIG. 1A).

Furthermore, the present invention is not limited to the TFT structures shown in FIGS. 1A, 1B and 2, although one more mask here is increased to the total number of the masks for the TFT shown in FIGS. 1A, 1B and 2, as shown in FIG. 5A, alternatively, it may be designed such that a switching TFT 70 of the pixel part has no impurity region piled on the gate electrode to further reduce the OFF current of the TFT.

A Manufacturing method for a TFT shown in FIG. 5A will be described hereafter. For simplification, only points different from the method for obtaining the cross sectional structure shown in FIG. 1B and FIG. 2 (the sequence of etching conditions of gate electrodes and doping) will be described here. Here, in FIG. 5A, the same structural components as those of FIGS. 1A, 1B and 2 are represented by the same reference numerals.

First, in accordance with the manufacturing method of FIG. 1B, a first conductive film (TaN film) and a second conductive film (W film) are formed on a gate insulating film 15. And, after a resist mask is formed, RF (13.56 MHz) power of 700 W is applied to the coil-shape electrode with a pressure of 1 Pa as a first etching condition, and $CF_4$, $SF_6$, and $NF_3$, and $O_2$ can be appropriately used as etching gases. Each flow rate of gasses is set to 25/25/10 (sccm), and RF (13.56 MHz) power of 150 W is applied also to the substrate (sample stage) to substantially apply a negative self-bias voltage. Thereafter, the resist mask is removed and a second etching condition is adopted. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. Here, the first etching conditions and the second etching conditions are referred to as a first etching treatment.

Then a second etching treatment is performed without removing the resist mask. Here, $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 60 seconds. RF (13.56 MHz) power of 20 W is also applied to the substrate side (sample stage) to substantially apply a negative self-bias voltage. Thereafter, etching treatment is performed without removing the resist mask under fourth conditions in which $CF_4$, $Cl_2$, and $O_2$ are used as etching gases, the flow rate of the gases is set to 20/20/20 sccm, and RF (13.56 MHz) power of 500 W is applied to a coil-shape electrode with a pressure of 1 Pa to generate plasma, thereby performing etching for about 20 seconds. RF (13.56 MHz) power of 20 W is also applied to the substrate side (sample stage) to substantially apply a negative self-bias voltage. Here, the third etching conditions and the fourth etching conditions are referred to as the second etching treatment. At this stage, the gate electrode and electrodes 64 and 63 composed of the first conductive layer 66a as a lower layer and a second conductive layer 66b as an upper layer are formed. Since the etching conditions are different from that of FIG. 1B, practically, the gate electrodes are different slightly.

After removing the resist masks, a first doping treatment is conducted to dope using gate electrodes 304 to 307 as masks to the entire surface. In ion doping, the dose is set to $1.5 \times 10^{14}$ atoms/cm² and the acceleration voltage is set to 60 to 100 kV. Typically, phosphorus (P) or arsenic (As) is used as an impurity element that gives the n-type conductivity. An impurity region (n⁻⁻ region) 60c is formed in a self aligning manner.

Subsequently, new resist masks are formed. In order to lower the OFF current value of the TFT 70, the masks are formed to cover a channel formation region 60a or the portion of the semiconductor layer for forming the switching TFT of the pixel portion. The masks are formed to protect the channel formation region or the portion of the semiconductor layer for forming the p-channel TFT (not shown) of the driving circuit. In addition, masks are formed to cover the channel formation region 62a of the semiconductor layer for forming the current control TFT of the pixel portion or the periphery portion thereof.

Next, an impurity region (n⁻ region) overlapping with a part of the gate electrode of the n-channel TFT (not shown) of the driving circuit by performing selectively the second doping treatment using resist masks. The second doping processing may be performed by the ion-doping method or the ion-implanting method. In this example, the ion doping method is performed under a condition in a gas flow rate of phosphine ($PH_3$) diluted to 5% with hydrogen of 30 sccm, and the dose of $1.5 \times 10^{13}$ atoms/cm² and the accelerating voltage of 90 kV. The resist mask and the second conductive film function as mask for the n-type doping impurity element, and the second impurity regions are formed. An n-type doping impurity element in the density range of $1 \times 10^{16}$ to $1 \times 10^{17}$ atoms/cm³ are added to the impurity regions.

A third doping processing is performed without removing the masks made of resist. The third doping processing may be performed by the ion-doping method or the ion-implanting method. As the n-type doping impurity element may be typically used phosphorus (P) or arsenic (As). In this example, the ion doping method is performed under a condition in a gas flow rate of phosphine ($PH_3$) diluted to 5% with hydrogen of 40 sccm, the dose of $2 \times 10^{13}$ atoms/cm², and the accelerating voltage of 80 kV. In this case, the resist mask, the first conductive layer, and the second conductive layer function as masks for the n-type doping impurity element and the impurity region 60b is formed. An n-type doping impurity element in the density range of $1 \times 10^{20}$ to $1 \times 10^{21}$ atoms/cm³ are added to the impurity region 60b.

As described above, in the manufacturing, processes shown in FIG. 1B, although the p-channel TFT was also added with high-level n-type impurity elements, but by selectively performing doping with one more mask has been increased, the manufacturing processes in FIG. 5A can be performed without being added with the same.

After the resist mask is removed, the mask made from resist is formed to perform the fourth doping treatment. By the fourth doping treatment, the fourth impurity regions 62c, 62d and the impurity region 62b are formed that is the semiconductor layer forming the semiconductor layer forming the p-channel type TFT in which p-type doping impurity element is added.

A p-type doping impurity element in the density range of $1 \times 10^{20}$ to $1 \times 10^{21}$ atoms/cm³ are added to the fourth impurity region 62b. Note that, in the impurity regions 62b, 62c, phosphorous (P) has been added in the preceding step (n⁻⁻ region), but the p-type doping impurity element is added at a density that is over 10 times as high as that of phosphorous. Thus, the impurity regions 62b, 62c have the p-type conductivity.

The impurity regions 62c, 62d are formed to overlap with the taper portion of the second conductive layer, and added with the p-type impurity element in the density range of $1 \times 10^{18}$ to $1 \times 10^{20}$ atoms/cm³.

Though the above-described steps, the impurity regions with n-type conductivity 60 to 60c and impurity regions with p-type conductivity are formed in the respective semiconductor layers.

The subsequent manufacturing steps are same as ones shown in FIG. 1B and FIG. 2, the description thereof is thus omitted here.

Furthermore, the gate electrode may be provided as a single layer, or may have a TFT structure with which further miniaturization for the gate electrode is easy to realize such as one shown in FIG. 5B. In the case of obtaining the structure shown in FIG. 5B, each of low-level impurity regions 12c, 13c, 14c is appropriately formed by doping with impurity element which provides n-type or p-type conductivity using a mask made of resist before the formation of the gate electrode, gate electrodes 516 to 518, and an electrode 519 are formed, followed by forming high-level impurity regions 13b, 14b, 12b by self-aligning or doping using a mask made of resist. In FIG. 5B, the same structural components as those of FIG. 1B are represented by the same reference numerals.

Further, as shown in FIG. 3, an interlayer insulation film 222 made of an organic resin may be formed after forming an interlayer insulation film 221 made of an inorganic insulation film on an interlayer insulation film 20. In the configuration shown in FIG. 3, contact holes are formed by mere one mask, and thereby the total number of masks is reduced. Here, the interlayer insulation film 20 is prepared as an silicon oxynitride film having a film thickness of 50 nm by a plasma CVD method, followed by laminating an interlayer insulation film 221 made of a silicon nitride film of 20 to 50 nm in thickness by a sputtering method using a RF power supply. After that, the step of hydrogenating a semiconductor layer is performed by a heat treatment at a temperature of 300 to 550° C. for 1 to 12 hours. Subsequently, a contact hole extending to each of impurity regions is formed by removing the gate insulting film 15, the interlayer insulation films 20, 221, followed by forming an interlayer insulation film 222 made of a photosensitive organic insulating material. A positive type photosensitive acrylic resin film may be formed by a coating method and may be provided as an interlayer insulation film 221 having a curved surface on its upper end portion.

Furthermore, the sequence of forming these interlayer insulation films 20, 221, 222 and the contact hole, and the hydrogenation are not particularly limited. Alternatively, for example, the hydrogenation may be performed after forming the interlayer insulation film 20, followed by forming the interlayer insulation film 221. Here, in FIG. 3, the same structural components as those of FIG. 1B are represented by the same reference numerals.

In addition, the present example may be optionally combined with Embodiment without limitation.

EXAMPLE 2

In Example 1, there was described an example in which the interlayer insulation film having the curved surface on its upper end portion and the insulating material were formed. In this example, another example which is different from Example 1 is shown in FIGS. 4A and 4B. In FIG. 4A and FIG. 4B, the same structural components as those of FIG. 1B are represented by the same reference numerals.

In the present example, there is shown an example in which, after the formation of an interlayer insulation film; a contact hole is formed by etching using the same mask.

At first, according to Example 1, the process proceeds up to the formation of an interlayer insulation film 20, followed by hydrogenation. After that, as shown in FIG. 4A, an interlayer insulation film 321 is formed using an organic material such as polyimide, acrylate, polyamide, polyimide amide, resist, or benzocyclobutene or an inorganic material such as silicon oxide, silicon nitride, or silicon oxynitride by a coating method. Furthermore, an interlayer insulation film 322 made of an inorganic material is formed using a sputtering method. Here, a non-photosensitive acryl resin is used as a material of the interlayer insulation film 321 and a silicon nitride film is used as a material of the interlayer insulation film 322. Then, forming a mask made of resist, dry etching is performed at a time or in stages to form a contact hole extending to each impurity region. Subsequently, wiring or electrodes 323 to 327 are formed. Furthermore, as in the case of Example 1, a first electrode 28a is formed such that a part thereof is piled up and brought into contact with an electrode 324. Then, an insulating material 330 is formed such that it covers the end portion of the first electrode 28a. Here, a non-photosensitive acryl resin is used as an insulating material 330. In the subsequent steps, an EL layer 31, a second electrode 32, and so on are formed according to Example 1, resulting in a light emitting device having the cross sectional structure shown in FIG. 4A.

Furthermore, the present example can be combined with Example 1. In this example, the non-photosensitive organic resin material is used as each of the interlayer insulation film 321 and the insulating material 330. However, two or more combinations can be considered. For instance, the interlayer insulation film 321 may be formed using a non-photosensitive organic resin material, while the insulating material 330 may be provided as a structure using a photosensitive organic resin material.

Furthermore, as shown in FIG. 4B, an interlayer insulation film 421 made of an inorganic material is formed on the interlayer insulation film 20 to form a contact hole extending to each impurity region. After that, an interlayer insulation film 422 is formed using an organic material such as polyimide, acrylate, polyamide, polyimide amide, resist, or benzocyclobutene or an inorganic material such as silicon oxide, silicon nitride, or silicon oxynitride by a coating method. Then, etching may be performed to form a contact hole. Furthermore, after laminating the interlayer insulation film, etching may be performed only on the interlayer insulation film 422 made of the resin, followed by the formation of a contact hole by etching the interlayer insulation films 421, 20 made of inorganic materials and the gate insulation film 15 using a mask made of resist.

Next, wiring or each of electrodes 423 to 427 extending to each impurity region may be formed. In the subsequent steps, an EL layer 31, a second electrode 32, and soon are formed according to Example 1, resulting in a light emitting-device having the cross sectional structure shown in FIG. 4B.

EXAMPLE 3

In this example, as shown in FIG. 6A, the sequence of forming the first electrode, the contact hole, and the connecting electrode is different from that of Example 1. The structure shown in FIG. 6A is provided for illustrating the process by which a CMP processing for flattening the first electrode can be easily performed. However, at the time of patterning for forming a connecting electrode in contact with the first electrode, etching or washing may be preferably performed such that the remainder of etching is prevented from being remained on the first electrode. For simplification, only a point different from Example 1 will be described. Here, in FIG. 6A, the same structural components as those of FIG. 1B are represented by the same reference numerals.

At first, according to Example 1, a contact hole is formed in each of interlayer insulation films 20, 21, 22, followed by forming a first electrode 628a. Then, a connecting electrode 624 and wiring 23 to 27 are formed such that they are piled up in contact with the first electrode 628a. Subsequently, an insulating material 30 that covers the end portion of the first electrode 628a is formed. The subsequent steps are performed according to Example 1, resulting in the state shown in FIG. 6A. Here, in the terminal portion, an electrode 628b simultaneously formed together with a first electrode 628a is formed on electrodes 19a, 19b simultaneously formed together with the gate electrode. In addition, FPC 6 is stuck thereon.

In addition, for flattening the surface of the first electrode 628a, any flattening processing such as CMP may be performed after the formation of the first electrode 682a or after the formation of the insulting material 30. In the case of performing the CMP processing after the formation of the insulating material 30, it is preferable to form an interlayer insulation film 22 to increase the adhesiveness between the insulating material 30 and the interlayer insulation film 21.

Figure 6B:
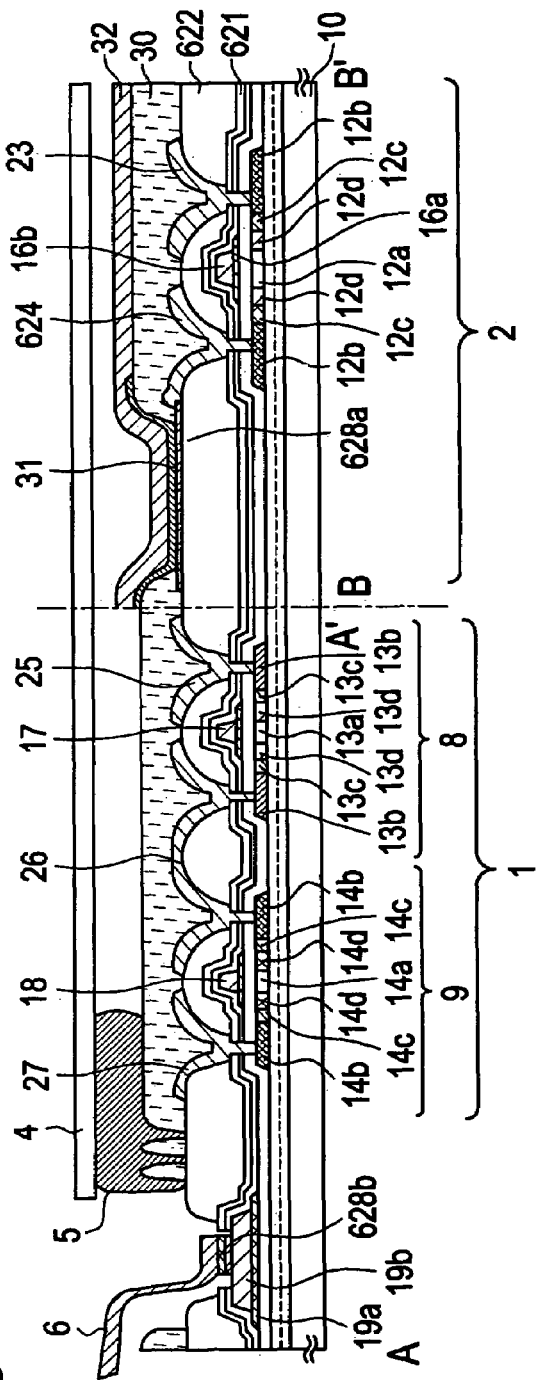

Furthermore, FIG. 6B shows another example in which the configuration of the interlayer insulation film is different from that of FIG. 6A. As shown in FIG. 6B, an interlayer insulation film 622 made of an organic resin may be formed after forming an interlayer insulation film 621 made of an inorganic insulation film on an interlayer insulation film 20. Here, the interlayer insulation film 20 is prepared as an silicon oxynitride film having a film thickness of 50 nm by a plasma CVD method, followed by laminating an interlayer insulation film 621 made of a silicon nitride film of 20 to 50 nm in thickness by a sputtering method using a RF power supply. After that, the step of hydrogenating a semiconductor layer is performed by a heat treatment at a temperature of 300 to 550° C. for 1 to 12 hours. Subsequently, a contact hole extending to each of impurity regions is formed by removing the gate insulting film 15, the interlayer insulation films 20, 621, followed by forming an interlayer insulation film 622 made of a photosensitive organic insulating material. A positive type photosensitive acryl resin film may be formed by a coating method and may be provided as an interlayer insulation film 621 having a curved surface on its upper end portion.

Furthermore, the sequence of forming these interlayer insulation films 20, 621, 622 and the contact hole, and the hydrogenation are not particularly limited. Alternatively, for example, the hydrogenation may be performed after forming the interlayer insulation film 20, followed by forming the interlayer insulation film 621. Here, in FIG. 6B, the same structural components as those of FIG. 1B are represented by the same reference numerals.

Furthermore, after the formation of the interlayer insulation film, a contact hole may be formed by etching using the same mask.

Figure 7A:
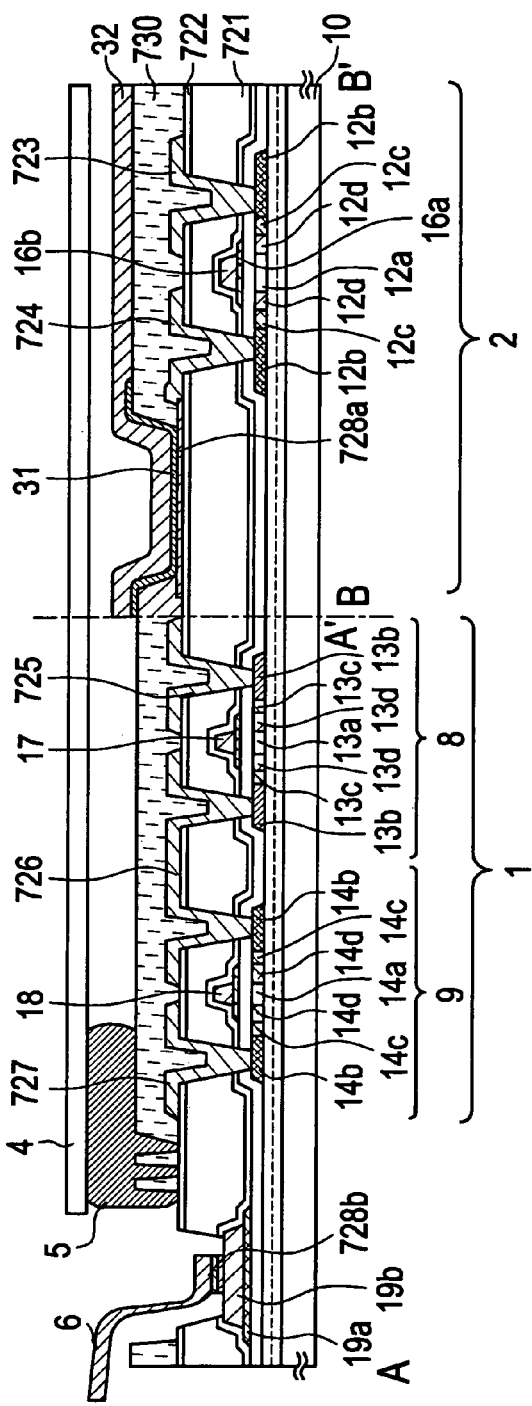
FIGS. 7A and 7B are cross sectional views for illustrating Example 3.

At first, according to Example 1, the process proceeds up to the formation of an interlayer insulation film 20, followed by hydrogenation. After that, as shown in FIG. 7A, an interlayer insulation film 721 is formed using an organic material such as polyimide, acrylate, polyamide, polyimide amide, resist, or benzocyclobutene or an inorganic material such as silicon oxide, silicon nitride, or silicon oxynitride by a coating method. Furthermore, an interlayer insulation film 722 made of an inorganic material is formed using a sputtering method. Here, a non-photosensitive acryl resin is used as a material of the interlayer insulation film 721 and a silicon nitride film is used as a material of the interlayer insulation film 722. Then, forming a mask made of resist, dry etching is performed at a time or in stages to form a contact hole extending to each impurity region. Subsequently, wiring or electrodes 723 to 727 are formed. A first electrode 728a is formed such that a part thereof is overlapped and brought into contact with an electrode 724. Then, an insulating material 730 is formed such that it covers the end portion of the first electrode 728a. Here, a non-photosensitive acryl resin is used as an insulating material 730. In the subsequent steps, an EL layer 31, a second electrode 32, and so on are formed according to Example 1, resulting in a light emitting device having the cross sectional structure shown in FIG. 7A.

Furthermore, the present example can be combined with Example 1. In this example, the non-photosensitive organic resin material is used as each of the interlayer insulation film 721 and the insulating material 730. However, two or more combinations can be considered. For instance, the interlayer insulation film 721 may be formed using a non-photosensitive organic resin material, while the insulating material 730 may be provided as a structure using a photosensitive organic resin material.

Figure 7B:
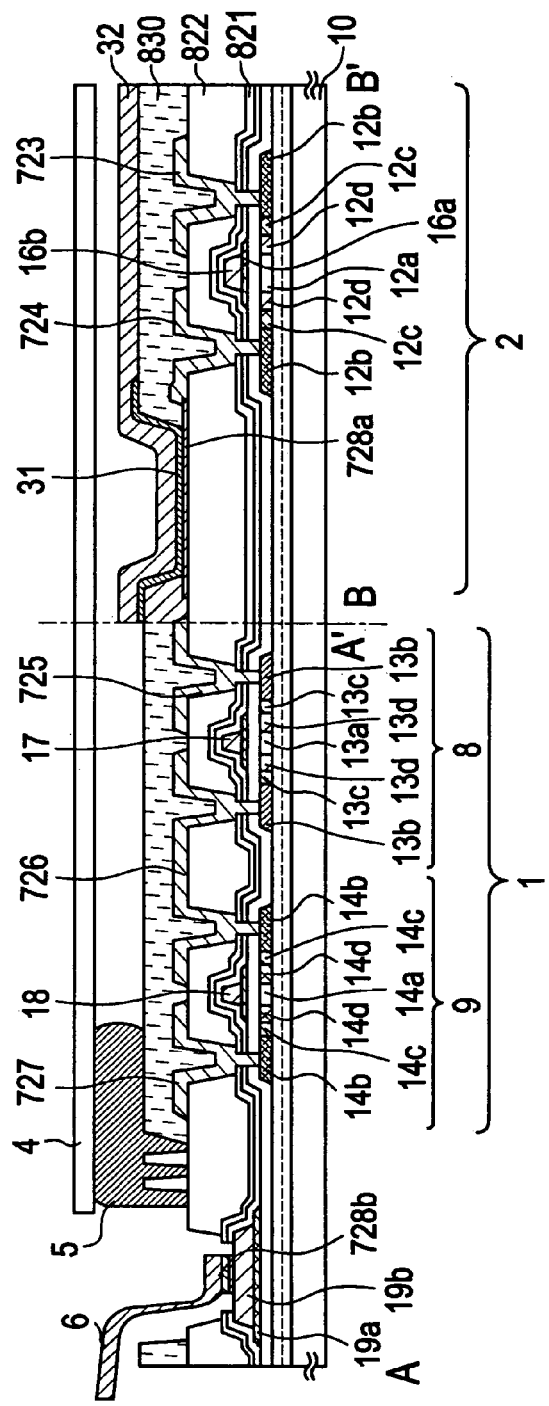

Furthermore, as shown in FIG. 7B, an interlayer insulation film 821 made of an inorganic material is formed on the interlayer insulation film 20 to form a contact hole extending to each impurity region. After that, an interlayer insulation film 822 is formed using an organic material such as polyimide, acrylate, polyamide, polyimide amide, resist, or benzocyclobutene or an inorganic material such as silicon oxide, silicon nitride, or silicon oxynitride by a coating method. Then, etching may be performed to form a contact hole. Furthermore, after laminating the interlayer insulation film, etching may be performed only on the interlayer insulation film 822 made of the resin, followed by the formation of a contact hole by etching the interlayer insulation films 821, 20 made of inorganic materials and the gate insulation film 15 using a mask made of resist.

Next, wiring or each of electrodes 723 to 727 extending to each impurity region may be formed. In the subsequent steps, an EL layer 31, a second electrode 32, and so on are formed according to Example 1, resulting in a light emitting device having the cross sectional structure shown in FIG. 7B.

As shown in FIG. 8A, furthermore, a transparent conductive film 929a having a large work function may be formed after forming a first electrode 928, a connecting electrode 624, and an insulating material 30. It is preferable that the first electrode 928 which is connected with the current-controlling TFT is formed of a metallic film (a metallic material mainly comprising Ag or Al) having excellent reflecting properties. The first electrode 928 reflects light emitted from a layer (not shown) containing an organic compound. By the way, for simplification, the EL layer and the second electrode are not shown in FIG. 8A.

Furthermore, an electrode to be formed after the formation of an insulating material 30 may be provided as a layered structure. In FIG. 8B, there is shown an example in which a metallic film (a metallic material mainly comprising Ag or Al) 929c having reflecting properties and a conductive film 929a are laminated. The structure shown in FIG. 8B has a metallic film along the side surface of the insulating material 30, so that light emitted in the direction parallel to the surface of the substrate can be reflected on the slant face of the metallic film 929c.

Furthermore, the TFT structure shown in FIG. 5A or FIG. 5B may be used instead of the TFT structure shown in each of FIG. 6A, FIG. 6B, FIG. 7A, FIG. 7B, FIG. 8A, and FIG. 8B.

EXAMPLE 4

FIGS. 9A and 9B shows another example in which the configuration is different from that of the above-described examples.

All the light generated on a layer containing an organic compound is not taken out from an cathode which is a transparent electrode to TFTs, but light is emitted, for example, laterally (direction in parallel to the substrate surface), and as a result, the light emitted laterally is not taken out and so constitutes a loss. Hereupon, this example shows a light emitting device structured to increase a quantity of light taken out in a certain direction in a light emitting element, and a method of manufacturing the same.

This example comprises forming a first electrode, which is made of a laminate of metallic layers, forming an insulation (called bank, partition) covering an end of the first electrode, thereafter performing etching of a portion of the insulation in self-alignment with the insulation as a mask and performing etching of a central portion of the first electrode to thin the area and to form a stepped portion on the end. Such etching thins the central portion of the first electrode into a flat surface, and that end of the first electrode, which is covered by the insulation, is made thick in shape, that is, concave-shaped (depression). And a layer containing an organic compound and a second electrode are formed on the first electrode to complete a light emitting element.

According to the configuration of this example, an inclined surface formed on a stepped portion of the first electrode reflects or collects lateral emission to increase a quantity of light taken out in a certain direction (direction passing through the second electrode).

Accordingly, a portion defining the inclined surface is preferably made of a light reflective metal, for example, a material having as a main component aluminum, silver, or the like, and the central portion in contact with the layer containing an organic compound is preferably made of an anode material having a large work function, or a cathode material having a small work function.

Figure 12A:
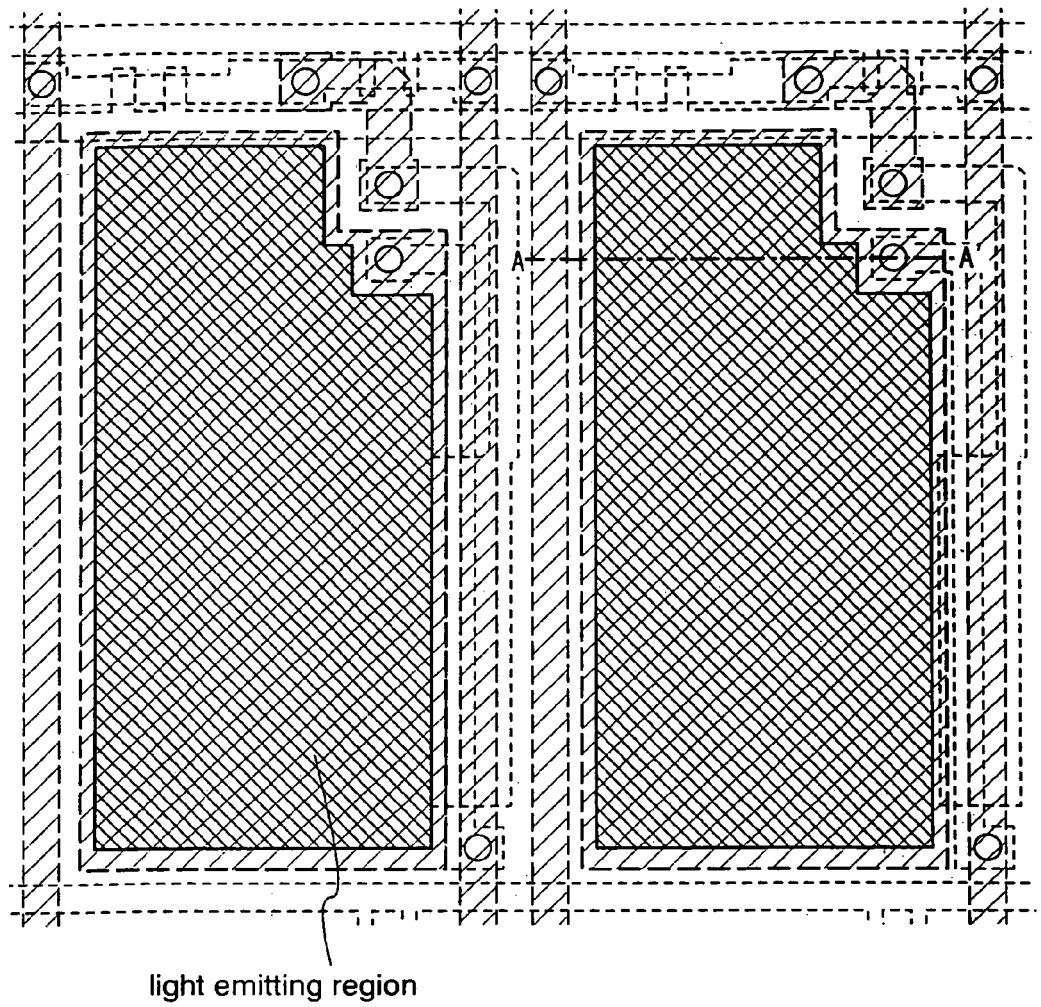
FIG. 12A is a top view of part of the pixel (Example 4)
Figure 12B:
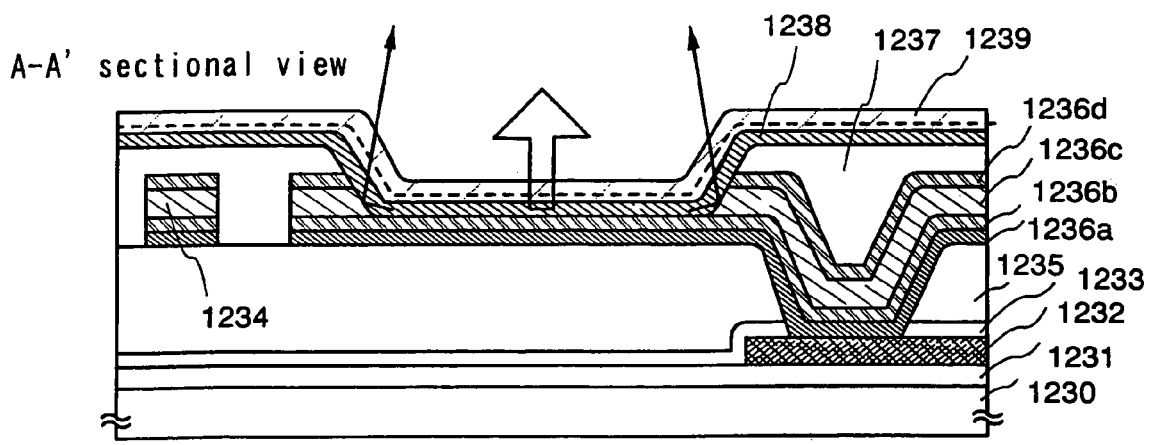
FIG. 12B is a cross sectional view of FIG. 12A.

FIGS. 12A and 12B show an active matrix type light emitting device (a portion of a pixel). FIG. 12B is a sectional view taken along the dot-dash line A-A' in FIG. 12A.

First a base insulating film 1231 is formed on an insulating substrate 1230 having an insulating surface. The base insulating film 1231 is a laminate and the first layer is a silicon oxynitride film formed to have a thickness of 10 to 200 nm (preferably 50 to 100 nm) by plasma CVD using as reaction gas $SiH_4$, $NH_3$, and $N_2O$. Here, a silicon oxynitride film (composition ratio: Si=32%, O=27%, N=24%, H=17%) with a thickness of 50 nm is formed. The second layer of the base insulating film 1231 is a silicon oxynitride film formed to have a thickness of 50 to 200 nm (preferably 100 to 150 nm) by plasma CVD using as reaction gas $SiH_4$ and $N_2O$. Here, a silicon oxynitride film (composition ratio: Si=32%, O=59%, N=7%, H=2%) with a thickness of 100 nm is formed. Although the base insulating film 1231 in this example has a two-layer structure, a single layer or a laminate of more than two layers of the above insulating films may be employed instead.

Next, a semiconductor layer is formed on the base film. The semiconductor layer to serve as an active layer of the TFT is obtained by forming a semiconductor film that has an amorphous structure through a known method (sputtering, LPCVD, plasma CVD, or the like), subjecting the film to known crystallization treatment (laser crystallization, thermal crystallization, thermal crystallization using nickel or other catalysts, or the like), and then patterning the obtained crystalline semiconductor film into a desired shape. The thickness of the semiconductor layer is set to 25 to 80 nm (preferably 30 to 60 nm). The material of the crystalline semiconductor film is not limited but preferably is silicon, a silicon germanium alloy, or the like.

When laser crystallization is employed to form the crystalline semiconductor film, a pulse oscillation type or continuous wave excimer layer, YAG layer, or $YVO_4$ laser is used. Laser light emitted from one of such laser oscillators is collected by an optical system into a linear shape before irradiating the semiconductor film. Crystallization conditions are chosen to suit individual cases. However, when an excimer layer is employed, the pulse oscillation frequency is set to 30 Hz and the laser energy density is set to 100 to 400 mJ/cm$^2$ (typically 200 to 300 mJ/cm$^2$). When a YAG laser is employed, the second harmonic thereof is used, the pulse oscillation frequency is set to 1 to 10 kHz, and the laser energy density is set to 300 to 600 mJ/cm$^2$ (typically 350 to 500 mJ/cm$^2$). The laser light is collected to have a width of 100 to 1000 µm, for example, 400 µm, into a linear shape and the entire surface of the substrate is irradiated with this linear laser light setting the laser light overlap ratio to 80 to 98%.

Next, the surface of the semiconductor layer is washed with an etchant containing hydrofluoric acid to form a gate insulating film 1233 that covers the semiconductor layer. The gate insulating film 1233 is an insulating film containing silicon and is formed by plasma CVD or sputtering to have a thickness of 40 to 150 nm. In this example, a silicon oxynitride film (composition ratio: Si=32%, O=59%, N=7%, H=2%) is formed by plasma CVD to have a thickness of 115 nm. The gate insulating film is not limited to the silicon oxynitride film of course, but may be a single layer or laminate of other insulating films that contain silicon.

The surface of the gate insulating film 1233 is washed and then a gate electrode is formed.

Next, the semiconductor layer is appropriately doped with an impurity element that imparts a semiconductor the p type conductivity, here, boron (B), to form a source region 1232 and a drain region 1232. After the doping, the semiconductor layer is subjected to heat treatment, irradiation of intense light, or laser light irradiation in order to activate the impurity element. At the same time the impurity element is activated, plasma damage to the gate insulating film and plasma damage to the interface between the gate insulating film and the semiconductor layer are repaired. It is particularly effective to activate the impurity element by irradiating the substrate from the front or back with the second harmonic of a YAG laser at room temperature to 300° C. A YAG laser is a preferable activation measure because it requires little maintenance.

The subsequent steps include, forming an interlayer insulating film 1235 from an organic or inorganic material (an applied silicon oxide film, PSG (phosphorus-doped glass), BPSG (glass doped with boron and phosphorus), or the like), hydrogenating the semiconductor layer, and forming contact holes reaching the source region or drain region. Then, a source electrode (wire) and a first electrode (drain electrode 1236 are formed to complete the TFT (p-channel TFT).

Although the description in this example uses a p-channel TFT, an n-channel TFT can be formed if an n type impurity element (such as P or As) is used instead of a p type impurity element.

Figure 13A:
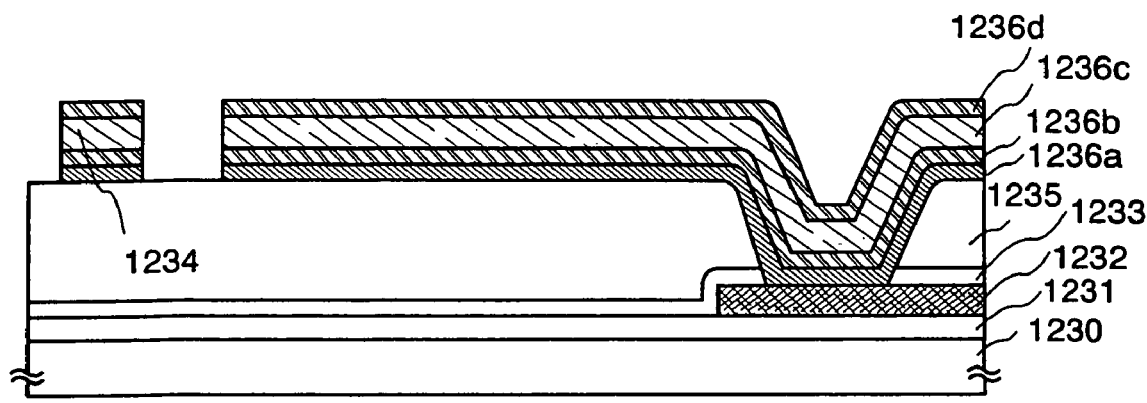
FIGS. 13A to 13C are cross sectional views for illustrating the manufacturing process (Example 4)

Formed through the above steps are the TFT (only the drain region 1232 is shown in the drawing), the gate insulating film 1233, the interlayer insulating film 1235, and layers 1236a to 1236d of the first electrode (FIG. 13A).

The layers 1236a to 1236d of the first electrode in this example are each a film mainly containing an element selected from the group consisting of Ti, TiN, TiSi$_x$N$_y$, Al, Ag, Ni, W, WSi$_x$, WN$_x$, WSi$_x$N$_y$, Ta, TaN$_x$, TaSi$_x$N$_y$, NbN, MoN, Cr, Pt, Zn, Sn, In, and Mo, or a film mainly containing an alloy or compound material of the above elements, or a laminate of these films. The total thickness of the layers 1236a to 1236d is set between 100 nm and 800 nm.

Particularly, the layer 1236a of the first electrode that comes into contact with the drain region 1232 is preferably formed of a material that can form an ohmic contact with silicon, typically titanium, and is given a thickness of 10 to 100 nm. For the layer 1236*b* of the first electrode, a material that has a large work function when formed into a thin film (TiN, TaN, MoN, Pt, Cr, W, Ni, Zn, Sn) is preferred, and the thickness of the layer is set to 10 to 100 nm. For the layer 1236*c* of the first electrode, a metal material reflective of light, typically, a metal material mainly containing Al or Ag, is preferred, and the thickness of the layer is set to 100 to 600 nm. The layer 1236*b* of the first electrode also functions as a blocking layer for preventing the layers 1236*c* and 1236*a* of the first electrode from forming an alloy. For the layer 1236*d* of the first electrode, a material capable of preventing oxidation and corrosion of the layer 1236*c* of the first electrode and avoiding hillock or the like is preferred (typically a metal nitride such as TiN or WN), and the thickness of the layer is set to 20 to 100 nm.

The layers 1236*a* to 1236*d* of the first electrode can be formed at the same time other wires, for example, a source wire 1234 and a power supplying line, are formed. Accordingly, the process needs fewer photomasks (seven masks in total: a patterning mask for the semiconductor layer (Mask 1), a patterning mask for the gate wire (Mask 2), a doping mask for selective doping by an n type impurity element (Mask 3), a doping mask for selective doping by a p type impurity element (Mask 4), a mask for forming contact holes that reach the semiconductor layer (Mask 5), a patterning mask for the first electrode, the source wire, and the power supplying line (Mask 6), and a mask for forming an insulating material (Mask 7)). In prior art, the first electrode is formed on a layer different from the one where the source wire and the power supplying line are formed and therefore a mask for forming the first electrode alone is needed, thus making the number of masks required 8 in total. When the layers 1236*a* to 1236*d* of the first electrode and the wires are formed at the same time, it is desirable to set the total wire electric resistance low.

Figure 13B:
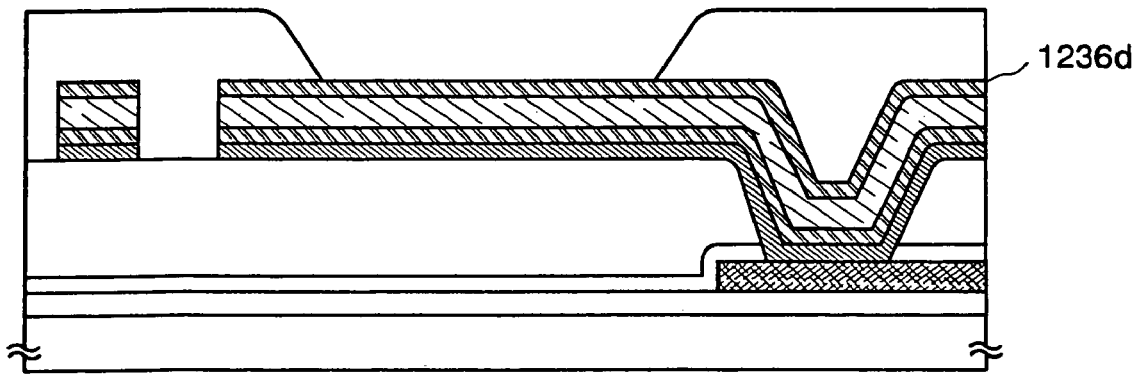

Next, the insulating material (called as a bank, a partition wall, a barrier, or the like) is formed to cover the edge of the first electrode (and a portion that is in contact with the drain region 1232) (FIG. 13B). The insulating material is a film or a laminate of inorganic materials (such as silicon oxide, silicon nitride, and silicon oxynitride) and photosensitive or non-photosensitive organic materials (such as polyimide, acrylic, polyamide, polyimideamide, resist, and benzocyclobutene). Photosensitive organic resin is used in this example. If positive photosensitive acrylic is used as a material of the insulating material, for example, it is preferable to curve only an upper edge portion of the insulating material to give a radius of curvature. A negative photosensitive material which becomes insoluble in an etchant under light and a positive photosensitive material which becomes soluble in an etchant under light both can be used for the insulating material.

Figure 13C:
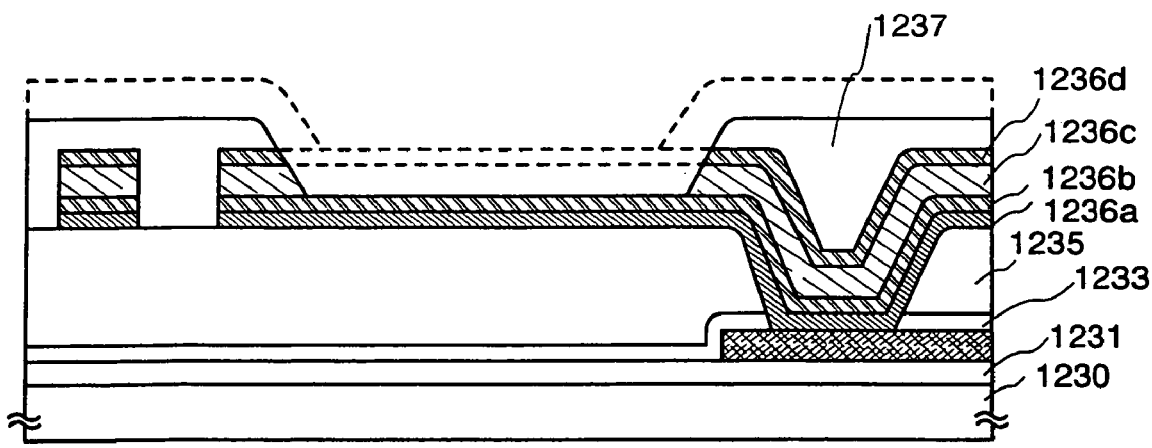

The insulating material is etched as shown in FIG. 13C and, simultaneously, the layers 1236*c* and 1236*d* of the first electrode are partially removed. It is important to etch the films such that a slope is formed in the exposed face of the layer 1236*c* of the first electrode and the layer 1236*b* of the first electrode obtains a flat exposed face. This etching uses dry etching or wet etching, and is finished in one step or divided into several steps. Etching conditions that make the selective ratio between the layer 36*b* of the first electrode and the layer 36*c* of the first electrode high are chosen. For example, etching conditions include employing ICP etching apparatus, using as reaction gas $BCl_3$ and $Cl_2$ at a ratio of 60 (sccm):20 (sccm), and giving an RF (13.56 MHz) power of 450 W to a coiled electrode at a pressure of 1.9 Pa. At the same time, the substrate side (sample stage) is also given an RF (13.56 MHz) power of 100 W, a shape shown in FIG. 13C can be obtained.

Figure 19:
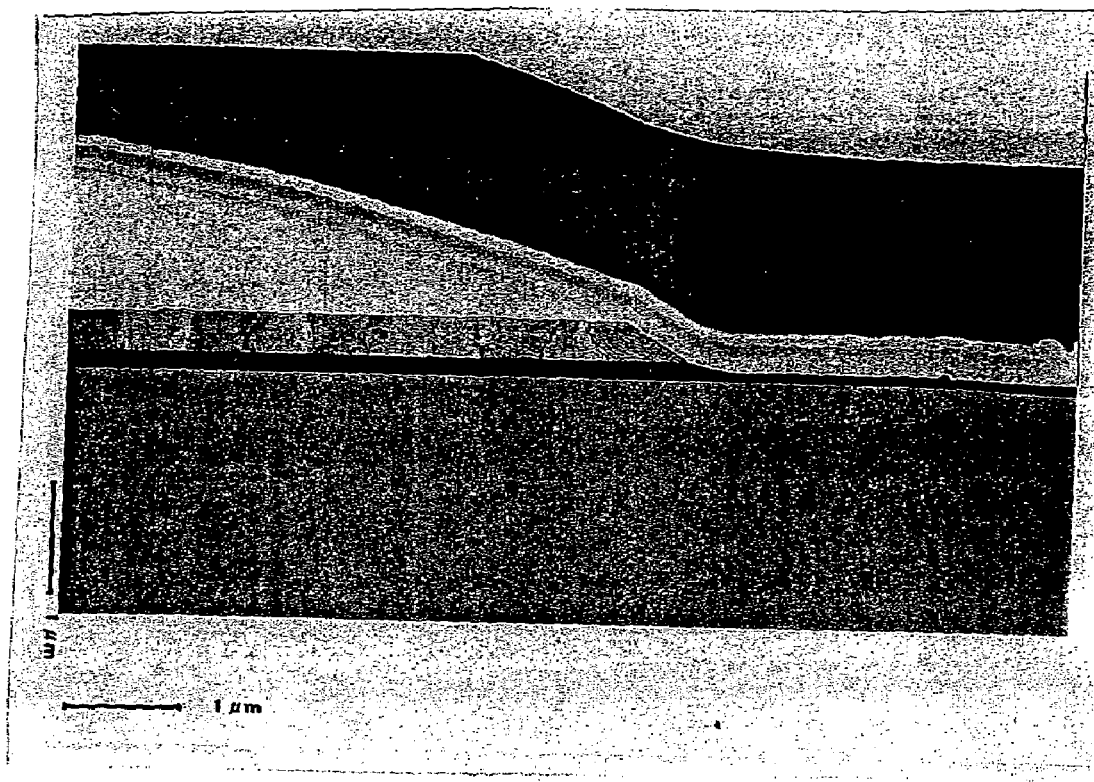
FIG. 19 is a photograph of TEM observation (Example 4)

Note that, size of the electrode area on the substrate side is 12.5 cm×12.5 cm, and coil-shape electrode (a quartz disc comprising a coil is used here) has 25 cm in diameter. Actually obtained photograph of TEM observation of the first electrode is shown in FIG. 19. Preferably, the final radius of curvature of the upper edge portion of the insulating material is 0.2 to 3 μm. The final angle of the slope descending toward the center of the first electrode (the angle of inclination or taper angle) is more than 30° and less than 70°, so that, the slope reflects light emitted from a layer containing an organic compound which is formed later. It is preferred that using UV light to irradiate an exposed surface of the first electrode 1236*b* to increase the work function of the first electrode 1236*b*. The work function can be increased to around 5 eV by irradiating the UV light on TiN thin film.

Next, a layer containing an organic compound 1238 is formed by evaporation or application as shown in FIG. 12B. Note that it is preferable to perform deaeration by the application of heat in a vacuum before the formation of the layer containing the organic compound 1238. When evaporation is chosen, for example, a film forming chamber is vacuum-exhausted until the degree of vacuum reaches $5 \times 10^{-3}$ Torr (0.665 Pa) or less, preferably $10^{-4}$ to $10^{-6}$ Pa, for evaporation. Prior to evaporation, the organic compound is vaporized by resistance heating. The vaporized organic compound flies out to the substrate as the shutter is opened for evaporation. The vaporized organic compound flies upward and then deposits on the substrate through an opening formed in a metal mask. The layer containing the organic compound is formed by evaporation so that the light emitting element as a whole emits white light.

For instance, an $Alq_3$ film, an $Alq_3$ film partially doped with Nile red which is a red light emitting pigment, an $Alq_3$ film, a p-EtTAZ film, and a TPD (aromatic diamine) film are layered in this order to obtain white light.

On the other hand, when the layer containing the organic compound is formed by application using spin coating, the layer after application is preferably baked by vacuum heating. For example, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer.

Although the organic compound layer is a laminate in the above example, a single-layer film may be used as the organic compound layer. For instance, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the organic compound layer may be a laminate of layers of polymeric material and layers of monomeric materials.

The next step is to form a thin film containing a metal of small function (a film of an alloy such as MgAg, MgIn, AlLi, $CaF_2$, or CaN, or a film formed by co-evaporation of an element belonging to Group 1 or 2 in the periodic table and aluminum) and to form a thin conductive film (an aluminum film here) 1239 thereon by evaporation (FIG. 12B). An aluminum film is highly capable of blocking moisture and oxygen and therefore is a preferable material of the conductive film 1239 for improvement of the reliability of the light emitting device. This laminate is thin enough to let emitted light pass and functions as the cathode in this example. The thin conductive film may be replaced by a transparent conductive film (such as an ITO (indium oxide-tin oxide alloy) film, an $In_2O_3$—ZnO (indium oxide-zing oxide alloy) film, or a ZnO (zinc oxide) film). On the conductive film 1239, an auxiliary electrode may be formed in order to lower the resistance of, the cathode. The cathode is formed selectively by resistance heating through evaporation using an evaporation mask.

The thus obtained light emitting element emits white light in the direction indicated by the arrow in FIG. 12B. Light emitted in the lateral direction is reflected by the slope in the layer 1236c of the first electrode, thereby increasing the amount of light emitted in the arrow direction.

After the manufacturing process is thus finished up through formation of the second electrode (conductive film 1239), the light emitting element formed on the substrate 1230 is sealed by bonding a sealing substrate (transparent substrate) using a seal agent. Spacers formed from a resin film may be provided in order to keep the gap between the sealing substrate and the light emitting element. The space surrounded by the seal agent is filled with nitrogen or other inert gas. For the seal agent, an epoxy-based resin is preferred. Desirably, the material of the seal agent transmits as little moisture and oxygen as possible. A substance having an effect of absorbing oxygen and moisture (e.g., drying agent) may be placed in the space surrounded by the seal agent.

By enclosing the light emitting element in a space as above, the light emitting element can be completely cut off from the outside and external substances that accelerate degradation of the organic compound layer, such as moisture and oxygen, can be prevented from entering the light emitting element. Accordingly, a highly reliable light emitting device is obtained.

Here an example of a cross sectional view of the light emitting device is shown in FIG. 9A. The configuration shown in FIG. 9A can be obtained in accordance with the above-described steps and Example 1. For simplification, Here, the same structural components as those of FIG. 1B are represented by the same reference numerals. An electrode corresponding to 1236a and 1236b in FIG. 12B is referred to as a numeral 1024a in FIG. 9A, and an electrode corresponding to 1236c is referred to as a numeral 1024b in FIG. 9A. The steps up through the formation of the contact hole on the interlayer insulating films 20, 21, and 22 can be obtained according to Example 1, the subsequent steps can be obtained according to the above-described steps in the sequence of forming lines 1023 to 1027, forming an insulating material, performing isotropic etching to form an inclined plane of the electrode 1024b and an inclined plane of the insulating material 1030 in a self-aligning manner, forming an EL 1031 and a second electrode 1032. In addition, an electrode corresponding to a conductive film 1239 in FIG. 12B is referred to as a numeral 1032 in FIG. 9A.

As shown in FIG. 9B, an interlayer insulation film 222 made of an organic resin may be formed after forming an interlayer insulation film 221 made of an inorganic insulation film on an interlayer insulation film 20. Here, the interlayer insulation film 20 is prepared as an silicon oxynitride film having a film thickness of 50 nm by a plasma CVD method, followed by laminating an interlayer insulation film 221 made of a silicon nitride film of 20 to 50 nm in thickness by a sputtering method using a RF power supply. After that, the step of hydrogenating a semiconductor layer is performed by a heat treatment at a temperature of 300 to 550° C. for 1 to 12 hours. Subsequently, a contact hole extending to each of impurity regions is formed by removing the gate insulting film 15, the interlayer insulation films 20, 221, followed by forming an interlayer insulation film 222 made of a photosensitive organic insulating material. A positive type photosensitive acrylic resin film may be formed by a coating method and may be provided as an interlayer insulation film 222 having a curved surface on its upper end portion.

Furthermore, the sequence of forming these interlayer insulation films 20, 221, 222 and the contact hole, and the hydrogenation are not particularly limited. Alternatively, for example, the hydrogenation may be performed after forming the interlayer insulation film 20, followed by forming the interlayer insulation film 221. Here, in FIG. 9B, the same structural components as those of FIGS. 1B, 3 and 9A are represented by the same reference numerals.

In addition, the present example may be optionally combined with Embodiment or one of Examples 1 to 3 of the present invention without limitation.

EXAMPLE 5

Figure 10A:
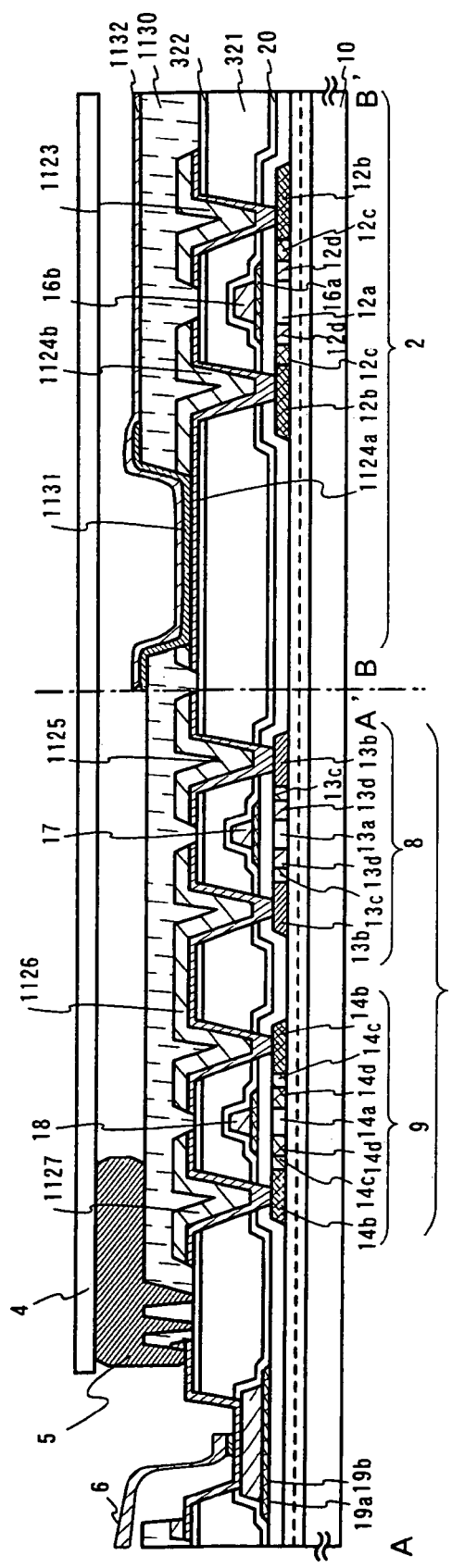
FIGS. 10A and 10B are cross sectional views for illustrating Example 5.
Figure 10B:
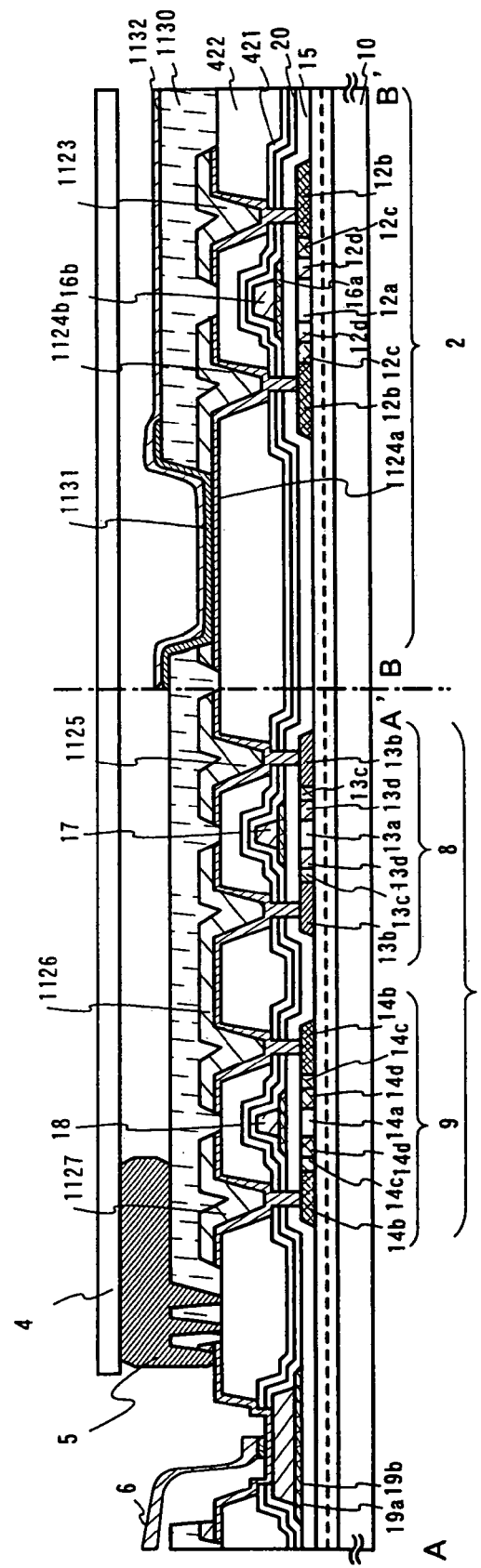

In Example 4, there was described an example in which the interlayer insulation film having the curved surface on its upper end portion and the insulating material were formed. In this example, another example which is different from Example 4 is shown in FIG. 10. In FIGS. 10A and 10B, the same structural components as those of FIG. 4B are represented by the same reference numerals.

In the present example, there is shown an example in which, after the formation of interlayer insulation films, a contact hole is formed by etching using the same mask.

At first, according to Example 1, the process proceeds up to the formation of an interlayer insulation film 20, followed by hydrogenation. After that, as shown in FIG. 1A, an interlayer insulation film 321 is formed using an organic material such as polyimide, acrylate, polyamide, polyimide amide, resist, or benzocyclobutene or an inorganic material such as silicon oxide, silicon nitride, or silicon oxynitride by a coating method. Furthermore, an interlayer insulation film 322 made of an inorganic material is formed using a sputtering method. Here, a non-photosensitive acrylic resin is used as a material of the interlayer insulation film 321 and a silicon nitride film is used as a material of the inter layer insulation film 322. Then, forming a mask made of resist, dry etching is performed at a time or in stages to form a contact hole extending to each impurity region. Subsequently, wirings or electrodes 1123 to 1127 extending to each impurity region are formed. Furthermore, as in the case of Example 4, an insulating material 1130 is formed such that it covers the end portion of a first electrode. Subsequently, the insulating material 1130 serves as a mask so as to remove a part of the electrodes to expose the first electrode 1124a thereby, and an electrode 1124b having an inclined plane is formed toward the center. Here, a non-photosensitive acrylic resin is used as an insulating material 1130. In the subsequent steps, an EL layer 1131, a second electrode 1132, and so on are formed according to Example 4, resulting in a light emitting apparatus having the cross sectional structure shown in FIG. 10A.

Furthermore, the present example can be combined with Example 4. In this example, the non-photosensitive organic resin material is used as each of the interlayer insulation film 321 and the insulating material 1130. However, two or more combinations can be considered. For instance, the interlayer insulation film 321 may be formed using a non-photosensitive organic resin material, while the insulating material 1130 may be provided as a structure using a photosensitive organic resin material.

Furthermore, as shown in FIG. 10B, an interlayer insulation film 421 made of an inorganic material is formed on the interlayer insulation film 20 to form a contact hole extending to each impurity region. After that, an interlayer insulation film 422 is formed using an organic material such as polyimide, acrylate, polyamide, polyimide amide, resist, or benzocyclobutene or an inorganic material such as silicon oxide, silicon nitride, or silicon oxynitride by a coating method. Then, etching may be performed to form a contact hole. Furthermore, after laminating the interlayer insulation film, etching may be performed only on the interlayer insulation film 422 made of the resin, followed by the formation of a contact hole by etching the interlayer insulation films 421, 20 made of inorganic materials and the gate insulation film 15 using a mask made of resist.

Next, wirings or each of electrodes 1123 to 1127 extending to each impurity region may be formed. In the subsequent steps, an EL layer 1131, a second electrode 1132, and so on are formed according to Example 4, resulting in a light emitting apparatus having the cross sectional structure shown in FIG. 10B.

Further, the present invention is not limited to the TFT structure shown in FIGS. 9A to 10B. As shown in FIG. 11A, alternatively, it may be designed such that a switching TFT 70 of the pixel part has no impurity region piled on the gate electrode.

Furthermore, in the procedures of preparing the TFT shown in FIG. 11A may be performed by making a reference to the process shown in FIG. 5A of Example 1, so that the detailed description thereof is omitted here. In addition, in FIG. 11A, the same structural components as those of FIGS. 1A, 1B, 2, 5A, and 9A are represented by the same reference numerals.

Furthermore, the gate electrode may be provided as a single layer, or may have a TFT structure such as one shown in FIG. 11B. In the case of obtaining the structure shown in FIG. 11B, each of low-level impurity regions 12c, 13c, 14c is appropriately formed by doping with impurity element which provides n-type or p-type conductivity using a mask made of resist before the formation of the gate electrodes 516 to 518, and an electrode 519 are formed, followed by forming high-level impurity regions 13b, 14b, 12b by self-aligning or doping using a mask made of resist. In FIG. 11B, the same structural components as those of FIG. 1B, FIG. 5B, and FIG. 9A are represented by the same reference numerals.

In addition, the present example may be optionally combined with Embodiment or one of Examples 1 to 4 of the present invention without limitation.

EXAMPLE 6

Figure 14:
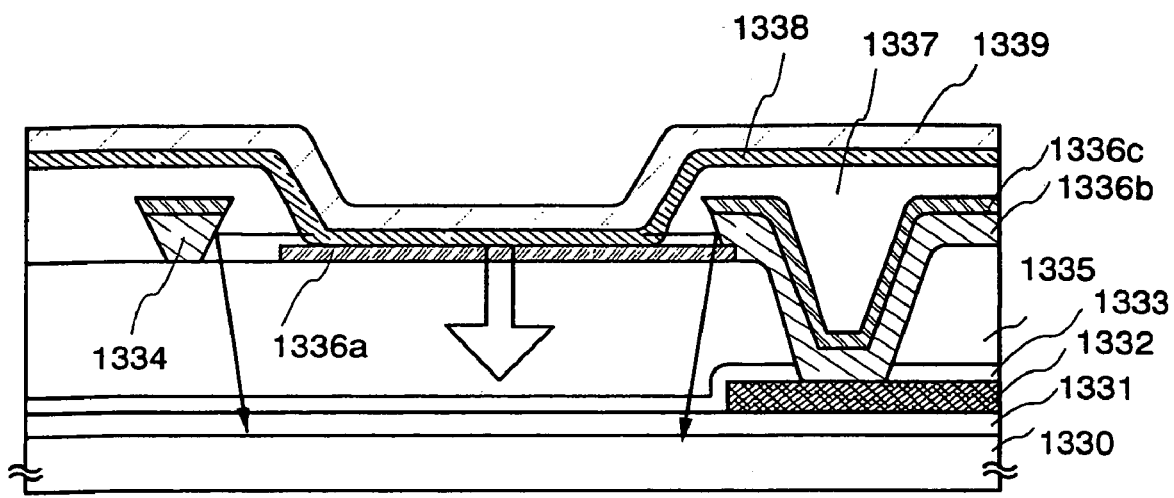
FIG. 14 is a cross sectional view for illustrating Example 6.

In this example, there is shown another example in FIG. 14, which is different from Example 5 that illustrates the upper-side radiation type.

In FIG. 14, an active matrix type light emitting device is provided as a lower-side radiation type and is designed to increase the intensity of emitted light to be taken out in a certain direction. The light emitting device and a method for manufacturing the same will be described below.

In this example, a first electrode film 1336a is formed from a transparent conductive film, or a thin metallic film having a translucency. Then, wiring 1336b, 1336c for making a connection between the first electrode 1336a and the TFT, or wiring 1334 arranged around the first electrode are formed. At the time of forming the wiring 1334 to be provided on the periphery of the first electrode, the dry etching or wet etching conditions are suitably adjusted and the cross sectional shape of the wiring 1334 is provided as a reversed taper shape as shown in FIG. 14. The angle of a slant face of each edge of wiring 1334 and 1336b (inclined angle and taper angle) is over 120° and less than 160° with respect to the surface of the substrate. The slant face will reflect the light emitted from a layer 1338 containing an organic compound to be formed later.

In the structure of the present example, the slant face of each of the wiring 1334, 1336b formed on the periphery of the first electrode reflects or gathers light emitted in the lateral direction to increase the intensity of emitted light to be taken out in the one direction (the direction of passing through the first electrode).

An insulating material 1337 (referred to as bank or shield) that covers the reverse taper-shaped wiring 1334 and the end portion of the first electrode 1336a is prepared using an organic material or an inorganic material by a coating method, a layer 1338 containing an organic compound is formed on the first electrode 1336a, and a second electrode 1339 is formed, completing the preparation of a light emitting element.

Consequently, it is preferable to make each of electrodes 1336b, 1336c or wiring 1334 having the slant face using a material mainly comprised of a metal that reflects light, such as aluminum or silver. Also, the electrode 1336c is provided as an upper layer of the contacting electrode, while the electrode 1336b provided as a lower layer of the contacting electrode. Thus, the electrode 1336c may be preferably made of a material that protects the electrode 1336b from oxidation, corrosion, or the generation of hillock or the like, typically for example metal nitride (e.g., TiN or WN), with a film thickness of 20 to 100 nm. Furthermore, the electrode or wiring having a slant face may be provided with a three-layered structure, and a material capable of being in contact with the drain region 1332 and forming an ohmic contact with silicon (typically, titanium) with a film thickness of 10 to 100 nm.

In FIG. 14, the reference numerals 1330 denotes a substrate having an insulating surface, 1331 denotes an insulating base film, 1332 denotes a source region or a drain region, 1333 denotes a gate insulation film, 1335 denotes an interlayer insulation film formed of an organic material or an inorganic material (containing a coated silicon oxide film, phosphorus supplied glass (PSG), boron-and-phosphorus supplied glass (BPSG), and so on), 1338 denotes a layer containing an organic compound, and 1339 denotes a second electrode comprising a thin layer containing a metal having a small work function (an alloy such as MgAg, MgIn, AlLi, $CaF_2$, or CaN, or a film formed by co-deposition between an element of Group 1 or 2 in the periodic table and aluminium) and a conductive film (an aluminum film in this example) formed thereon.

Furthermore, the first electrode 1336a may be a transparent conductive film (such as an indium tin oxide alloy (ITO), an indium zinc oxide alloy ($In_2O_3$—ZnO), or zinc oxide (ZnO)). Alternatively, the first electrode 1336a may be a thin film of a metallic material (TiN, Pt, Cr, W, Ni, Zn, or Sn) with a large work function, for example a metal thin film having a translucency with a film thickness of 10 to 100 nm.

In addition, the present example may be optionally combined with Embodiment or one of Examples 1 to 5 of the present invention without limitation.

EXAMPLE 7

In this example, referring to FIGS. 15A and 15B, we will describe an example in which an additional interlayer insulation film is provided to make the first electrode and the connecting electrode different from each other. For simplifying the description, only a point different from the procedures of obtaining the cross sectional structure shown in FIG. 1B will be described. In FIG. 15A and FIG. 15B, the same structural components as those of FIGS. 1A and 1B are represented by the same numerals as those of FIGS. 1A and 1B.

At first, according to Example 1, a contract hole is formed in each of interlayer insulation film 20, 21, and 22. Then, electrodes 23, 1424, and 25 to 27 (i.e., a source wiring, a power supply line, a lead electrode, a capacity wiring, and a connecting electrode) and so on are formed using Al, Ti, Mo, W, or the like.

Subsequently, an inner layer insulation film 1431 is formed. As such an interlayer insulation film 1431, a photosensitive or non-photosensitive organic material (such as polyimide, acrylate, polyamide, polyimide amide, resist, or benzocyclobutene) or an inorganic material (such as silicon oxide, silicon nitride, or silicon oxynitride) by prepared by a sputtering method, a CVD method, or a coating method, a laminate thereof, or the like may be used.

In this embodiment, a positive type photosensitive acryl resin film is formed by a coating method at first. Then, the interlayer insulation film 1431 having a curved surface is formed on the upper end portion of the above acryl resin film. Furthermore, although not shown in the figure, an inorganic insulation film (e.g., a silicon nitride film) having a film thickness of 20 nm to 50 nm may be formed using a sputtering method with RF power supply covering the interlayer insulation film 1431.

Subsequently, a first electrode 1428a is formed. In this example, for functioning the first electrode 1428a as an anode of an EL element, the first electrode 1428a is a transparent conductive film having a large work function (such as an indium tin oxide alloy (ITO), an indium zinc oxide alloy ($In_2O_3$—ZnO), or zinc oxide (ZnO)). Alternatively, the first electrode 1428a may be a metallic material having a large work function.

In the case of designing the light emitting device as an upper-side radiation type in which light emitted from the EL layer 31 passes through the second electrode 1432, the second electrode 1432 may be prepared by appropriately selecting and adjusting a material and a film thickness thereof so as to provide the second electrode 1432 with transparency. Alternatively, in the case of designing the light emitting device as a lower-side radiation type in which light emitted from the EL layer 31 passes through the first electrode 1428a, the first electrode 1428a may be prepared by appropriately selecting and adjusting a material and a film thickness thereof so as to provide the first electrode 1428a with transparency. Furthermore, in the case of a lower-side radiation type, it is preferable to use a transparent material for interlayer insulation films 1431 and 21.

Furthermore, for flattening the surface of the first electrode 1428a, the flattening treatment such as CMP may be performed before or after the formation of the first electrode 1428a, or after the formation of the insulating material 1430 subsequent to the formation of the first electrode 1428a. When the CMP processing is performed, it is preferable to form an inorganic insulation film (not shown) on the interlayer insulation film 1431 for improving adhesiveness.

Subsequently, insulating materials 1430 referred to as banks are formed on the both ends so as to cover end portions of the first electrode 1428a. The bank 1430 may be formed of an organic resin film or a silicon-containing insulation film. Here, as an insulating material 1430, a positive type photosensitive acryl resin film is used to form the back in a shape shown in FIG. 15A.

Furthermore, an EL layer 31 and a second electrode (a cathode of the EL element) 1432 are formed on the first electrode 1428a having both ends coated with the banks 1430. A thin film containing a metal having a small work function (an alloy such as MgAg, MgIn, AlLi, $CaF_2$, or CaN, or a film formed by co-deposition between an element of Group 1 or 2 in the periodic table and aluminium), and a conductive film (an aluminum film in this example) is deposited on the thin film to form a laminate film. The laminate film has a sufficient film thickness enough to allow the emitted light to pass through the laminate film. In this embodiment, the laminate film is functioned as a cathode. In addition, instead of the thin conductive film, a transparent conductive film (such as an indium tin oxide alloy (ITO), an indium zinc oxide alloy ($In_2O_3$—ZnO), or zinc oxide (ZnO)) may be used.

The light emitting element thus obtained can be provided as an upper-side radiation type or a lower-side radiation type by appropriately selecting materials of the first electrode 1428a and the second electrode 1432. In the subsequent steps, an EL layer 31, other structural components are formed according to Example 1, resulting in a light emitting device having the cross sectional structure shown in FIG. 15A.

Here, in the terminal portion, an electrode 1428b simultaneously formed together with a first electrode 1428a is formed on electrodes 19a, 19b simultaneously formed together with the gate electrode. In addition, FPC 6 is stuck thereon.

Furthermore, as shown in FIG. 15B, an interlayer insulation film 622 made of an organic resin may be formed after forming an interlayer insulation film 621 made of an inorganic insulation film on an interlayer insulation film 20. Here, the interlayer insulation film 20 is prepared as an silicon oxynitride film having a film thickness of 50 nm by a plasma CVD method, followed by laminating an interlayer insulation film 621 made of a silicon nitride film of 20 to 50 nm in thickness by a sputtering method using a RF power supply. After that, the step of hydrogenating a semiconductor layer is performed by a heat treatment at a temperature of 300 to 550° C. for 1 to 12 hours. Subsequently, a contact hole extending to each of impurity regions is formed by removing the gate insulting film 15, the interlayer insulation films 20, 621, followed by forming an interlayer insulation film 622 made of a photosensitive organic insulating material. A positive type photosensitive acryl resin film may be formed by a coating method and may be provided as an interlayer insulation film 622 having a curved surface on its upper end portion.

Furthermore, the sequence of forming these interlayer insulation films 20, 621, 622 and the contact hole, and the hydrogenation are not particularly limited. Alternatively, for example, the hydrogenation may be performed after forming the interlayer insulation film 20, followed by forming the interlayer insulation film 621. Here, in FIG. 15B, the same structural components as those of FIG. 1B and FIG. 15A are represented by the same reference numerals.

In this example, furthermore, the photosensitive organic resin is used for each of the interlayer insulation films 21, 1431, and the insulating material 1430. In addition, each of them has the curved surface on its upper end portion. According to the present invention, however, it is not particularly limited to such a structure. One of these layers may be formed using an inorganic insulating film. Alternatively, one of these layers may be formed of a non-photosensitive organic resin such that the upper end thereof may be tapered. In case of washing before forming an EL layer 31, the tapered end of the insulating material 1430 may prevent the foreign substance (dust or the like) from being remained at the end portion.

Furthermore, the present example may be optionally combined with Embodiment or one of Examples 1 to 6 of the present invention without limitation.

EXAMPLE 8

In this example, there is shown another example in FIG. 16, a part of which is different from Example 4. In FIG. 16, the same structural components as those of FIG. 1B are represented by the same reference numerals for the sake of simplification.

In this example, there is described an example in which a contact hole is formed in each of an interlayer insulation film 20 and a gate insulation film 15, followed by forming wiring 1525, 1526, 1527 for connecting one of a source region or a drain region 12b, or a source electrode or a drain electrode of TFT in a driving circuit. After forming these electrodes, an interlayer insulation film 1521 is formed and a contact hole extending to the source region or the drain region 12b is formed. Then, according to Example 1, a first electrode 1524a and 1524b in contact with the source region or the drain region 12b is formed. Subsequently, an insulating material 1530 (referred to as a bank or a partition) that covers the end portion of the first electrode 1524a and 1524b is formed, followed by etching a part of the insulating material 1530 using the insulating material 1530 as a mask in a self-aligning manner while thinly etching the center of the first electrode 1524b to form steps on the end portion thereof.

In this example, the first electrode 1524b and the wiring 1525 to 1527 are formed on the different layers, so that it is possible to extend the flat area of the first electrode 1524b and to increase the degree of integration.

Figure 18A:
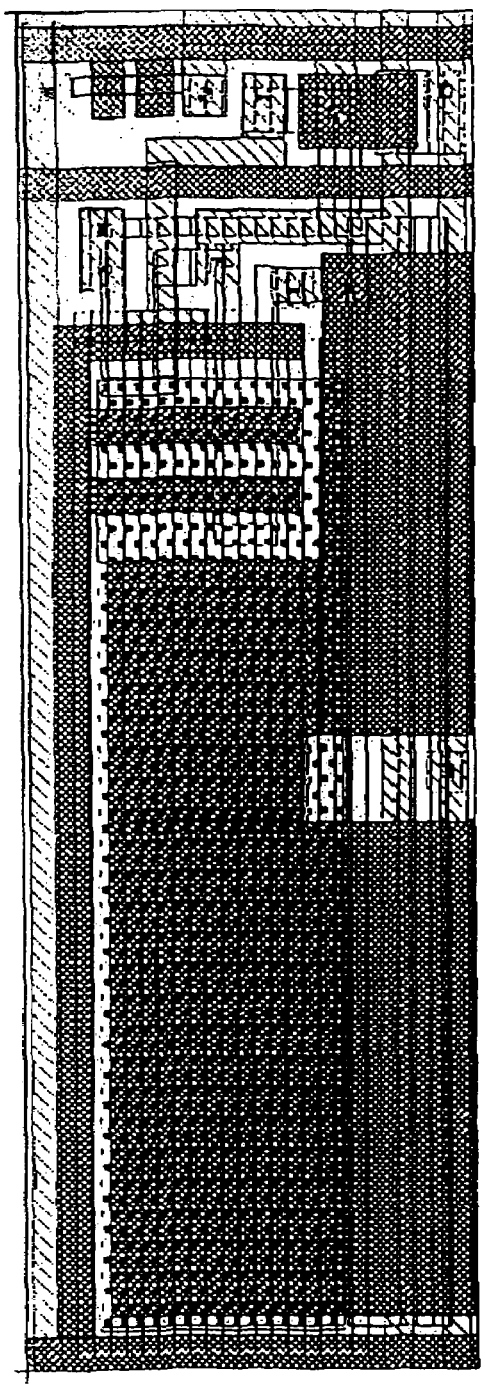
FIG. 18A is a top view of a pixel and FIG. 18B shows an equivalent circuit (Example 8)
Figure 18B:
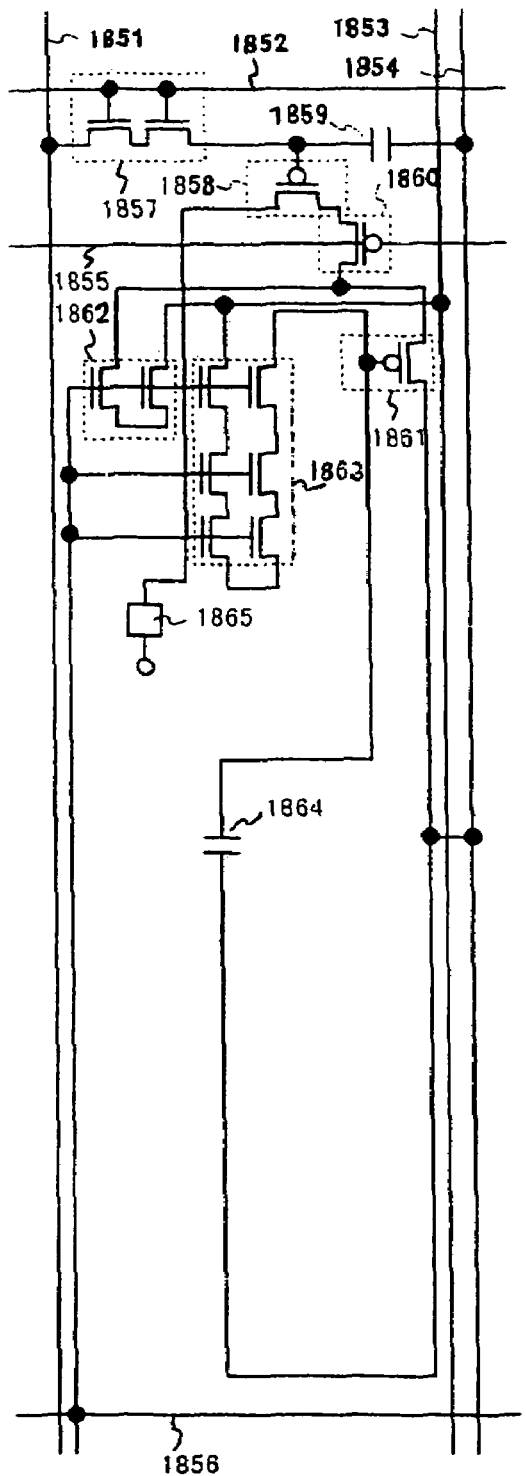

In this example, it is preferable to design the light emitting element as an upper-side radiation type. FIG. 18A is a top view of an example of the pixel, and FIG. 18B is an equivalent circuit of FIG. 18A. The detailed description of the configuration of the pixel shown in FIGS. 18A and 18B can be found in U.S. patent application Ser. No. 10/245,711. Each pixel comprises a power source circuit, a switching part, and a light emitting element. The light emitting element, the current source circuit, and the switching part are connected in series between a power supply base line and a power supply line. Using a digital picture signal, the switching part can be switched on and off. In addition, the intensity of a constant current passing through the current source circuit is defined on the basis of a control signal entered from the outside of the pixel. When the switching part is in an ON state, the constant current defined by the current source circuit is fed into the light emitting element to allow light emission therefrom. When the switching part is in an OFF state, the flow of current into the light emitting element is not occurred and thus light emission from the light emitting element cannot be occurred. Consequently, a gradation can be represented by controlling the ON and OFF states of the switching part using picture signals. Consequently, a display apparatus having the following advantages can be attained by the configuration of the pixel as shown in FIGS. 18A and 18B. That is, a display apparatus allows light emitting element to emit light at a constant brightness without depending on a change in the current characteristics due to deterioration or the like. In addition, the signal can be written to each pixel at a high writing speed to allow the representation of a correct gradation. Further, the display apparatus can be manufactured at low costs and can be downsized.

In FIG. 18, the reference numeral 1851 denotes a signal line, 1852 denotes a selective gate line, 1853 denotes a current line, 1854 denotes a power supply line, 1855 denotes an erasure gate line, 1856 denotes a current gate line, 1857 denotes a selective transistor, 1858 denotes a driving transistor, 1859 denotes a video capacity, 1860 denotes an erasure transistor, 1861 denotes a current source transistor, 1862 denotes an input transistor, 1863 denotes a retention transistor, 1864 denotes a current source capacity, and 1865 denotes a light emitting element.

In FIGS. 18A and 18B, but not limited to, the driving transistor 1858 is a p-channel transistor, the selective transistor 1857 and the erasure transistor 1855 are n-channel transistors. Alternatively, each of the selective transistor 1857, the driving transistor 1858, and the erasure transistor 1855 may be an n-channel transistor or a p-channel transistor.

A gate electrode of the selective transistor 1857 is connected to the selective gate line 1852. The one of a source terminal and a drain terminal of the selective transistor 1857 is connected to a signal line 1851 and the other thereof is connected to a gate electrode of the driving transistor 1858. The one of a source terminal and a drain terminal of the driving transistor 1858 is connected to the terminal of the light emitting element 1865 and the other terminal is connected to the erasure transistor 1860. Furthermore, the one of electrodes of the video capacity 1859 is connected to the gate electrode of the driving transistor 1858 and the other thereof of is connected to the power supply line 1854. The one of a source terminal and a drain terminal of the erasure transistor 1860 is connected to the gate electrode of the current source transistor 1861 and the input transistor 1862, and the other thereof is connected to the driving transistor 1858. A gate electrode of the erasure transistor 1860 is connected to the erasure gate line 1855.

By the way, the source terminal and the drain terminal of the erasure transistor 1860 are not limited to the above connecting structures. Alternatively, various kinds of connecting structures may be allowable, for example a connecting structure for releasing electric charges retained in the holding capacity by switching on the erasure transistor.

Furthermore, the present invention is not limited to the TFT structure shown in FIG. 16. As shown in FIG. 17A, alternatively, it may be designed such that a switching TFT 70 of the pixel part has no impurity region piled on the gate electrode.

Furthermore, in the procedures of preparing the TFT shown in FIG. 17A may be performed by making a reference to the process shown in FIG. 5A, so that the detailed description thereof is omitted here. In addition, in FIG. 17A, the same structural components as those of FIG. 2, FIG. 5A, and FIG. 16 are represented by the same reference numerals.

Furthermore, the gate electrode may be provided as a single layer, or may have a TFT structure such as one shown in FIG. 17B. In the case of obtaining the structure shown in FIG. 17B, each of low-level impurity regions 12c, 13c, 14c is appropriately formed by doping with impurity element which provides n-type or p-type conductivity using a mask made of resist before the formation of the gate electrode, gate electrodes 516 to 518, and an electrode 519 are formed, followed by forming high-level impurity regions 13b, 14b, 12b by self-aligning or doping using a mask made of resist. In FIG. 17B, the same structural components as those of FIG. 1B, FIG. 5B, and FIG. 16 are represented by the same reference numerals.

In addition, the present example may be optionally combined with Embodiment or one of Examples 1 to 5 of the present invention without limitation.

EXAMPLE 9

A method of combining a white color light emitting element and a color filter (hereinafter, referred to as color filter method) will be explained in reference to FIG. 20A as follows.

The color filter method is a system of forming a light emitting element having an organic compound film displaying white color luminescence and passing the provided white color luminescence through a color filter to thereby achieve luminescence of red, green, blue.

For obtaining white luminescence, there are various kinds of methods known in the art. Here, we will describe a case of using a light emitting layer made of a high polymeric material, which can be formed by coating. In this case, the doping of pigments into the high polymeric material to be formed into the light emitting layer may be performed by the conditioning of the solution. In other words, it can be attained extremely easily, compared with an evaporation method that performs a co-deposition for doping a plurality of pigments.

Specifically, after coating an aqueous solution of poly (ethylenedioxythiophene)/poly (stylenesulfonic acid) (PEDOT/PSS) operated as a hole injecting layer over an entire face of an anode comprising a metal having large work function (Pt, Cr, W, Ni, Zn, Sn, In), thereafter coating and sintering a polyvinyl carbazole (PVK) solution doped with a light emitting core pigment (1,1,4,4-tetraphenyl 1,3-butadience (TPB), 4-dicyanomethylene-2-methyl-6-(p-dimethylaminostyryl)-4H-pyran(DCM1), Nile red, coumarin 6 or the like) operating as the light emitting layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound layers is shown in the above-described example, a single layer of an organic compound layer can be constituted. For example, 1,3,4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the organic compound film is formed between the anode and the cathode and by recombining holes injected from the anode and electrons injected from the cathode at the organic compound film, white color luminescence is achieved in the organic compound film.

Further, it is also possible to achieve white color luminescence as a whole by pertinently selecting an organic compound film for carrying out red color luminescence, an organic compound film for carrying out green color luminescence and an organic compound film for carrying out blue color luminescence and laminating the films to mix color.

The organic compound film formed as described above can achieve white color luminescence as a whole.

A color filter may be arranged along the direction of emitting white luminescence from the above organic compound film. The color filter has a pigmented layer (R) that absorbs luminescence except red luminescence, a pigmented layer (G) that absorbs luminescence except green luminescence, and a pigmented layer (B) that absorbs luminescence except blue luminescence. Therefore, white luminescence from the light emitting element can be separated into different colors, so that red, green, and blue luminescence can be obtained. In the case of an active matrix type light emitting device, a thin-film transistor (TFT) is formed between the substrate and the color filter.

Furthermore, the pigmented layers (R, G, B) may have a stripe pattern, which is a most simple pattern, or may be selected from a diagonal mosaic arrangement, a trigonal pattern, a RGBG four-pixel arrangement, a RGBW four-pixel arrangement, and so on.

The pigmented layers that form the color filter are prepared using color resists formed of organic photosensitive material in which pigments are dispersed, respectively. By the way, the chromaticity coordinate of the white luminescence is $(x, y) = (0.34, 0.35)$. It is known that color reproducibility performance as full color is sufficiently ensured when the white color luminescence is combined with the color filter.

In this case, furthermore, even though the resulting luminescence color is different, there is no need to form the organic compound films by independently coating them every luminescence color because all of them are prepared from the organic compound film that represents white luminescence. In addition, a circular polarizing plate for preventing specular reflexion is not particularly required.

Next, we will describe a color changing medium (CCM) method which can be realized by combining a blue light emitting element having a blue-luminescent organic compound film and a fluorescent color-changing layer with reference to FIG. 20B.

The CCM method performs a color change with each color-changing layer by exciting the fluorescent color-changing layer with blue luminescence radiated from the blue light emitting element. Concretely, the color-changing layer performs the change from blue to red (B→R), the color-changing layer performs the change from blue to green (B→G), and the color-changing layer performs the change from blue to blue (B→B) (the change from blue to blue may be omitted) to obtain red, green, and blue light emission, respectively. In the case of the CCM method, the structure having TFT between the substrate and the color-changing layer is provided m an active matrix type light emitting layer.

In this case, also, there is no need to form the organic compound films by coating independently. In addition, a circular polarizing plate for preventing specular reflexion is not particularly required.

Furthermore, in the case of using the CCM method, the color-changing layer is fluorescent, so that it can be excited by outside light, causing a decrease in contrast. Therefore, it is preferable to increase the contrast by attaching a color filter or the like as shown in FIG. 20C.

In addition, the present example may be optionally combined with Embodiment or one of Examples 1 to 8 of the present invention without limitation.

EXAMPLE 10

By implementing the present invention, all of electronic apparatuses into which modules having an EL element (such as an active matrix EL module) are built can be completed.

Following can be given as such electronic apparatuses: video cameras; digital cameras; head mounted displays (goggle type displays); car navigation systems; projectors; car stereos; personal computers; electronic game machines; portable information terminals (mobile computers, mobile phones or electronic books etc.) etc. Practical examples thereof are shown in FIGS. 21A to 22C.

FIG. 21A is a personal computer which comprises: a main body 2001; an image input section 2002; a display section 2003; and a keyboard 2004 etc.

FIG. 21B is a video camera which comprises: a main body 2101; a display section 2102; a voice input section 2103; operation switches 2104; a battery 2105 and an image receiving section 2106 etc.

FIG. 21C is a mobile computer which comprises: a main body 2201; a camera section 2202; an image receiving section 2203; operation switches 2204 and a display section 2205 etc.

FIG. 21D is a goggle type display which comprises: a main body 2301; a display section 2302; and an arm section 2303 etc.

FIG. 21E is a player using a recording medium in which a program is recorded (hereinafter referred to as a recording medium), which comprises: a main body 2401; a display section 2402; a speaker section 2403; a recording medium 2404; and operation switches 2405 etc. This apparatus uses DVD (digital versatile disc), CD, etc. for the recording medium, and can enjoy music, film, games and use for Internet.

FIG. 21F is a digital camera which comprises: a main body 2501; a display section 2502; a view finder 2503; operation switches 2504; and an image receiving section (not shown in the figure) etc.

Figure 22A:
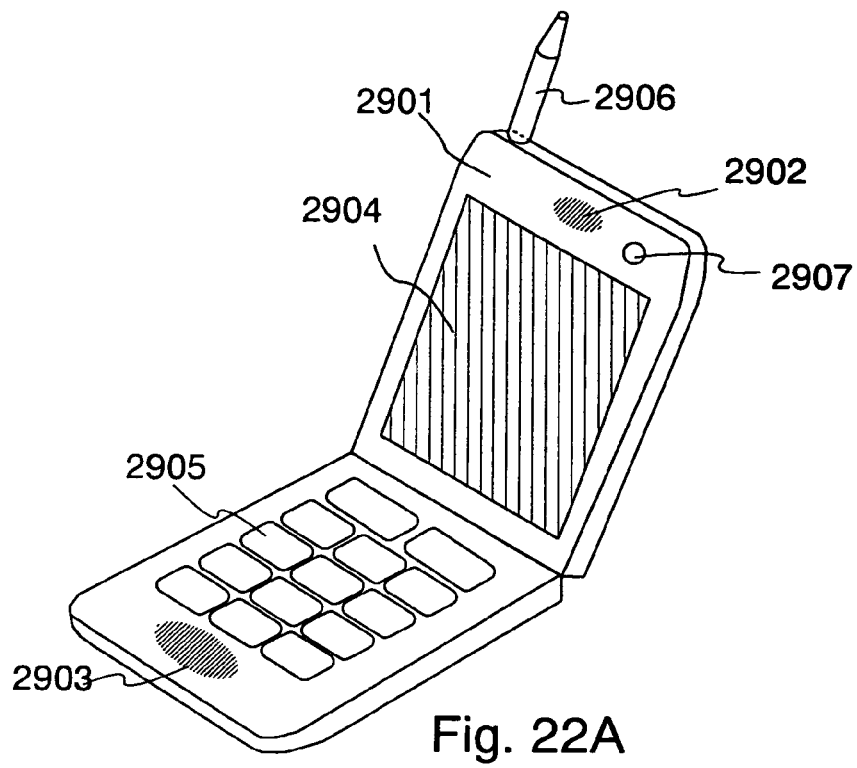
FIGS. 22A and 22C are diagrams showing examples of electronic equipments (Example 10).

FIG. 22A is a mobile phone which comprises: a main body 2901; a voice output section 2902; a voice input section 2903; a display section 2904; operation switches 2905; an antenna 2906; and an image input section (CCD, image sensor, etc.) 2907 etc.

Figure 22B:
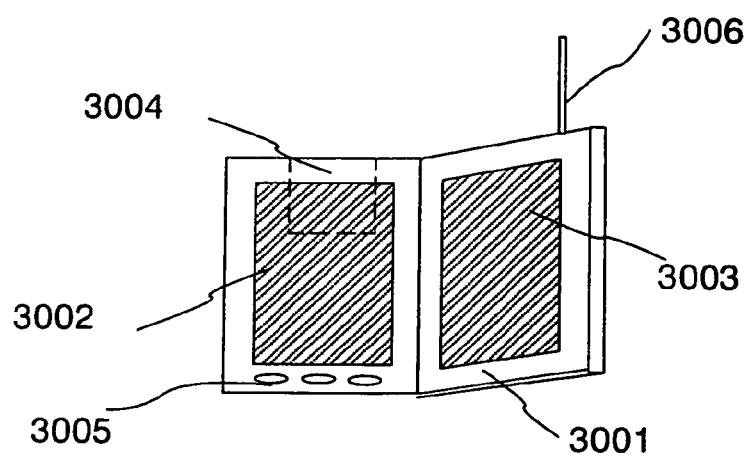

FIG. 22B is a portable book (electronic book) which comprises: a main body 3001; display sections 3002 and 3003; a recording medium 3004; operation switches 3005 and an antenna 3006 etc.

Figure 22C:
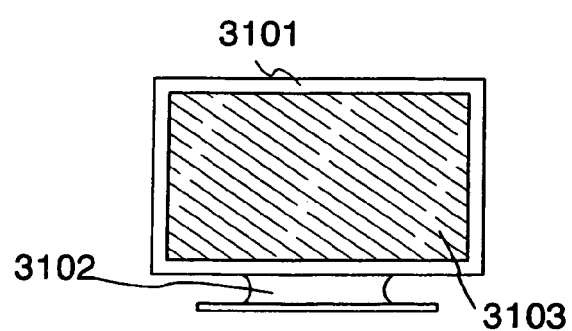

FIG. 22C is a display which comprises: a main body 3101; a supporting section 3102; and a display section 3103 etc.

In addition, the display shown in FIG. 22C has a screen in small and medium or large size, for example a size of 5 to 20 inches. Further, to manufacture the display part with such sizes, it is preferable to mass-produce by gang printing by using a substrate with one meter on a side.

As described above, the applicable range of the present invention is so wide that the invention can be applied to electronic apparatuses of various fields. Note that the electronic apparatuses of this example can be achieved by utilizing any combination of constitutions in Embodiment, and Examples 1 to 9.

According to the present invention, an active matrix type light emitting device having high reliability can be realized.

What is claimed is:

1. A method for manufacturing a light emitting device, comprising the steps of:
   forming an inorganic insulation film that covers a source region of a thin film transistor and a drain region of the thin film transistor;
   forming a first contact hole extending to one of the source region and the drain region by etching the inorganic insulation film;
   forming an organic insulation film on the inorganic insulation film;
   forming a second contact hole extending to the one of the source region and the drain region by etching the organic insulation film;
   forming a connecting electrode for making a connection with the one of the source region and the drain region;
   forming an interlayer insulation film that covers the connecting electrode;
   forming a third contact hole extending to the connecting electrode by etching the interlayer insulation film;
   forming a first electrode in contact with the connecting electrode;
   forming a bank that covers a part of the first electrode;
   forming a layer containing an organic compound on the first electrode and the bank; and
   forming a second electrode on the layer containing the organic compound.

2. A method for manufacturing a light emitting device according to claim 1, wherein the first electrode functions as one of an anode and a cathode of a light emitting element.

3. A method for manufacturing a light emitting device according to claim 1, wherein the organic insulation film has a curved surface with a curvature radius on an upper end portion, and the curvature radius is 0.2 μm to 3 μm.

4. A method for manufacturing the light emitting device according to claim 1, wherein the light emitting device is one selected from the group consisting of a video camera, a digital camera, a goggles-type display, a car navigation system, a personal computer, a DVD player, electronic playing equipment, and a personal digital assistant.

5. A method for manufacturing a light emitting device according to claim 1, wherein each of the organic insulation film, the interlayer insulation film, and the bank has a curved surface with a curvature radius on an upper end portion, and the curvature radius is 0.2 μm to 3 μm.

6. A method for manufacturing a light emitting device according to claim 1, wherein each of the organic insulation film, the interlayer insulation film, and the bank is made of a photosensitive organic material.

7. A method for manufacturing a light emitting device according to claim 1, wherein etching the inorganic insulation film is performed with dry etching.

8. A method for manufacturing a light emitting device according to claim 1, wherein etching the organic insulation film is performed with wet etching.

9. A method for manufacturing a light emitting device, comprising the steps of:
   forming an inorganic insulation film that covers a source region of a thin film transistor and a drain region of the thin film transistor;
   forming at least two first contact holes extending to the source region and the drain region respectively by etching the inorganic insulation film;
   forming a wiring for making a connection with one of the source region and the drain region;
   forming an organic insulation film on the inorganic insulation film and the wiring;
   forming at least two second contact holes by etching the organic insulation film, one of the two second contact holes is extending to the wiring and the other one of the two second contact holes is extending to the other one of the source region and the drain region;

forming at least two connecting electrodes, one of the two connecting electrodes is connected to the wiring and the other one of the two connecting electrodes is connected to the other one of the source region and the drain region;

forming an interlayer insulation film that covers at least one of the two connecting electrodes;

forming a third contact hole extending to at least one of the two connecting electrodes by etching the interlayer insulation film;

forming a first electrode in contact with at least one of the two connecting electrodes;

forming a bank that covers a part of the first electrode;

forming a layer containing an organic compound on the first electrode and the bank; and forming a second electrode on the layer containing the organic compound.

10. A method for manufacturing a light emitting device according to claim 9, wherein the first electrode functions as one of an anode and a cathode of a light emitting element.

11. A method for manufacturing a light emitting device according to claim 9, wherein the organic insulation film has a curved surface with a curvature radius on an upper end portion, and the curvature radius is 0.2 µm to 3 µm.

12. A method for manufacturing the light emitting device according to claim 9, wherein the light emitting device is one selected from the group consisting of a video camera, a digital camera, a goggles-type display, a car navigation system, a personal computer, a DVD player, electronic playing equipment, and a personal digital assistant.

13. A method for manufacturing a light emitting device according to claim 9, wherein each of the organic insulation film, the interlayer insulation film, and the bank has a curved surface with a curvature radius on an upper end portion, and the curvature radius is 0.2 µm to 3 µm.

14. A method for manufacturing a light emitting device according to claim 9, wherein each of the organic insulation film, the interlayer insulation film, and the bank is made of a photosensitive organic material.

15. A method for manufacturing a light emitting device according to claim 9, wherein etching the inorganic insulation film is performed with dry etching.

16. A method for manufacturing a light emitting device according to claim 9, wherein etching the organic insulation film is performed with wet etching.

17. A method for manufacturing a light emitting device, comprising the steps of:

forming an inorganic insulation film that covers a source region of a thin film transistor and a drain region of the thin film transistor;

forming a first contact hole extending to one of the source region and the drain region by etching the inorganic insulation film;

forming an organic insulation film on the inorganic insulation film;

forming a second contact hole extending to the one of the source region and the drain region by etching the organic insulation film;

forming a connecting electrode for making a connection with the one of the source region and the drain region;

forming an interlayer insulation film that covers the connecting electrode;

forming a third contact hole extending to the connecting electrode by etching the interlayer insulation film;

forming a first electrode comprised of a laminate of metallic layers connecting to the connecting electrode;

forming an insulating material that covers an end portion of the first electrode;

thinning a center of the first electrode by etching using the insulating material as a mask such that a slant surface is exposed along an edge of the first electrode;

forming a layer containing an organic compound on the first electrode and the insulating material; and forming a second electrode on the layer containing the organic compound.

18. A method for manufacturing a light emitting device according to claim 17, wherein the first electrode functions as one of an anode and a cathode of a light emitting element.

19. A method for manufacturing a light emitting device according to claim 17, wherein the organic insulation film has a curved surface with a curvature radius on an upper end portion, and the curvature radius is 0.2 µm to 3 µm.

20. A method for manufacturing a light emitting device according to claim 17, wherein the insulating material has a curved surface with a curvature radius on an upper end portion, and the curvature radius is 0.2 µm to 3 µm.

21. A method for manufacturing the light emitting device according to claim 17, wherein the light emitting device is one selected from the group consisting of a video camera, a digital camera, a goggles-type display, a car navigation system, a personal computer, a DVD player, electronic playing equipment, and a personal digital assistant.

22. A method for manufacturing a light emitting device according to claim 17, wherein each of the organic insulation film, the interlayer insulation film, and the insulating material has a curved surface with a curvature radius on an upper end portion, and the curvature radius is 0.2 µm to 3 µm.

23. A method for manufacturing a light emitting device according to claim 17, wherein each of the organic insulation film, the interlayer insulation film, and the insulating material is made of a photosensitive organic material.

24. A method for manufacturing a light emitting device according to claim 17, wherein etching the inorganic insulation film is performed with dry etching.

25. A method for manufacturing a light emitting device according to claim 17, wherein etching the organic insulation film is performed with wet etching.

26. A method for manufacturing a light emitting device, comprising the steps of:

forming an inorganic insulation film that covers a source region of a thin film transistor and a drain region of the thin film transistor;

forming a silicon nitride film on the inorganic insulation film by a sputtering method;

forming a first contact hole extending to one of the source region and the drain region by etching the inorganic insulation film and the silicon nitride film;

forming an organic insulation film on the silicon nitride film;

forming a second contact hole extending to the one of the source region and the drain region by etching the organic insulation film;

forming a connecting electrode for making a connection with the one of the source region and the drain region;

forming an interlayer insulation film that covers the connecting electrode;

forming a third contact hole extending to the connecting electrode by etching the interlayer insulation film;

forming a first electrode in contact with the connecting electrode;

forming a bank that covers a part of the first electrode;

forming a layer containing an organic compound on the first electrode and the bank; and forming a second electrode on the layer containing the organic compound.

27. A method for manufacturing a light emitting device according to claim 26, wherein the first electrode functions as one of an anode and a cathode of a light emitting element.

28. A method for manufacturing a light emitting device according to claim 26, wherein the organic insulation film has a curved surface with a curvature radius on an upper end portion, and the curvature radius is 0.2 μm to 3 μm.

29. A method for manufacturing the light emitting device according to claim 26, wherein the light emitting device is one selected from the group consisting of a video camera, a digital camera, a goggles-type display, a car navigation system, a personal computer, a DVD player, electronic playing equipment, and a personal digital assistant.

30. A method for manufacturing a light emitting device according to claim 26, wherein each of the organic insulation film, the interlayer insulation film, and the bank has a curved surface with a curvature radius on an upper end portion, and the curvature radius is 0.2 μm to 3 μm.

31. A method for manufacturing a light emitting device according to claim 26, wherein each of the organic insulation film, the interlayer insulation film, and the bank is made of a photosensitive organic material.

32. A method for manufacturing a light emitting device according to claim 26, wherein etching the inorganic insulation film and the silicon nitride film is performed with dry etching.

33. A method for manufacturing a light emitting device according to claim 26, wherein etching the organic insulation film is performed with wet etching.

34. A method for manufacturing a light emitting device, comprising the steps of:
   forming an inorganic insulation film that covers a source region of a thin film transistor and a drain region of the thin film transistor;
   forming a first contact hole extending to one of the source region and the drain region by etching the inorganic insulation film;
   forming an organic insulation film on the inorganic insulation film;
   forming a silicon nitride film on the organic insulation film by a sputtering method;
   forming a second contact hole extending to the one of the source region and the drain region by etching the organic insulation film and the silicon nitride film;
   forming a connecting electrode for making a connection with the one of the source region and the drain region;
   forming an interlayer insulation film that covers the connecting electrode;
   forming a third contact hole extending to the connecting electrode by etching the interlayer insulation film;
   forming a first electrode in contact with the connecting electrode;
   forming a bank that covers a part of the first electrode;
   forming a layer containing an organic compound on the first electrode and the bank; and
   forming a second electrode on the layer containing the organic compound.

35. A method for manufacturing a light emitting device according to claim 34, wherein the first electrode functions as one of an anode and a cathode of a light emitting element.

36. A method for manufacturing a light emitting device according to claim 34, wherein the organic insulation film has a curved surface with a curvature radius on an upper end portion, and the curvature radius is 0.2 μm to 3 μm.

37. A method for manufacturing the light emitting device according to claim 34, wherein the light emitting device is one selected from the group consisting of a video camera, a digital camera, a goggles-type display, a car navigation system, a personal computer, a DVD player, electronic playing equipment, and a personal digital assistant.

38. A method for manufacturing a light emitting device according to claim 34, wherein each of the organic insulation film, the interlayer insulation film, and the bank has a curved surface with a curvature radius on an upper end portion, and the curvature radius is 0.2 μm to 3 μm.

39. A method for manufacturing a light emitting device according to claim 34, wherein each of the organic insulation film, the interlayer insulation film, and the bank is made of a photosensitive organic material.

40. A method for manufacturing a light emitting device according to claim 34, wherein etching the inorganic insulation film is performed with dry etching.

41. A method for manufacturing a light emitting device according to claim 34, wherein etching the organic insulation film is performed with wet etching.

42. A method for manufacturing a light emitting device according to claim 34, wherein etching the silicon nitride film is performed with dry etching.

43. A method for manufacturing a light emitting device, comprising the steps of:
   forming an inorganic insulation film that covers a source region of a thin film transistor and a drain region of the thin film transistor;
   forming a first contact hole extending to one of the source region and the drain region by etching the inorganic insulation film;
   forming an organic insulation film on the inorganic insulation film;
   forming a second contact hole extending to the one of the source region and the drain region by etching the organic insulation film without etching the inorganic insulation film;
   forming a connecting electrode for making a connection with the one of the source region and the drain region;
   forming an interlayer insulation film that covers the connecting electrode;
   forming a third contact hole extending to the connecting electrode by etching the interlayer insulation film;
   forming a first electrode in contact with the connecting electrode;
   forming a bank that covers a part of the first electrode;
   forming a layer containing an organic compound on the first electrode and the bank; and
   forming a second electrode on the layer containing the organic compound.

44. A method for manufacturing a light emitting device according to claim 43, wherein the first electrode functions as one of an anode and a cathode of a light emitting element.

45. A method for manufacturing a light emitting device according to claim 43, wherein the organic insulation film has a curved surface with a curvature radius on an upper end portion, and the curvature radius is 0.2 μm to 3 μm.

46. A method for manufacturing the light emitting device according to claim 43, wherein the light emitting device is one selected from the group consisting of a video camera, a digital camera, a goggles-type display, a car navigation system, a personal computer, a DVD player, electronic playing equipment, and a personal digital assistant.

47. A method for manufacturing a light emitting device according to claim 43, wherein etching the inorganic insulation film is performed with dry etching.

48. A method for manufacturing a light emitting device according to claim 43, wherein etching the organic insulation film is performed with wet etching.

49. A method for manufacturing a light emitting device, comprising the steps of:
- forming an inorganic insulation film that covers a source region of a thin film transistor and a drain region of the thin film transistor;
- forming a first contact hole extending to one of the source region and the drain region by etching the inorganic insulation film;
- forming an organic insulation film on the inorganic insulation film after forming the first contact hole;
- forming a second contact hole extending to the one of the source region and the drain region by etching the organic insulation film;
- forming a connecting electrode for making a connection with the one of the source region and the drain region;
- forming an interlayer insulation film that covers the connecting electrode;
- forming a third contact hole extending to the connecting electrode by etching the interlayer insulation film;
- forming a first electrode in contact with the connecting electrode;
- forming a bank that covers a part of the first electrode;
- forming a layer containing an organic compound on the first electrode and the bank; and
- forming a second electrode on the layer containing the organic compound.

50. A method for manufacturing a light emitting device according to claim 49, wherein the first electrode functions as one of an anode and a cathode of a light emitting element.

51. A method for manufacturing a light emitting device according to claim 49, wherein the organic insulation film has a curved surface with a curvature radius on an upper end portion, and the curvature radius is 0.2 µm to 3 µm.

52. A method for manufacturing the light emitting device according to claim 49, wherein the light emitting device is one selected from the group consisting of a video camera, a digital camera, a goggles-type display, a car navigation system, a personal computer, a DVD player, electronic playing equipment, and a personal digital assistant.

53. A method for manufacturing a light emitting device according to claim 49, wherein etching the inorganic insulation film is performed with dry etching.

54. A method for manufacturing a light emitting device according to claim 49, wherein etching the organic insulation film is performed with wet etching.

* * * * *

UNITED STATES PATENT AND TRADEMARK OFFICE
CERTIFICATE OF CORRECTION

PATENT NO. : 7,723,179 B2
APPLICATION NO. : 11/282725
DATED : May 25, 2010
INVENTOR(S) : Shunpei Yamazaki et al.

It is certified that error appears in the above-identified patent and that said Letters Patent is hereby corrected as shown below:

column 1, line 21, "alight" should read "a light"

column 12, lines 31-32, "substrates" should read "substrate 4"

column 17, line 42, "0.500 W" should be "500 W"

column 24, line 42, "soon" should read "so on"

column 32, line 34, "FIG. 1A," should read "FIG. 10A"

column 32, line 51, "apart" should read "a part"

column 32, line 56, "soon" should read "so on"

column 35, line 13, "innerlayer" should read "interlayer"

Signed and Sealed this

Sixteenth Day of November, 2010

David J. Kappos
*Director of the United States Patent and Trademark Office*